(12) United States Patent
Hoshino

(10) Patent No.: US 11,936,994 B2
(45) Date of Patent: Mar. 19, 2024

(54) SOLID-STATE IMAGING DEVICE AND ELECTRONIC APPARATUS

(71) Applicant: Sony Semiconductor Solutions Corporation, Kanagawa (JP)

(72) Inventor: Kozo Hoshino, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 18/072,266

(22) Filed: Nov. 30, 2022

(65) Prior Publication Data

US 2023/0171513 A1 Jun. 1, 2023

Related U.S. Application Data

(63) Continuation of application No. 17/586,230, filed on Jan. 27, 2022, now Pat. No. 11,563,923, which is a
(Continued)

(30) Foreign Application Priority Data

Nov. 22, 2017 (JP) ................................. 2017-224138

(51) Int. Cl.
*H04N 25/13* (2023.01)
*H04N 25/589* (2023.01)
*H04N 25/704* (2023.01)

(52) U.S. Cl.
CPC ........... *H04N 25/13* (2023.01); *H04N 25/589* (2023.01); *H04N 25/704* (2023.01)

(58) Field of Classification Search
CPC .... H04N 25/13; H04N 25/589; H04N 25/704; H04N 9/04551; H04N 5/35581;
(Continued)

(56) References Cited

U.S. PATENT DOCUMENTS

2009/0091645 A1 4/2009 Trimeche et al.
2011/0180689 A1 7/2011 Roy et al.
(Continued)

FOREIGN PATENT DOCUMENTS

CN 101816171 A 8/2010
CN 103765876 A 4/2014
(Continued)

OTHER PUBLICATIONS

Japanese Office Action dated Jul. 25, 2022 for corresponding Japanese Application No. 2019-555261.
(Continued)

*Primary Examiner* — Nhan T Tran
(74) *Attorney, Agent, or Firm* — Michael Best & Friedrich LLP

(57) ABSTRACT

The present technology relates to a solid-state imaging device and an electronic apparatus that enable simultaneous acquisition of a signal for generating a high dynamic range image and a signal for detecting a phase difference.
The solid-state imaging device includes a plurality of pixel sets each including color filters of the same color, for a plurality of colors, each pixel set including a plurality of pixels. Each pixel includes a plurality of photodiodes PD. The present technology can be applied, for example, to a solid-state imaging device that generates a high dynamic range image and detects a phase difference, and the like.

18 Claims, 36 Drawing Sheets

Related U.S. Application Data continuation of application No. 17/470,481, filed on Sep. 9, 2021, now Pat. No. 11,483,526, which is a continuation of application No. 16/764,474, filed as application No. PCT/JP2018/041820 on Nov. 12, 2018, now Pat. No. 11,258,993.

(58) Field of Classification Search
CPC .. H04N 5/36961; H04N 5/343; H04N 5/3535; H04N 5/347; H04N 5/35536; H04N 5/35563; H04N 9/04557; H04N 9/0455; H04N 5/355; H04N 5/369; H01L 27/14607; H01L 27/14609; H01L 27/14621; H01L 27/14625; H01L 27/14643

See application file for complete search history.

(56) References Cited

U.S. PATENT DOCUMENTS

| | | | |
|---|---|---|---|
| 2011/0310282 A1 | 12/2011 | Toda et al. | |
| 2012/0224096 A1* | 9/2012 | Shimoda | G02B 7/36 |
| | | | 348/E5.045 |
| 2012/0268634 A1* | 10/2012 | Fukuda | H01L 27/14627 |
| | | | 348/E5.091 |
| 2013/0075588 A1* | 3/2013 | Kawaguchi | H04N 25/70 |
| | | | 250/208.1 |
| 2013/0214128 A1 | 8/2013 | Yamashita et al. | |
| 2014/0204249 A1* | 7/2014 | Okigawa | H01L 27/14627 |
| | | | 348/280 |
| 2014/0239433 A1 | 8/2014 | Wakano | |
| 2014/0253766 A1 | 9/2014 | Kiyota | |
| 2014/0253808 A1* | 9/2014 | Tachi | H04N 9/64 |
| | | | 348/624 |
| 2014/0293119 A1* | 10/2014 | Hamano | H04N 23/672 |
| | | | 348/350 |
| 2015/0256778 A1* | 9/2015 | Kusaka | H04N 23/67 |
| | | | 348/280 |
| 2015/0312461 A1 | 10/2015 | Kim | |
| 2015/0350583 A1* | 12/2015 | Mauritzson | H01L 27/14647 |
| | | | 257/432 |
| 2015/0357368 A1 | 12/2015 | Kimura | |
| 2016/0269661 A1* | 9/2016 | Hseih | H04N 25/59 |
| 2017/0099449 A1* | 4/2017 | Kang | H04N 25/75 |
| 2017/0104942 A1 | 4/2017 | Hirota et al. | |
| 2017/0171470 A1 | 6/2017 | Sakioka | |
| 2017/0207259 A1 | 7/2017 | Yun et al. | |
| 2017/0301718 A1 | 10/2017 | Chou et al. | |
| 2017/0339353 A1 | 11/2017 | Banachowicz et al. | |
| 2017/0353679 A1* | 12/2017 | Negishi | H04N 25/583 |
| 2018/0184036 A1 | 6/2018 | Sato et al. | |
| 2018/0278858 A1* | 9/2018 | Seki | H04N 25/40 |
| 2018/0343404 A1 | 11/2018 | Hwang | |

FOREIGN PATENT DOCUMENTS

| | | | |
|---|---|---|---|
| CN | 104718745 A | 6/2015 | |
| CN | 204720451 U | 10/2015 | |
| CN | 105140249 A | 12/2015 | |
| CN | 105210363 A | 12/2015 | |
| CN | 105872322 A | 8/2016 | |
| JP | 2007065330 A | 3/2007 | |
| JP | 2009206210 A | 9/2009 | |
| JP | 2010539745 A | 12/2010 | |
| JP | 2013045907 A | 3/2013 | |
| JP | 2013062789 A | 4/2013 | |
| JP | 2013161868 A | 8/2013 | |
| JP | 2015012127 A | 1/2015 | |
| JP | 2015133469 A | 7/2015 | |
| JP | 2015177429 A | 10/2015 | |
| JP | 2015-201834 A | 11/2015 | |
| JP | 2016-015430 A | 1/2016 | |
| JP | 2016052041 A | 4/2016 | |
| JP | 2016-171308 A | 9/2016 | |
| JP | 2017204737 A | 11/2017 | |
| KR | 20160132342 A | 11/2016 | |
| WO | WO-2016129410 A1 | 8/2016 | |
| WO | 2016/203974 A1 | 12/2016 | |
| WO | 2017/126326 A1 | 7/2017 | |

OTHER PUBLICATIONS

Japanese Office Action dated Sep. 1, 2023 fir corresponding Japanese Application No. 2022-177150.
Extended European Search Report dated Sep. 22, 2023 for related European Application No. 23183088.6.
Chinese Office Action dated Dec. 7, 2023 for Corresponding Chinese Application No. 202211345588.5.

* cited by examiner

SOLID-STATE IMAGING DEVICE AND ELECTRONIC APPARATUS

CROSS REFERENCES TO RELATED APPLICATIONS

The present Application is a Continuation Application of U.S. patent application Ser. No. 17/586,230 filed Jan. 27, 2022, which is a Continuation Application of U.S. patent application Ser. No. 17/470,481 filed Sep. 9, 2021, now U.S. Pat. No. 11,483,526 issued Oct. 25, 2022, which is a Continuation Application of U.S. patent application Ser. No. 16/764,474 filed May 15, 2020, now U.S. Pat. No. 11,258, 993 issued Feb. 22, 2022, which is a 371 National Stage Entry of International Application No.: PCT/JP2018/041820, filed on Nov. 12, 2018, which in turn claims priority from Japanese Application No. 2017-224138, filed on Nov. 22, 2017, the entire contents of which are incorporated herein by reference.

TECHNICAL FIELD

The present technology relates to a solid-state imaging device and an electronic apparatus, and more particularly, relates to a solid-state imaging device and an electronic apparatus configured to be able to simultaneously acquire a signal for generating a high dynamic range image and a signal for detecting a phase difference.

BACKGROUND ART

There has been proposed a solid-state imaging device that achieves simultaneous acquisition of two types of pixel signals, a high-sensitivity signal and a low-sensitivity signal, for generating a high dynamic range image (hereinafter also referred to as an HDR image) and acquisition of a phase difference detection signal for distance measurement (see, for example, Patent Document 1).

CITATION LIST

Patent Document

Patent Document 1: Japanese Patent Application Laid-Open No. 2016-171308

SUMMARY OF THE INVENTION

Problems to be Solved by the Invention

In a pixel structure of Patent Document 1, three photodiodes are formed under one on-chip lens. If the curvature of the on-chip lens is increased to increase the refractive power to improve the angle dependence for specialization in phase difference characteristics, it becomes difficult to generate HDR images. Conversely, if the curvature of the on-chip lens is reduced to reduce the refractive power to reduce the angle dependence for specialization in favorable generation of HDR images, the degree of separation of phase difference characteristics is deteriorated. Thus, it is difficult to achieve both phase difference characteristics and HDR characteristics. There has also been proposed a lens structure in which the curvature of one on-chip lens is changed, but it is sensitive to variation in shape, and thus is difficult to produce in large quantities.

The present technology has been made in view of such a situation, and is intended to enable simultaneous acquisition of a signal for generating a high dynamic range image and a signal for detecting a phase difference.

Solutions to Problems

A solid-state imaging device according to a first aspect of the present technology includes a plurality of pixel sets each including color filters of the same color, for a plurality of colors, each pixel set including a plurality of pixels, each pixel including a plurality of photoelectric conversion parts.

An electronic apparatus according to a second aspect of the present technology includes a solid-state imaging device including a plurality of pixel sets each including color filters of the same color, for a plurality of colors, each pixel set including a plurality of pixels, each pixel including a plurality of photoelectric conversion parts.

In the first and second aspects of the present technology, a plurality of pixel sets each including color filters of the same color is provided for a plurality of colors, each pixel set is provided with a plurality of pixels, and each pixel is provided with a plurality of photoelectric conversion parts.

The solid-state imaging device and the electronic apparatus may be independent devices, or may be modules incorporated into other devices.

Effects of the Invention

According to the first and second aspects of the present technology, it is possible to simultaneously acquire a signal for generating a high dynamic range image and a signal for detecting a phase difference.

Note that the effects described here are not necessarily limiting, and any effect described in the present disclosure may be included.

MODE FOR CARRYING OUT THE INVENTION

Figure 1:
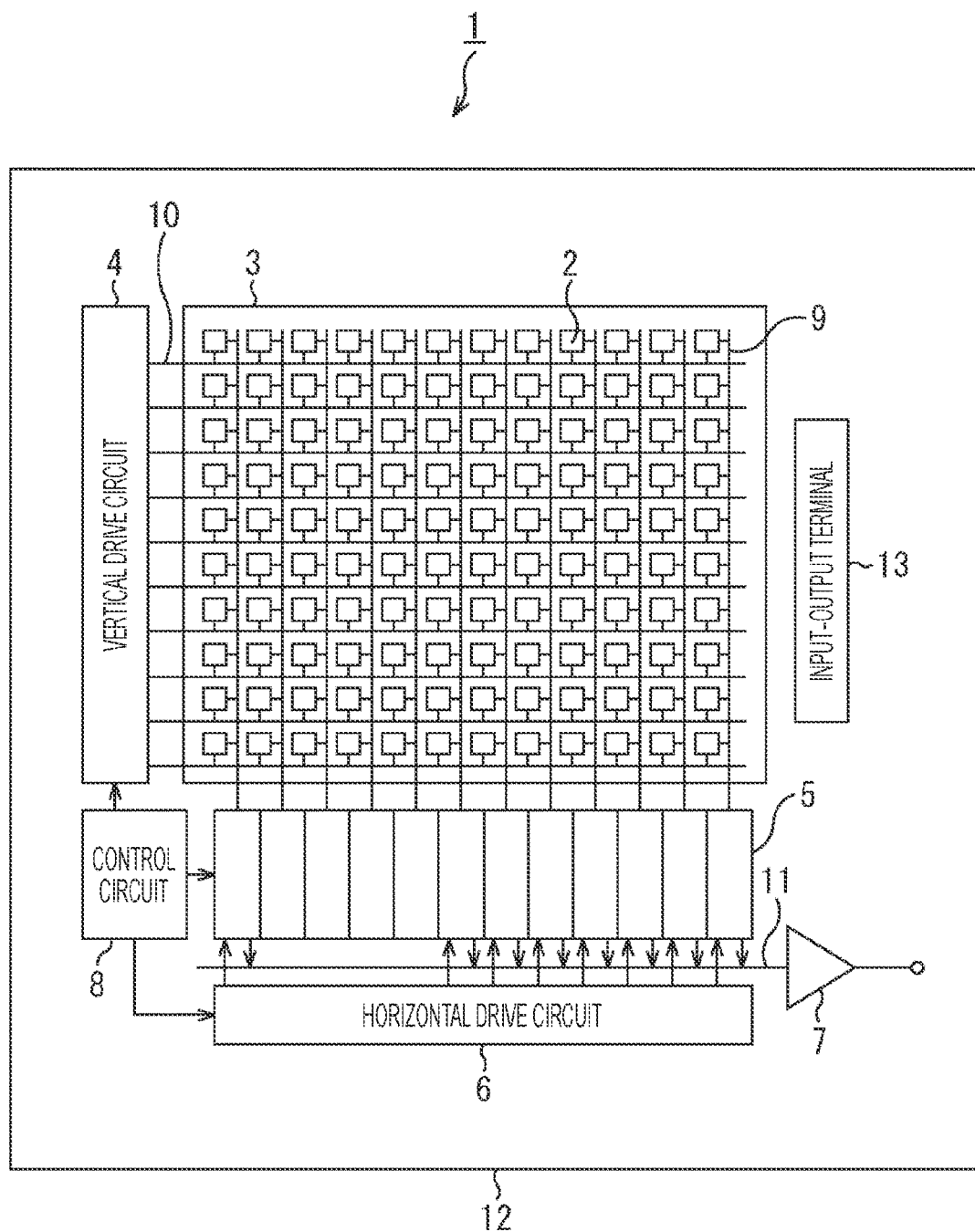
FIG. 1 is a diagram illustrating a schematic configuration of a solid-state imaging device to which the present technology is applied.

Hereinafter, a mode for carrying out the present technology (hereinafter referred to as an embodiment) will be described. Note that the description will be made in the following order.

1. Schematic configuration example of solid-state imaging device
2. First cross-sectional configuration example of pixels
3. Example of arrangement of color filters
4. Circuit configuration example of pixel set
5. Explanation of output modes
6. Modification of color array of color filters
7. Modification of orientations of photodiodes
8. Modification of on-chip lens arrangement
9. Second cross-sectional configuration example of pixels
10. Third cross-sectional configuration example of pixels
11. Configuration example in which light-shielding film is added
12. Other modifications
13. Pixel transistor arrangement example
14. Example of application to electronic apparatus
15. Example of application to endoscopic surgery system
16. Example of application to mobile object <1. Schematic Configuration Example of Solid-State Imaging Device>

FIG. 1 illustrates a schematic configuration of a solid-state imaging device to which the present technology is applied.

A solid-state imaging device 1 of FIG. 1 includes a pixel array 3 with pixels 2 two-dimensionally arrayed in a matrix, and peripheral circuitry around the pixel array 3 on a semiconductor substrate 12 using, for example, silicon (Si) as a semiconductor. The peripheral circuitry includes a vertical drive circuit 4, column signal processing circuits 5, a horizontal drive circuit 6, an output circuit 7, a control circuit 8, and others.

The pixels 2 each include photodiodes as photoelectric conversion parts and a plurality of pixel transistors. Note that, as described later with reference to FIG. 4, the pixels 2 are formed in a shared pixel structure in which floating diffusion as a charge holding part that holds charges generated in the photodiodes is shared among a plurality of pixels 2. In the shared pixel structure, photodiodes and transfer transistors are provided for each pixel, and a selection transistor, a reset transistor, and an amplification transistor are shared by a plurality of pixels.

The control circuit 8 receives an input clock and data instructing an operation mode or the like, and outputs data such as internal information of the solid-state imaging device 1. Specifically, on the basis of a vertical synchronization signal, a horizontal synchronization signal, and a master clock, the control circuit 8 generates a clock signal and a control signal on the basis of which the vertical drive circuit 4, the column signal processing circuits 5, the horizontal drive circuit 6, and others operate. Then, the control circuit 8 outputs the generated clock signal and control signal to the vertical drive circuit 4, the column signal processing circuits 5, the horizontal drive circuit 6, and others.

The vertical drive circuit 4 is formed, for example, by a shift register, and selects a predetermined pixel drive wire 10, provides a pulse for driving the pixels 2 to the selected pixel drive wire 10, and drives the pixels 2 row by row. That is, the vertical drive circuit 4 performs control to selectively scan the pixels 2 of the pixel array 3 in the vertical direction sequentially row by row, and output pixel signals based on signal charges generated in the photoelectric conversion parts of the pixels 2 depending on the amount of received light, through vertical signal lines 9 to the column signal processing circuits 5.

The column signal processing circuits 5 are arranged for the corresponding columns of the pixels 2, and perform signal processing such as noise removal on signals output from the pixels 2 in one row for the corresponding pixel columns. For example, the column signal processing circuits 5 perform signal processing such as correlated double sampling (CDS) for removing fixed pattern noise peculiar to pixels and AD conversion.

The horizontal drive circuit 6 is formed, for example, by a shift register, selects each of the column signal processing circuits 5 in order by sequentially outputting a horizontal scanning pulse, and causes each of the column signal processing circuits 5 to output a pixel signal to a horizontal signal line 11.

The output circuit 7 performs predetermined signal processing on a signal sequentially provided from each of the column signal processing circuits 5 through the horizontal signal line 11, and outputs the signal. For example, the output circuit 7 may perform only buffering, or may perform various types of digital signal processing such as black level adjustment and column variation correction. An input-output terminal 13 exchanges signals with the outside.

The solid-state imaging device 1 formed as described above is a CMOS image sensor called a column AD system in which the column signal processing circuits 5 that perform CDS processing and AD conversion processing are arranged for the corresponding pixel columns.

Furthermore, the solid-state imaging device 1 may be formed by a chip of a stacked structure in which a plurality of substrates is stacked. A chip with a plurality of substrates stacked is formed by stacking a lower substrate and an upper substrate in that order from below upward. At least one or more of the control circuit 8, the vertical drive circuit 4, the column signal processing circuits 5, the horizontal drive circuit 6, and the output circuit 7 are formed on the lower substrate, and at least the pixel array 3 is formed on the upper substrate. Connection portions connect the vertical drive circuit 4 to the pixel array 3, and the column signal processing circuits 5 to the pixel array 3, so that signals are transmitted between the lower substrate and the upper substrate. The connection portions are formed, for example, by through silicon vias (TSVs), Cu—Cu, or the like.

<2. First Cross-Sectional Configuration Example of Pixels>

Figure 2:
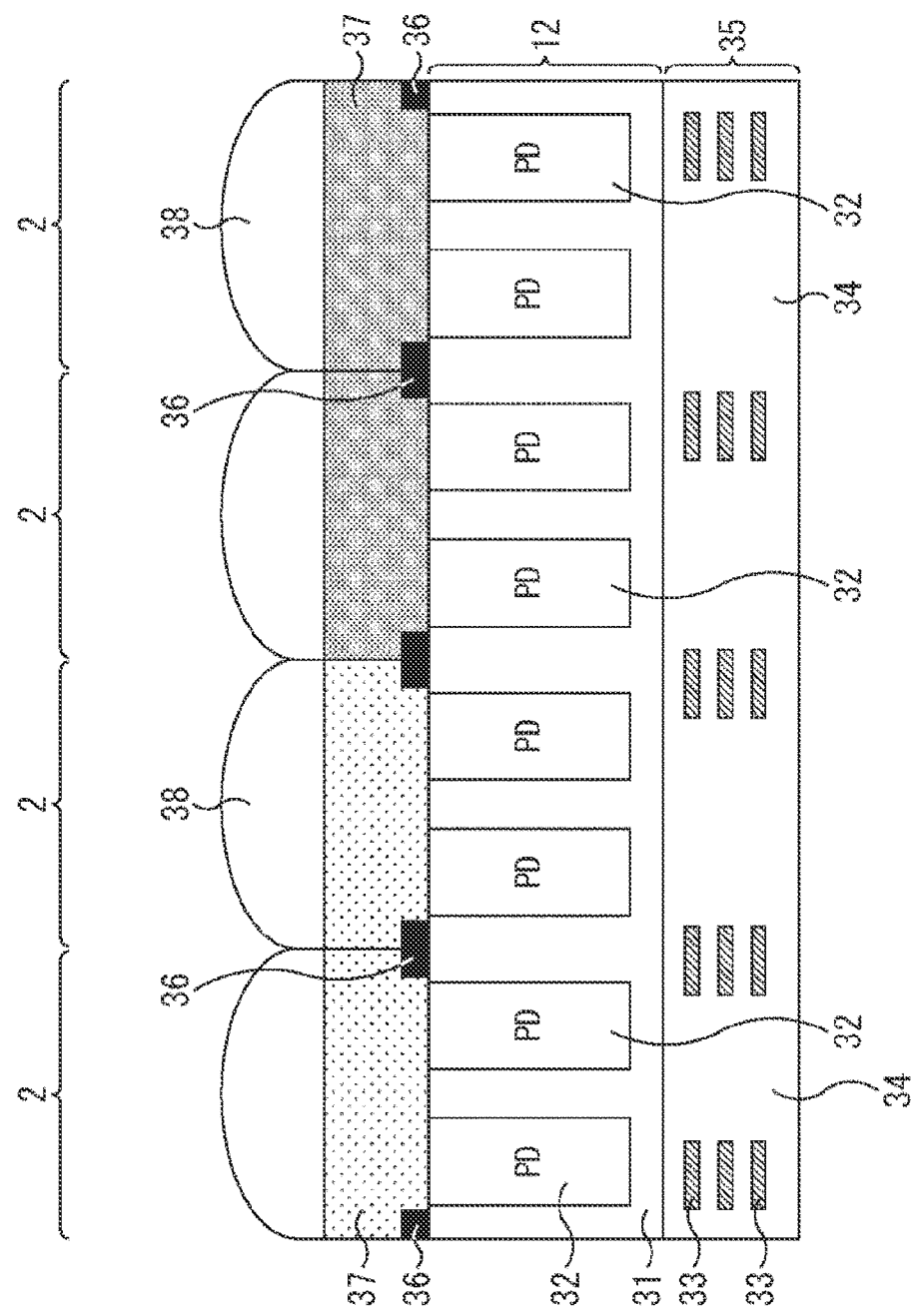
FIG. 2 is a diagram illustrating a first cross-sectional configuration example of a pixel array of the solid-state imaging device in FIG. 1.

FIG. 2 is a diagram illustrating a first cross-sectional configuration example of the pixel array 3 of the solid-state imaging device 1 in FIG. 1.

In the pixel array 3 of the solid-state imaging device 1, photodiodes PD are formed by, for example, forming N-type (second conductivity type) semiconductor regions 32 in a P-type (first conductivity type) semiconductor region 31 in the semiconductor substrate 12. In each pixel 2 of the pixel array 3, two photodiodes PD are formed per pixel, and the two photodiodes PD are formed in such a manner as to be symmetrically disposed in two parts into which a pixel region is divided equally. Note that in the following description, of the two photodiodes PD formed in one pixel, the photodiode PD disposed on the right side in the figure is sometimes referred to as the right photodiode PD, and the photodiode PD disposed on the left side as the left photodiode PD.

On the front side of the semiconductor substrate 12 that is the lower side in FIG. 2, a multilayer wiring layer 35 is formed which includes pixel transistors (not illustrated) for performing reading of charges generated and accumulated in the photodiodes PD of each pixel 2 and the like, a plurality of wiring layers 33, and an interlayer dielectric 34.

On the other hand, on pixel boundary portions on the back side of the semiconductor substrate 12 that is the upper side in FIG. 2, an inter-pixel light-shielding film 36 is formed. The inter-pixel light-shielding film 36 may be of any material that blocks light, and is desirably of a material that has a high light-blocking property and can be processed with high precision by fine processing such as etching. The inter-pixel light-shielding film 36 can be formed, for example, by a metal film of tungsten (W), aluminum (Al), copper (Cu), titanium (Ti), molybdenum (Mo), nickel (Ni), or the like.

In addition, for example, an antireflection film (insulating layer) formed, for example, by a silicon oxide film or the like may be further formed on a back side interface of the semiconductor substrate 12.

On the back surface of the semiconductor substrate 12 including the inter-pixel light-shielding film 36, color filters 37 are formed. The color filters 37 are formed by spin-coating photosensitive resin containing coloring matters such as pigments or dyes, for example. The color array of the color filters 37 will be described later with reference to FIG. 3. Red (R), green (G), and blue (B) colors are arranged in a Bayer array in units of four pixels in 2×2 (two rows by two columns).

On the color filters 37, on-chip lenses 38 are formed for the individual pixels. The on-chip lenses 38 are formed, for example, of a resin material such as a styrene resin, an acrylic resin, a styrene-acryl copolymer resin, or a siloxane resin.

As described above, the solid-state imaging device 1 is a back-side illuminated CMOS solid-state imaging device in which the color filters 37 and the on-chip lenses 38 are formed on the back side of the semiconductor substrate 12 opposite to the front side on which the multilayer wiring layer 35 is formed, so that light enters from the back side.

Each pixel 2 of the solid-state imaging device 1 has two separate photodiodes PD in the pixel. The two photodiodes PD are formed at different positions, so that a shift occurs between images generated from the two photodiodes PD, individually. From this image shift, the amount of phase shift is calculated to calculate the amount of defocus. By adjusting (moving) an imaging lens, autofocus can be achieved.

<3. Example of Arrangement of Color Filters>

Next, with reference to FIG. 3, the color array of the color filters 37 in the pixel array 3 will be described.

In the pixel array 3 with the pixels 2 two-dimensionally arrayed in a matrix, four pixels 2 in 2×2 (two vertical pixels×two horizontal pixels) constitute one pixel set 51. And the color filters 37 are arranged to be of the same color in each individual pixel set 51. More specifically, the R, G, and B color filters 37 are arranged in a Bayer array in units of the pixel sets 51.

Figure 3:
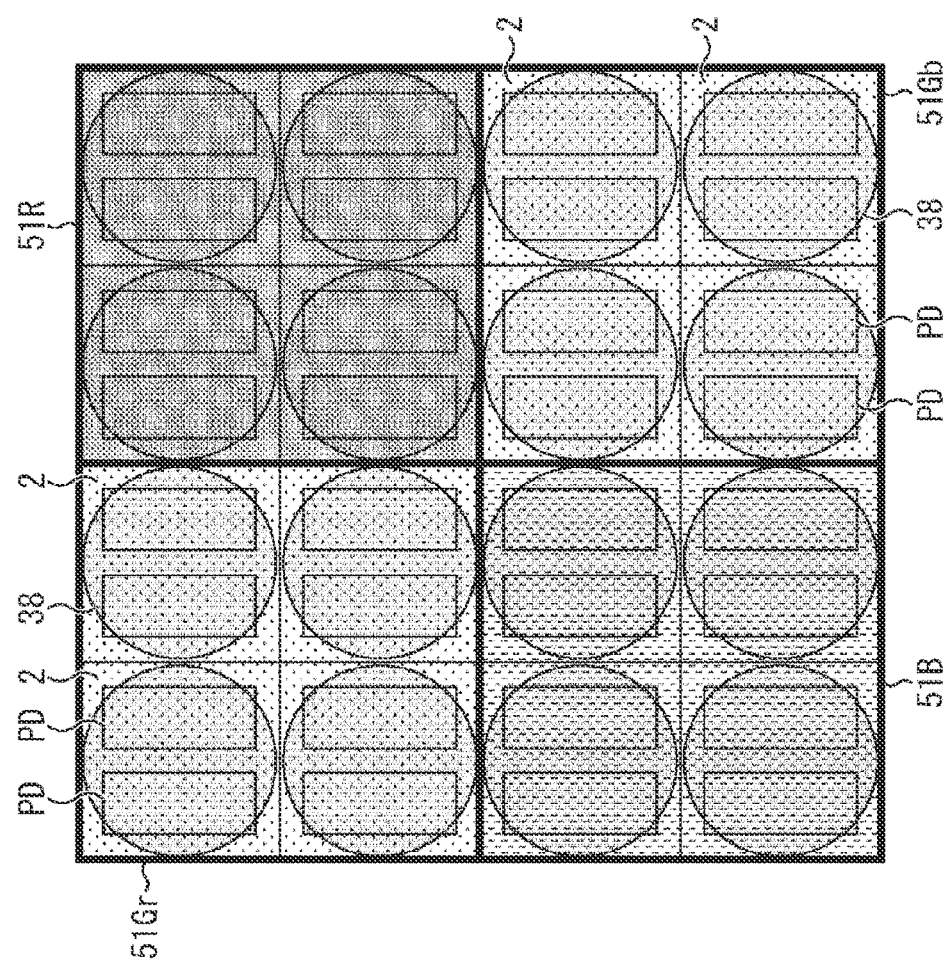
FIG. 3 is a diagram illustrating a color array of color filters.

In FIG. 3, the pixel set 51 having the R color filters 37 is represented by a pixel set 51R, and the pixel set 51 having the G color filters 37 adjacent to the pixel set 51R is represented by a pixel set 51Gr. Furthermore, the pixel set 51 having the B color filters 37 is represented by a pixel set 51B, and the pixel set 51 having the G color filters 37 adjacent to the pixel set 51B is represented by a pixel set 51Gb. Note that the configuration of the color filters is not limited to RGB primary-colors filters, and various configurations including filters of complementary colors such as cyan, magenta, yellow, and green (CMYG) may be applied.

Furthermore, the orientations of the longitudinal shape of the two photodiodes PD formed in each pixel 2 are the same direction in the pixel set 51, and also, they are formed in the same direction in all the pixel sets 51.

The on-chip lenses 38 are formed for the individual pixels.

<4. Circuit Configuration Example of Pixel Set>

Figure 4:
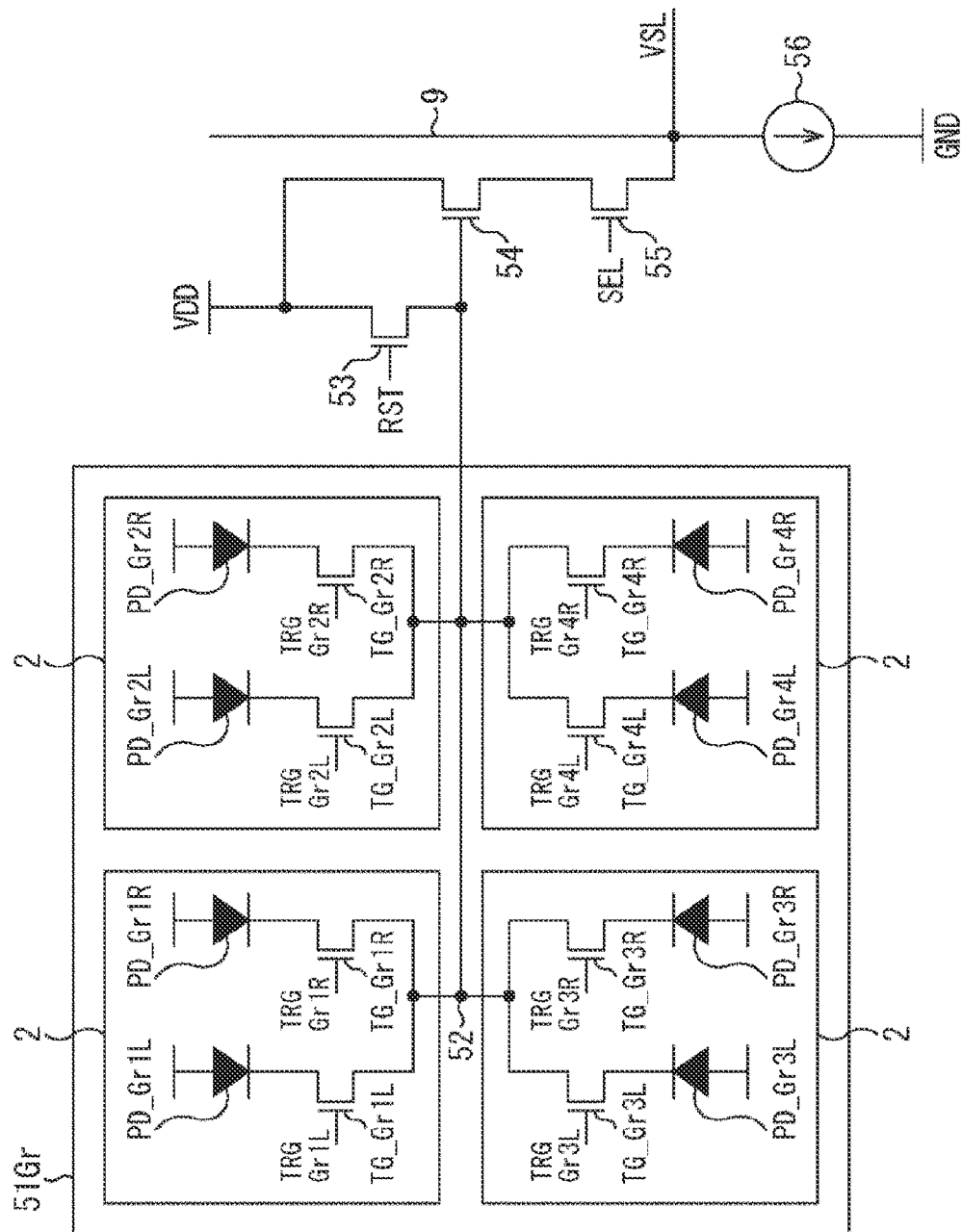
FIG. 4 is a diagram illustrating a circuit configuration of a pixel set.

Next, FIG. 4 is a diagram illustrating a circuit configuration of the pixel set 51.

FIG. 4 illustrates a circuit configuration of the pixel set 51Gr as an example of the pixel set 51.

Each pixel 2 of the pixel set 51Gr includes two photodiodes PD and two transfer transistors TG for transferring charges accumulated in them. And one FD 52, one reset transistor 53, one amplification transistor 54, and one selection transistor 55 are provided for the pixel set 51Gr. Each of the reset transistor 53, the amplification transistor 54, and the selection transistor is shared by the four pixels of the pixel set 51Gr. The four pixels sharing the reset transistor 53, the amplification transistor 54, and the selection transistor form a sharing unit.

Note that in the following, in a case where the two photodiodes PD and the two transfer transistors TG of each pixel 2 in the pixel set 51Gr are distinguished from each other, of the four pixels in 2×2 constituting the pixel set 51Gr, the two photodiodes PD of the upper left pixel 2 are referred to as photodiodes PD_Gr1L and PD_Gr1R, and the two transfer transistors TG that transfer charges accumulated in the photodiodes PD_Gr1L and PD_Gr1R are referred to as transfer transistors TG_Gr1L and TG_Gr1R.

Furthermore, the two photodiodes PD of the upper right pixel 2 are referred to as photodiodes PD_Gr2L and PD_Gr2R, and the two transfer transistors TG that transfer charges accumulated in the photodiodes PD_Gr2L and PD_Gr2R are referred to as transfer transistors TG_Gr2L and TG_Gr2R.

Likewise, the two photodiodes PD of the lower left pixel 2 are referred to as photodiodes PD_Gr3L and PD_Gr3R, and the two transfer transistors TG that transfer charges accumulated in the photodiodes Gr3L and Gr3R are referred to as transfer transistors TG_Gr3L and TG_Gr3R. The two photodiodes PD of the lower right pixel 2 are referred to as photodiodes PD_Gr4L and PD_Gr4R, and the two transfer transistors TG that transfer charges accumulated in the photodiodes PD_Gr4L and PD_Gr4R are referred to as transfer transistors TG_Gr4L and TG_Gr4R.

Each of the photodiodes PD of each pixel 2 in the pixel set 51Gr receives light and generates and accumulates photocharges.

When a drive signal TRGGr1L provided to the gate electrode becomes active, the transfer transistor TG_Gr1L becomes conductive in response to this, transferring photocharges accumulated in the photodiode PD_Gr1L to the FD 52. When a drive signal TRGGr1R provided to the gate electrode becomes active, the transfer transistor TG_Gr1R becomes conductive in response to this, transferring photocharges accumulated in the photodiode PD_Gr1R to the FD 52.

When a drive signal TRGGr2L provided to the gate electrode becomes active, the transfer transistor TG_Gr2L becomes conductive in response to this, transferring photocharges accumulated in the photodiode PD_Gr2L to the FD 52. When a drive signal TRGGr2R provided to the gate electrode becomes active, the transfer transistor TG_Gr2R becomes conductive in response to this, transferring photocharges accumulated in the photodiode PD_Gr2R to the FD 52. The similar applies to the photodiodes PD_Gr3L, PD_Gr3R, PD_Gr4L, and PD_Gr4R, and the transfer transistors TG_Gr3L, TG_Gr3R, TG_Gr4L, and TG_Gr4R.

The FD 52 temporarily holds photocharges provided from each photodiode PD of each pixel 2 in the pixel set 51Gr.

When a drive signal RST provided to the gate electrode becomes active, the reset transistor 53 becomes conductive in response to this, resetting the potential of the FD 52 to a predetermined level (reset voltage VDD).

The amplification transistor 54 has a source electrode connected to the vertical signal line 9 via the selection transistor 55, thereby forming a source follower circuit with a load MOS of a constant current source circuit 56 connected to one end of the vertical signal line 9.

The selection transistor 55 is connected between the source electrode of the amplification transistor 54 and the vertical signal line 9. When a selection signal SEL provided to the gate electrode becomes active, the selection transistor 55 becomes conductive in response to this, bringing the sharing unit into a selected state and outputting pixel signals of the pixels 2 in the sharing unit output from the amplification transistor 54 to the vertical signal line 9. Note that for the pixel set 51 (the pixel set 51Gr in FIG. 4), one selection transistor may be provided as illustrated in FIG. 4, or two or more selection transistors 55 may be provided. In a case where two or more selection transistors 55 are provided for the pixel set 51, the two or more selection transistors 55 are connected to different vertical signal lines 9, so that pixel signals can be read at higher speed.

The transfer transistors TG of the pixels 2, the reset transistor 53, the amplification transistor 54, and the selection transistor 55 are controlled by the vertical drive circuit 4.

Figure 5:
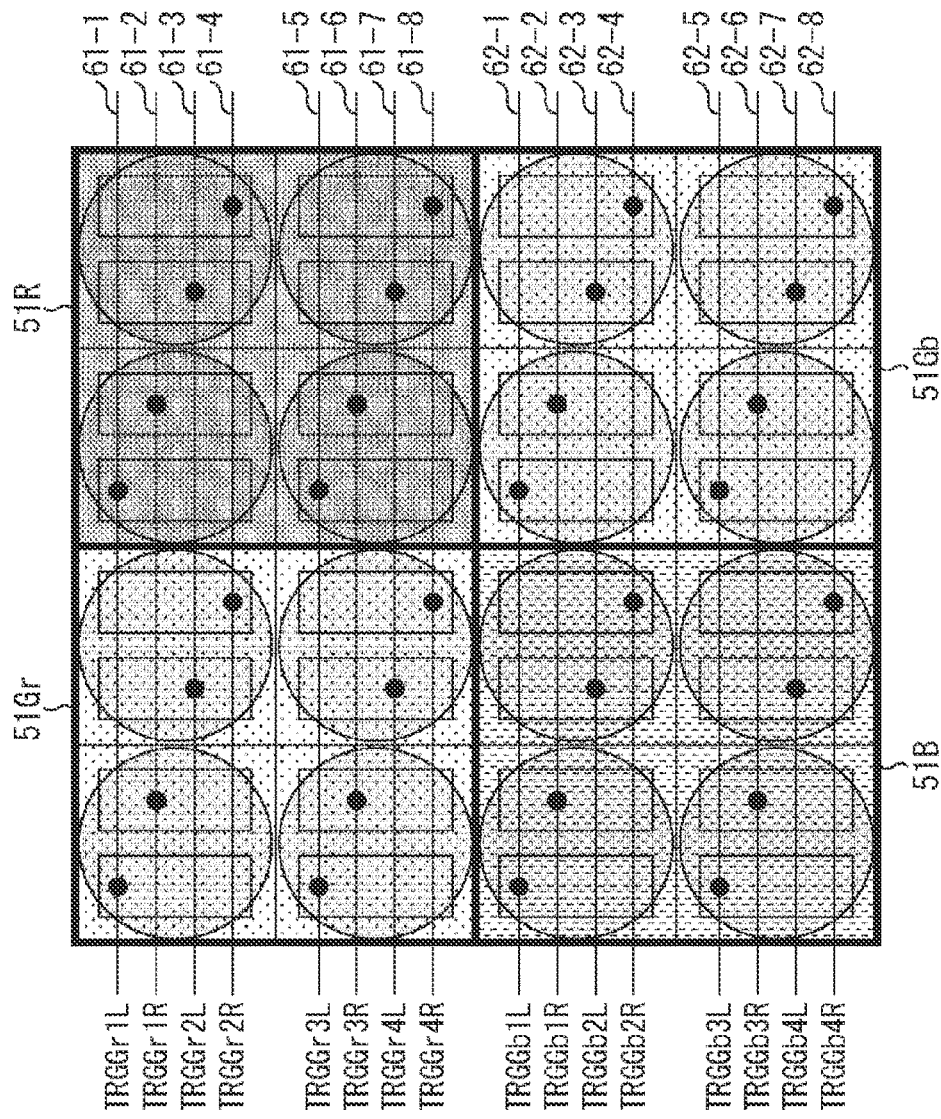
FIG. 5 is a diagram illustrating a configuration of signal lines that control transfer transistors of pixel sets.

FIG. 5 illustrates a configuration of signal lines for providing the drive signals TRGGr to the gate electrodes of the eight transfer transistors TG constituting the pixel set 51 as illustrated in FIG. 4.

In order to provide the drive signals TRGGr to the gate electrodes of the eight transfer transistors TG constituting the pixel set 51Gr, as illustrated in FIG. 5, eight signal lines 61-1 to 61-8 are required for a plurality of pixel sets 51 arrayed in the horizontal direction. The eight signal lines 61-1 to 61-8 are part of the pixel drive wires 10 in FIG. 1.

The signal line 61-1 transmits the drive signal TRGGr1L to be provided to the gate electrode of the transfer transistor TG_Gr1L in the pixel set 51Gr. Furthermore, the signal line 61-1 also transmits the drive signal TRGGr1L to the gate electrode of a transfer transistor TG_R1L (not illustrated) in the pixel set 51R adjacent to the pixel set 51Gr, located at the same position as the transfer transistor TG_Gr1L in the pixel set 51Gr.

The signal line 61-2 transmits the drive signal TRGGr1R to be provided to the gate electrode of the transfer transistor TG_Gr1R in the pixel set 51Gr. Furthermore, the signal line 61-2 also transmits the drive signal TRGGr1R to the gate electrode of a transfer transistor TG_R1R (not illustrated) in the pixel set 51R adjacent to the pixel set 51Gr, located at the same position as the transfer transistor TG_Gr1R in the pixel set 51Gr.

The signal line 61-3 transmits the drive signal TRGGr2L to be provided to the gate electrode of the transfer transistor TG_Gr2L in the pixel set 51Gr. Furthermore, the signal line 61-3 also transmits the drive signal TRGGr2L to the gate electrode of a transfer transistor TG_R2L (not illustrated) in the pixel set 51R adjacent to the pixel set 51Gr, located at the same position as the transfer transistor G_Gr2L in the pixel set 51Gr.

The signal line 61-4 transmits the drive signal TRGGr2R to be provided to the gate electrode of the transfer transistor TG_Gr2R in the pixel set 51Gr. Furthermore, the signal line 61-4 also transmits the drive signal TRGGr2R to the gate electrode of a transfer transistor TG_R2R (not illustrated) in the pixel set 51R adjacent to the pixel set 51Gr, located at the same position as the transfer transistor TG_Gr2R in the pixel set 51Gr.

The signal line 61-5 transmits the drive signal TRGGr3L to be provided to the gate electrode of the transfer transistor TG_Gr3L in the pixel set 51Gr. Furthermore, the signal line 61-5 also transmits the drive signal TRGGr3L to the gate electrode of a transfer transistor TG_R3L (not illustrated) in the pixel set 51R adjacent to the pixel set 51Gr, located at the same position as the transfer transistor TG_Gr3L in the pixel set 51Gr.

The signal line 61-6 transmits the drive signal TRGGr3R to be provided to the gate electrode of the transfer transistor TG_Gr3R in the pixel set 51Gr. Furthermore, the signal line 61-6 also transmits the drive signal TRGGr3R to the gate electrode of a transfer transistor TG_R3R (not illustrated) in the pixel set 51R adjacent to the pixel set 51Gr, located at the same position as the transfer transistor TG_Gr3R in the pixel set 51Gr.

The signal line 61-7 transmits the drive signal TRGGr4L to be provided to the gate electrode of the transfer transistor TG_Gr4L in the pixel set 51Gr. Furthermore, the signal line 61-7 also transmits the drive signal TRGGr4L to the gate electrode of a transfer transistor TG_R4L (not illustrated) in the pixel set 51R adjacent to the pixel set 51Gr, located at the same position as the transfer transistor TG_Gr4L in the pixel set 51Gr.

The signal line 61-8 transmits the drive signal TRGGr4R to be provided to the gate electrode of the transfer transistor TG_Gr4R in the pixel set 51Gr. Furthermore, the signal line 61-8 also transmits the drive signal TRGGr4R to the gate electrode of a transfer transistor TG_R4R (not illustrated) in the pixel set 51R adjacent to the pixel set 51Gr, located at the same position as the transfer transistor TG_Gr4R in the pixel set 51Gr.

Likewise, eight signal lines 62-1 to 62-8 are required for the pixel sets 51B and 51Gb arrayed in the horizontal direction.

The signal line 62-1 transmits a drive signal TRGGb1L to the gate electrodes of transfer transistors TG in the pixel sets 51B and 51Gb corresponding to the transfer transistor TG_Gr1L in the pixel set 51Gr.

The signal line 62-2 transmits a drive signal TRGGb1R to the gate electrodes of transfer transistors TG in the pixel sets 51B and 51Gb corresponding to the transfer transistor TG_Gr1R in the pixel set 51Gr.

The signal line 62-3 transmits a drive signal TRGGb2L to the gate electrodes of transfer transistors TG in the pixel sets 51B and 51Gb corresponding to the transfer transistor TG_Gr2L in the pixel set 51Gr.

The signal line 62-4 transmits a drive signal TRGGb2R to the gate electrodes of transfer transistors TG in the pixel sets 51B and 51Gb corresponding to the transfer transistor TG_Gr2R in the pixel set 51Gr.

The signal line 62-5 transmits a drive signal TRGGb3L to the gate electrodes of transfer transistors TG in the pixel sets 51B and 51Gb corresponding to the transfer transistor TG_Gr3L in the pixel set 51Gr.

The signal line 62-6 transmits a drive signal TRGGb3R to the gate electrodes of transfer transistors TG in the pixel sets 51B and 51Gb corresponding to the transfer transistor TG_Gr3R in the pixel set 51Gr.

The signal line 62-7 transmits a drive signal TRGGb4L to the gate electrodes of transfer transistors TG in the pixel sets 51B and 51Gb corresponding to the transfer transistors TG_Gr4L in the pixel set 51Gr.

The signal line 62-8 transmits a drive signal TRGGb4R to the gate electrodes of transfer transistors TG in the pixel sets 51B and 51Gb corresponding to the transfer transistor TG_Gr4R in the pixel set 51Gr.

By forming the circuit of the plurality of pixels 2 in the sharing unit as above, the pixels 2 in the sharing unit can output a pixel signal for each photodiode PD as a unit, and can output a pixel signal for each pixel as a unit or for a plurality of pixels as a unit, in response to a drive signal from the vertical drive circuit 4. In a case where a pixel signal is output for each pixel as a unit or for a plurality of pixels as a unit, a plurality of transfer transistors TG that outputs simultaneously is activated simultaneously. The FD 52 adds charges provided from a plurality of photodiodes PD via the transfer transistors TG simultaneously activated. Consequently, a pixel signal of each pixel as a unit or of a plurality of pixels as a unit is output from the FD 52 through the amplification transistor 54 and the selection transistor 55 to the column signal processing circuit 5.

Note that although FIGS. 4 and 5 illustrate a circuit example in which the four pixels in 2×2 constituting the pixel set 51 are a sharing unit, the combination of a plurality of pixels as a sharing unit is not limited to this. For example, two pixels in 1×2 (one vertical pixel×two horizontal pixels) or in 2×1 (two vertical pixels×one horizontal pixel) may be a sharing unit, or four pixels in 4×1 (four vertical pixels×one horizontal pixel) may be a sharing unit.

<5. Explanation of Output Mode>
<5.1 Full-Resolution Mode>

Next, a plurality of output modes that can be executed by the solid-state imaging device 1 will be described.

First, a full-resolution mode in which pixel signals generated in all the photodiodes PD in the pixel array 3 are output individually will be described.

Figure 6:
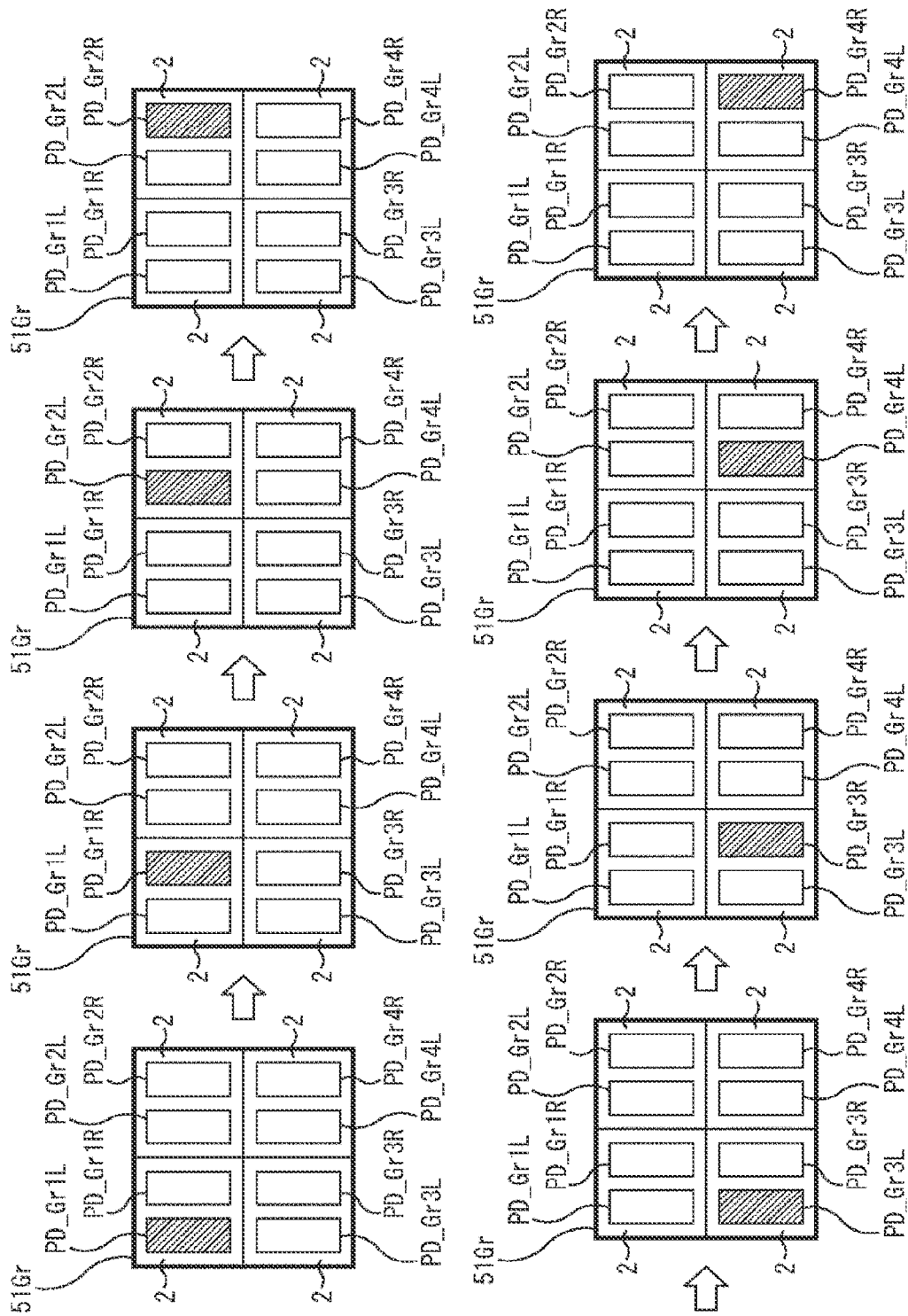
FIG. 6 is a diagram illustrating drive in a case where the solid-state imaging device operates in a full-resolution mode.

FIG. 6 is a diagram illustrating drive (pixel signal output control) of the pixel set 51Gr in a case where the solid-state imaging device 1 operates in the full-resolution mode.

A photodiode PD hatched in FIG. 6 represents a photodiode PD selected to output a pixel signal. In the full-resolution mode, as illustrated in FIG. 6, the eight photodiodes PD in the pixel set 51Gr are selected sequentially, and pixel signals generated individually by the eight photodiodes PD are output individually.

In the example of FIG. 6, the order in which the eight photodiodes PD are selected is the order of the photodiodes PD_Gr1L, PD_Gr1R, PD_Gr2L, PD_Gr2R, PD_Gr3L, PD_Gr3R, PD_Gr4L, and PD_Gr4R. The order is not limited to this.

In the full-resolution mode, by combining pixel signals of the two photodiodes PD in the same pixel, a pixel signal of one pixel can be obtained, and by comparing the pixel signals of the two photodiodes PD in the same pixel, a phase difference can be detected. The other pixel sets 51Gb, 51R, and 51B perform an operation similar to that of the pixel set 51Gr in FIG. 6.

Thus, in the full-resolution mode, all the pixels 2 can output a signal of each pixel as a unit and output signals for detecting a phase difference.

Furthermore, in the solid-state imaging device 1, the color filters 37 of R, G, or B are arranged in units of four pixels (in units of the pixel sets 51) as illustrated in FIG. 3, but the full-resolution mode also allows re-mosaicing processing to regenerate and output pixel signals in a Bayer array of R, G, B in units of pixels.

Note that in the full-resolution mode in which the drive in FIG. 6 is performed, the frame rate is reduced and the power consumption is increased. Thus, drive without performing phase difference detection on some of the pixels 2 in the pixel set 51Gr may be performed.

Figure 7:
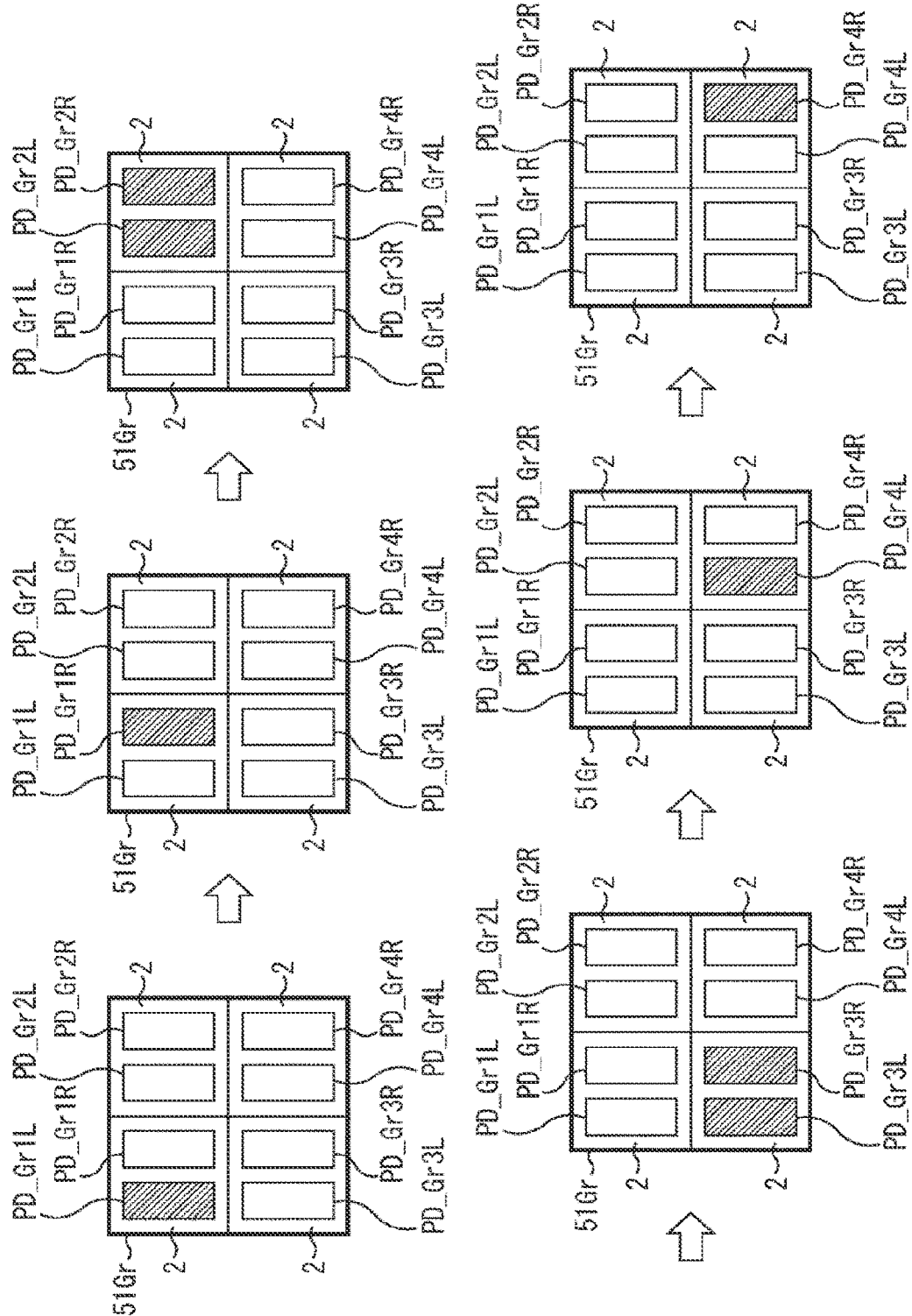
FIG. 7 is a diagram illustrating a modification of the full-resolution mode.

For example, as illustrated in FIG. 7, for the upper right pixel 2 and the lower left pixel 2 of the four pixels constituting the pixel set 51Gr, the solid-state imaging device 1 drives the two photodiodes PD in the pixels to read them simultaneously. Also in FIG. 7, a hatched photodiode PD represents a photodiode PD selected to output a pixel signal.

Phase difference is detected using pixel signals of the photodiodes PD_Gr1L and PD_Gr1R of the upper left pixel 2 and the photodiodes PD_Gr4L and PD_Gr4R of the lower right pixel 2. Thus, by reducing the number of pixels 2 in which a phase difference is detected, the frame rate and the power consumption can be improved. Alternatively, pixels 2 in which a phase difference can be detected may be changed depending on difference in the amount of light received. For example, in low illumination, the drive in FIG. 6 is performed in which phase difference detection is performed in all the pixels, and in high illumination, the drive in FIG. 7 is performed in which some of the pixels 2 are excluded.

The example of FIG. 7 is an example in which phase difference detection is performed in two pixels of the four pixels constituting the pixel set 51Gr, but drive to perform phase difference detection in only one pixel may be performed.

<5.2 Four-Pixel Addition Phase-Difference Detection Mode>

Next, a four-pixel addition phase-difference detection mode will be described.

The solid-state imaging device 1 can execute the four-pixel addition phase-difference detection mode in which pixel signals are added and output in each pixel set 51 that is a sharing unit, that is, in units of four pixels in 2×2, and a phase difference is detected on the entire surface of the pixel array 3.

Figure 8:
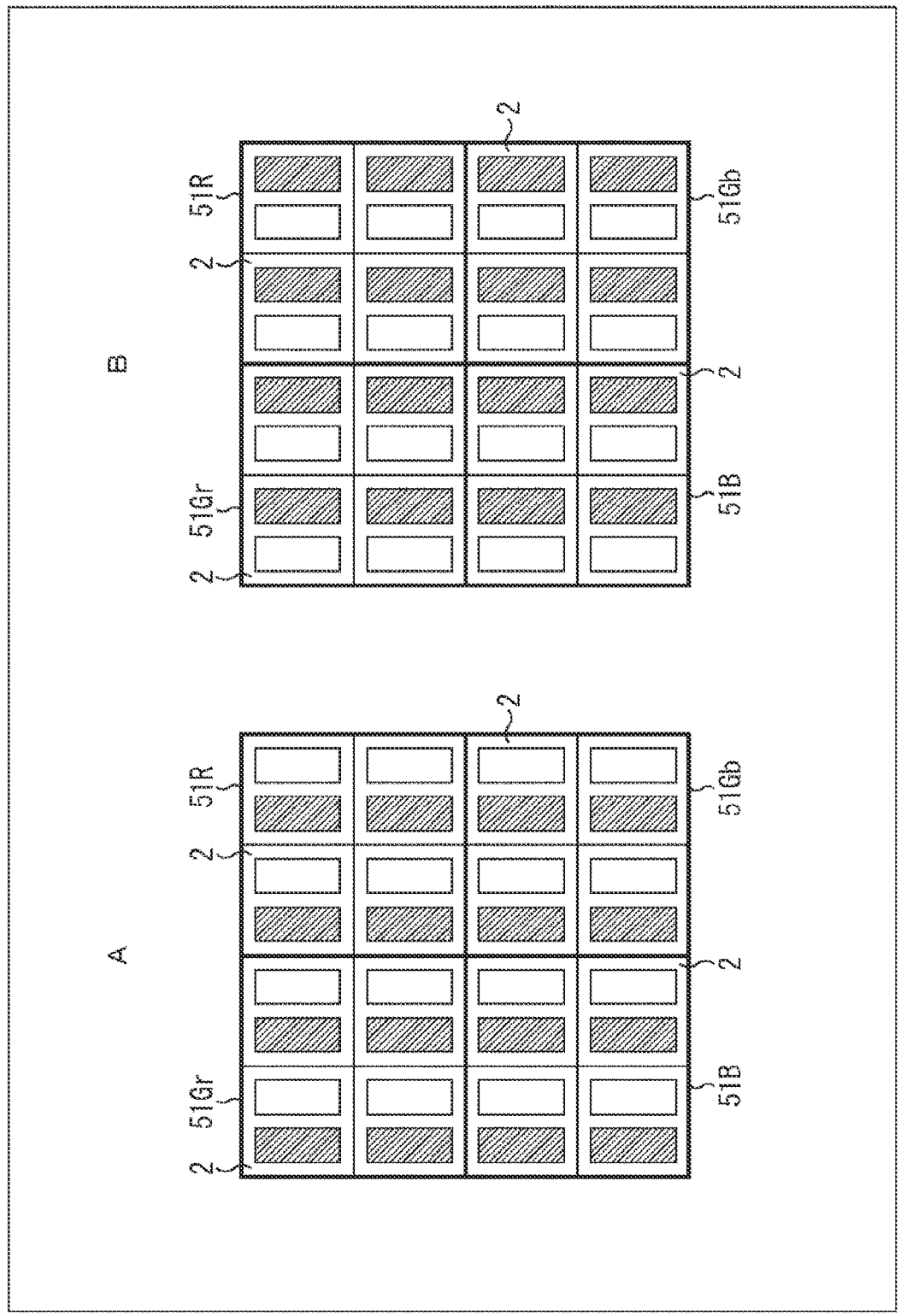
FIG. 8 is a diagram illustrating drive in a case where the solid-state imaging device operates in a four-pixel addition phase-difference detection mode.

FIG. 8 is a diagram illustrating drive in the four-pixel addition phase-difference detection mode.

Also in FIG. 8, a hatched photodiode PD represents a photodiode PD selected to output a pixel signal.

In the four-pixel addition phase-difference detection mode, the solid-state imaging device 1 adds and outputs pixel signals of photodiodes PD located at the same position in the pixels of the pixel set 51, of the pairs of photodiodes PD of the pixels 2. For example, as illustrated in A of FIG. 8, the solid-state imaging device 1 first adds and outputs pixel signals of all the left photodiodes PD in the pixel set 51, and then, as illustrated in B of FIG. 8, adds and outputs pixel signals of all the right photodiodes PD in the pixel set 51. Note that the reading order of the left photodiodes PD and the right photodiodes PD may be reversed.

By performing such drive, a phase difference can be detected from a pixel signal of the left photodiodes PD and a pixel signal of the right photodiodes PD in each individual pixel set 51 read, and by combining the two pixel signals, a pixel signal output of each individual pixel set 51 (a unit of four pixels) can be obtained. In other words, an entire-surface phase difference can be detected while the advantage of a dynamic range due to increased pixel capacitance Qs is maintained.

As a method of discernably reading a pixel signal of left photodiodes PD and a pixel signal of right photodiodes PD, two ways can be adopted: a first reading method of separately reading a pixel signal of left photodiodes PD and a pixel signal of right photodiodes PD, and a second reading method of reading a signal obtained by adding a pixel signal of left photodiodes PD and a pixel signal of right photodiodes PD.

The first reading method and the second reading method will be briefly described.

First, the first reading method will be described.

First, while left and right photodiodes PD are receiving light (exposed), a dark level signal for performing correlated double sampling is acquired.

After the elapse of a predetermined exposure time, the solid-state imaging device 1 first reads a pixel signal of one of left and right photodiode PD groups of the pixel set 51, for example, a pixel signal of the left photodiode PD group.

For example, the reading of a pixel signal of the left photodiode PD group will be described with the example of the pixel set 51Gr illustrated in FIG. 4. After the selection transistor 55 is activated, the transfer transistors TG_Gr1L, TG_Gr2L, TG_Gr3L, and TG_Gr4L are activated to transfer charges accumulated in the photodiodes PD_Gr1L, PD_Gr2L, PD_Gr3L, and PD_Gr4L to the FD 52, so that a voltage signal corresponding to the accumulated charges in the FD 52 is output through the vertical signal line 9 to the column signal processing circuit 5.

The voltage signal output to the column signal processing circuit 5 is the sum of the pixel signal of the left photodiode PD group and the dark level signal. Thus, by subtracting the dark level signal from the voltage signal in the column signal processing circuit 5, the pixel signal of the left photodiode PD group is obtained.

Next, the solid-state imaging device 1 turns on the reset transistor 53 to reset the accumulated charges in the FD 52, and then reads a pixel signal of the other of the left and right photodiode PD groups of the pixel set 51, for example, a pixel signal of the right photodiode PD group. In the example of the pixel set 51Gr illustrated in FIG. 4, after the selection transistor 55 is activated, the transfer transistors TG_Gr1R, TG_Gr2R, TG_Gr3R, and TG_Gr4R are activated to transfer charges accumulated in the photodiodes PD_Gr1R, PD_Gr2R, PD_Gr3R, and PD_Gr4R to the FD 52, so that a voltage signal corresponding to the accumulated charges in the FD 52 is output through the vertical signal line 9 to the column signal processing circuit 5.

The voltage signal output to the column signal processing circuit 5 is the sum of the pixel signal of the right photodiode PD group and the dark level signal. Thus, by subtracting the dark level signal from the voltage signal in the column signal processing circuit 5, the pixel signal of the right photodiode PD group is obtained.

In the first reading method, a pixel signal of the left photodiodes PD and a pixel signal of the right photodiodes PD are read separately, so that a phase difference signal can be directly obtained. This allows acquisition of a high-quality signal for distance measurement. On the other hand, a signal for a captured image can be obtained by digitally adding signals of the left and right photodiodes PD.

Next, the second reading method will be described.

The second reading method is similar to the first reading method up until the acquisition of a dark level signal and the acquisition of a pixel signal of one of the left and right photodiode PD groups in the pixel set 51 (a pixel signal of the left photodiode PD group).

After acquiring a pixel signal of one of the left and right photodiode PD groups, the solid-state imaging device 1 does not turn on the reset transistor 53 (keeps it off) unlike the first reading method, and reads a pixel signal of the other of the left and right photodiode PD groups of the pixel set 51, for example, a pixel signal of the right photodiode PD group.

A voltage signal output to the column signal processing circuit 5 is the sum of the signals of the left and right photodiode PD groups and the dark level signal. The column signal processing circuit 5 first acquires the pixel signals of the left and right photodiode PD groups by subtracting the dark level signal from the voltage signal, and then acquires the pixel signal of the right photodiode PD group by subtracting the pixel signal of the left photodiode PD group obtained earlier from the pixel signals of the left and right photodiode PD groups.

In the second reading method, the pixel signal of the left photodiodes PD and the pixel signal of the right photodiodes PD can be acquired as above, and a phase difference signal can be obtained indirectly. On the other hand, signals for a captured image are added when they are analog, and thus have good signal quality, and also bring advantages in reading time and power consumption as compared with the first reading method.

<5.3 Four-Pixel Addition Mode>

Next, a four-pixel addition mode will be described.

In a case where phase difference information is not required, the solid-state imaging device 1 can execute the four-pixel addition mode in which pixel signals are added and output in each pixel set 51 that is a sharing unit, that is, in units of four pixels in 2×2.

In the four-pixel addition mode, all the (eight) transfer transistors TG in the pixel set 51 that is a sharing unit are simultaneously turned on, and charges in all the photodiodes PD in the pixel set 51 are provided to the FD 52. The FD 52 adds the charges of all the photodiodes PD in the pixel set 51. Then, a voltage signal corresponding to the added charges is output to the column signal processing circuit 5. By taking the difference between the voltage signal and a dark level signal, a pixel signal of each pixel set 51 can be acquired.

<5.4 First Phase Difference HDR Mode>

Next, a first phase difference HDR mode will be described.

The first phase difference HDR mode is an output mode that enables detection of a phase difference and generation of a high dynamic range image (hereinafter, referred to as an HDR image).

In order to detect phase difference, at least some of the plurality of pixels 2 constituting the pixel array 3 need to be pixels 2 that output a pixel signal of the left photodiode PD and a pixel signal of the right photodiode PD individually.

Furthermore, in order to generate an HDR image, the plurality of pixels 2 constituting the pixel array 3 needs to include pixels 2 different in exposure time.

Figure 9:
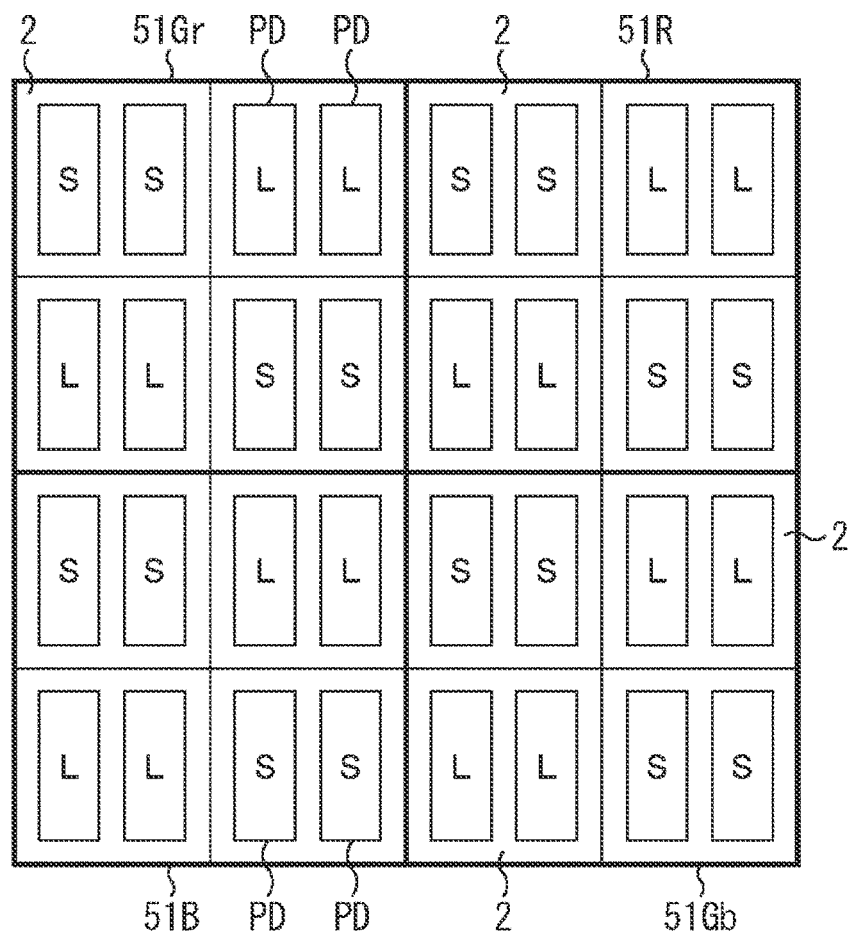
FIG. 9 is a diagram illustrating drive in a case where the solid-state imaging device operates in a first phase difference HDR mode.

Therefore, in the first phase difference HDR mode, the solid-state imaging device 1 sets two types of exposure times for the plurality of pixels 2 constituting the pixel array 3 as illustrated in FIG. 9.

FIG. 9 is a diagram illustrating the exposure times set for four (2×2) pixel sets 51 in a Bayer array that are a part of the pixel array 3 in the first phase difference HDR mode.

In the first phase difference HDR mode, one of a first exposure time and a second exposure time is set for each pixel. The second exposure time is an exposure time shorter than the first exposure time (first exposure time >second exposure time). In FIG. 9, "L" is written in photodiodes PD for which the first exposure time is set, and "S" is written in photodiodes PD for which the second exposure time is set.

As illustrated in FIG. 9, the first exposure time and the second exposure time are set with four pixels 2 constituting one pixel set 51 paired in diagonal directions. For example, as in the example of FIG. 9, the first exposure time (L) is set for the two upper right and lower left pixels of the four pixels constituting the pixel set 51, and the second exposure time (S) is set for the two lower right and upper left pixels.

Note that the arrangement of the pixels 2 for which the first exposure time (L) and the second exposure time (S) are set may be reversed.

Figure 10:
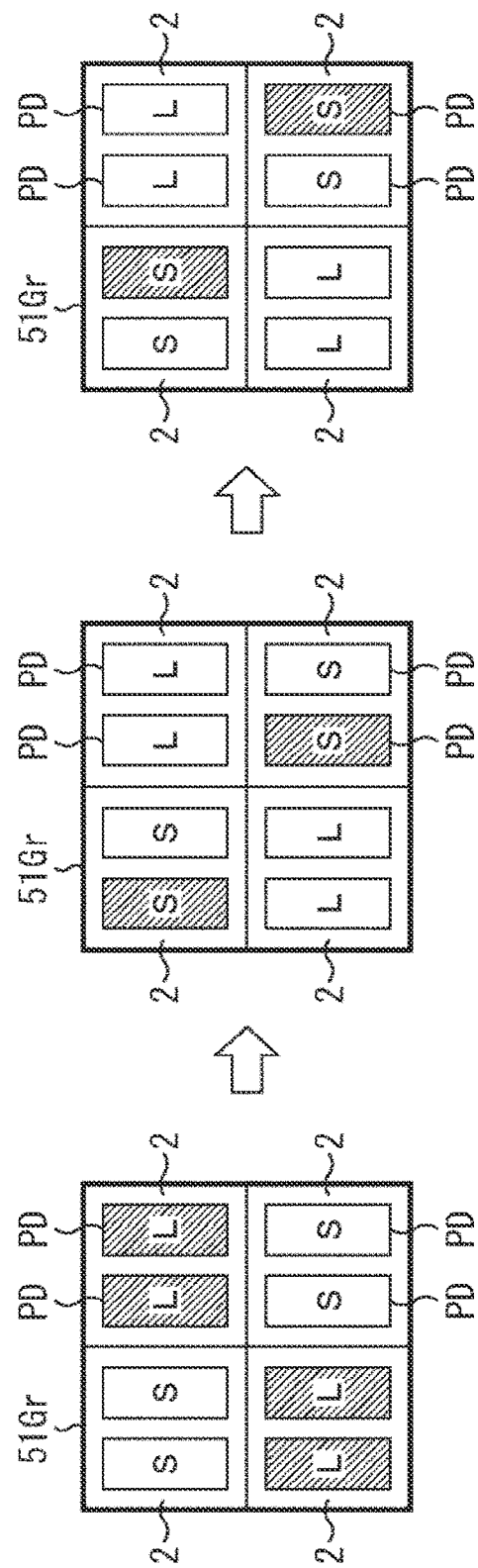
FIG. 10 is a diagram illustrating a procedure of reading pixel signals in the first phase difference HDR mode.

FIG. 10 is a diagram illustrating a procedure of reading pixel signals in the first phase difference HDR mode. Also in FIG. 10, a hatched photodiode PD represents a photodiode PD selected to output a pixel signal.

In the first phase difference HDR mode, as illustrated in FIG. 10, the solid-state imaging device 1 outputs pixel signals of all the photodiodes PD for the two pixels for which the first exposure time (L) is set, and outputs pixel signals of the left photodiodes PD and pixel signals of the right photodiodes PD separately for the two pixels for which the second exposure time (S) is set.

Specifically, the solid-state imaging device 1 simultaneously outputs pixel signals of a plurality of photodiodes PD in the order of pixel signals of all the photodiodes PD of the two upper right and lower left pixels 2, pixel signals of the left photodiodes PD of the upper left and lower right pixels 2, and pixel signals of the upper left and lower right right photodiodes PD.

Consequently, the two pixels 2 whose exposure time is set to the second exposure time (S) output pixel signals of the left photodiode PD and the right photodiode PD separately, so that a phase difference can be detected. Furthermore, since the pixels 2 for which the first exposure time (L) is set and the pixels 2 for which the second exposure time (S) is set are included, an HDR image can be generated.

Note that the pixels 2 that detect a phase difference may be the pixels 2 whose exposure time is set to the first exposure time (L). However, if light intensity is high, the pixels 2 may be saturated. It is thus preferable that the pixels 2 that detect a phase difference are the pixels 2 for which the second exposure time (S) is set. By using the pixels 2 for which the second exposure time (S) is set as phase difference detection pixels, phase difference information can be acquired without causing saturation.

As described above, in the first phase difference HDR mode, for each pixel set 51, two types of exposure times, the first exposure time (L) and the second exposure time (S), are set, and in some of the pixels 2 of the pixel set 51, specifically, the pixels 2 for which the second exposure time (S) is set, pixel signals of the left and right photodiodes PD are separately output to detect a phase difference, so that signals for phase difference detection and signals of an HDR image with a high dynamic range can be simultaneously acquired.

<5.5 Second Phase Difference HDR Mode>

Next, a second phase difference HDR mode will be described.

Like the first phase difference HDR mode, the second phase difference HDR mode is an output mode that enables phase difference detection and HDR image generation. The second phase difference HDR mode differs from the first phase difference HDR mode in that exposure times set for the pixels 2 in the pixel array 3 are not of the two types in the first phase difference HDR mode but of three types.

Figure 11:
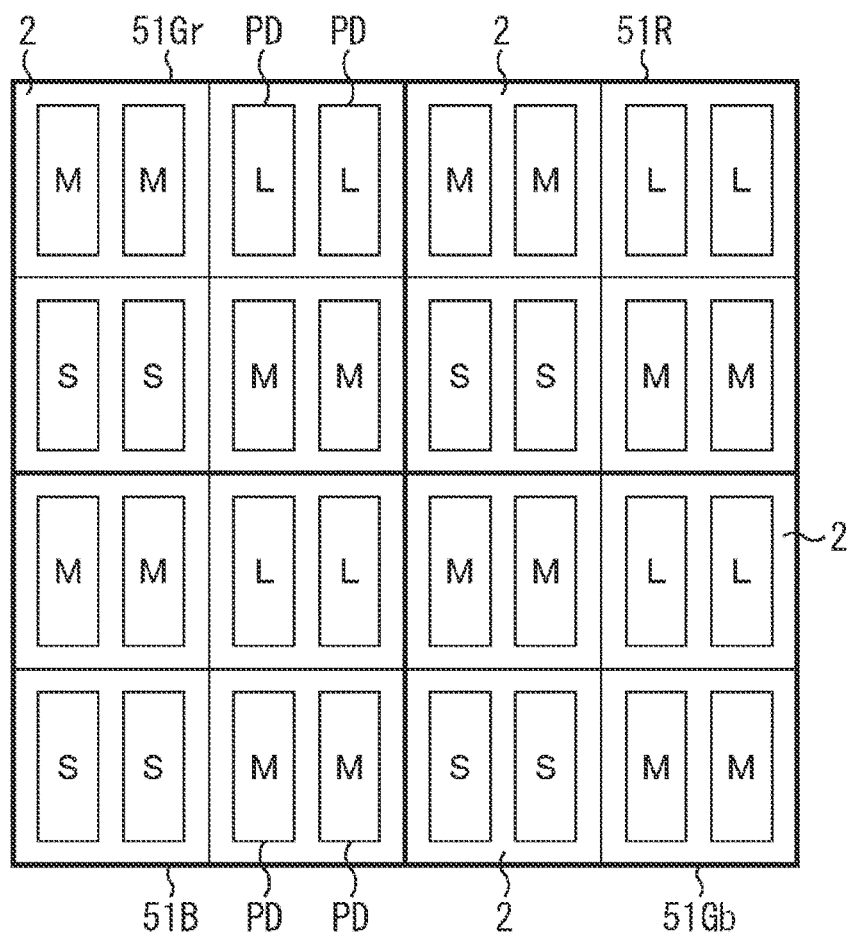
FIG. 11 is a diagram illustrating drive in a case where the solid-state imaging device operates in a second phase difference HDR mode.

FIG. 11 is a diagram illustrating exposure times set for four (2×2) pixel sets 51 in a Bayer array that are a part of the pixel array 3 in the second phase difference HDR mode.

In the second phase difference HDR mode, one of first to third exposure times is set for each pixel. The second exposure time is an exposure time shorter than the first exposure time, and the third exposure time is an exposure time even shorter than the second exposure time (first exposure time >second exposure time >third exposure time). In FIG. 11, "L" is written in photodiodes PD for which the first exposure time is set, "M" is written in photodiodes PD for which the second exposure time is set, and "S" is written in photodiodes PD for which the third exposure time is set. Of the first exposure time (L), the second exposure time (M), and the third exposure time (S), the second exposure time (M) in the middle is an exposure time suitable for proper exposure at the time of automatic exposure.

As illustrated in FIG. 11, the second exposure time (M) is set for two pixels in a predetermined diagonal direction of four pixels 2 constituting one pixel set 51, the first exposure time (L) is set for one of two pixels in the other diagonal direction, and the third exposure time (S) is set for the other. Note that the diagonal direction in which the second exposure time (M) is set may be a diagonally right direction instead of a diagonally left direction in FIG. 11. Furthermore, the arrangement of the pixels 2 for which the first exposure time (L) and the third exposure time (S) are set may be reversed.

Figure 12:
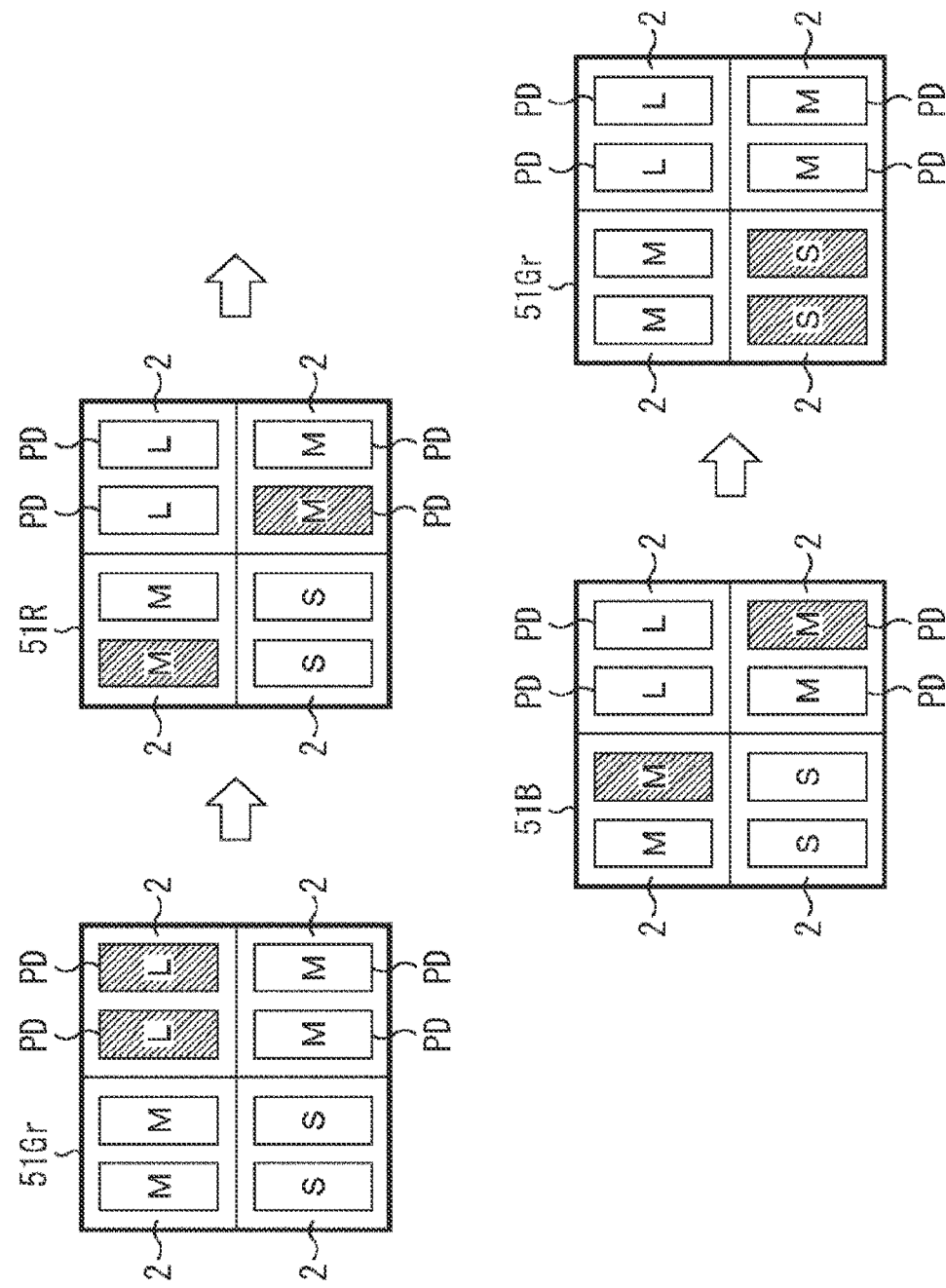
FIG. 12 is a diagram illustrating a procedure of reading pixel signals in the second phase difference HDR mode.

FIG. 12 is a diagram illustrating a procedure of reading pixel signals in the second phase difference HDR mode. Also in FIG. 12, a hatched photodiode PD represents a photodiode PD selected to output a pixel signal.

In the second phase difference HDR mode, as illustrated in FIG. 12, the solid-state imaging device 1 outputs a pixel signal of the left photodiode PD and a pixel signal of the right photodiode PD separately for the two pixels for which the second exposure time (M) is set, and outputs a pixel signal of the photodiodes PD in each pixel as a unit for the two pixels for which the first exposure time (L) and the third exposure time (S) are set.

Specifically, the solid-state imaging device 1 simultaneously outputs pixel signals of a plurality of photodiodes PD in the order of pixel signals of the two photodiodes PD of the upper right pixel 2, pixel signals of the left photodiodes PD of the upper left and lower right pixels 2, pixel signals of the right photodiodes PD of the upper left and lower right pixels 2, and pixel signals of the two photodiodes PD of the lower left pixel 2.

Consequently, the two pixels 2 whose exposure time is set to the second exposure time (M) output pixel signals of the left photodiode PD and the right photodiode PD separately, so that a phase difference can be detected. Furthermore, since the pixels 2 for which the different exposure times are set are included, an HDR image can be generated.

Note that the pixels 2 that detect a phase difference may be the pixels 2 whose exposure time is set to the first exposure time (L) or the third exposure time (S). However, if light intensity is high, the pixels 2 may be saturated, and if light intensity is low, the signal level may be too low. It is thus preferable to use the pixels 2 for which the second exposure time (M) for proper exposure is set. By using the pixels 2 for which the second exposure time (M) is set as phase difference detection pixels, phase difference information can be acquired without causing saturation.

As described above, in the second phase difference HDR mode, for each pixel set 51, three types of exposure times, the first exposure time (L), the second exposure time (M), and the third exposure time (S), are set, and in some of the pixels 2 of each pixel set 51, specifically, the pixels 2 for which the second exposure time (M) is set, pixel signals of the left and right photodiodes PD are separately output to detect a phase difference, so that signals for phase difference detection and signals of an HDR image with a high dynamic range can be simultaneously acquired.

Note that in order to enable operation in both the first phase difference HDR mode and the second phase difference HDR mode, the eight signal lines 61-1 to 61-8 or 62-1 to 62-8 as illustrated in FIG. 5 are required for the pixel sets 51 arranged in the horizontal direction. However, in a case where it is only required to enable operation in only one of the first phase difference HDR mode and the second phase difference HDR mode, the number of signal lines for each pixel set 51 arranged in the horizontal direction can be reduced.

Figure 13:
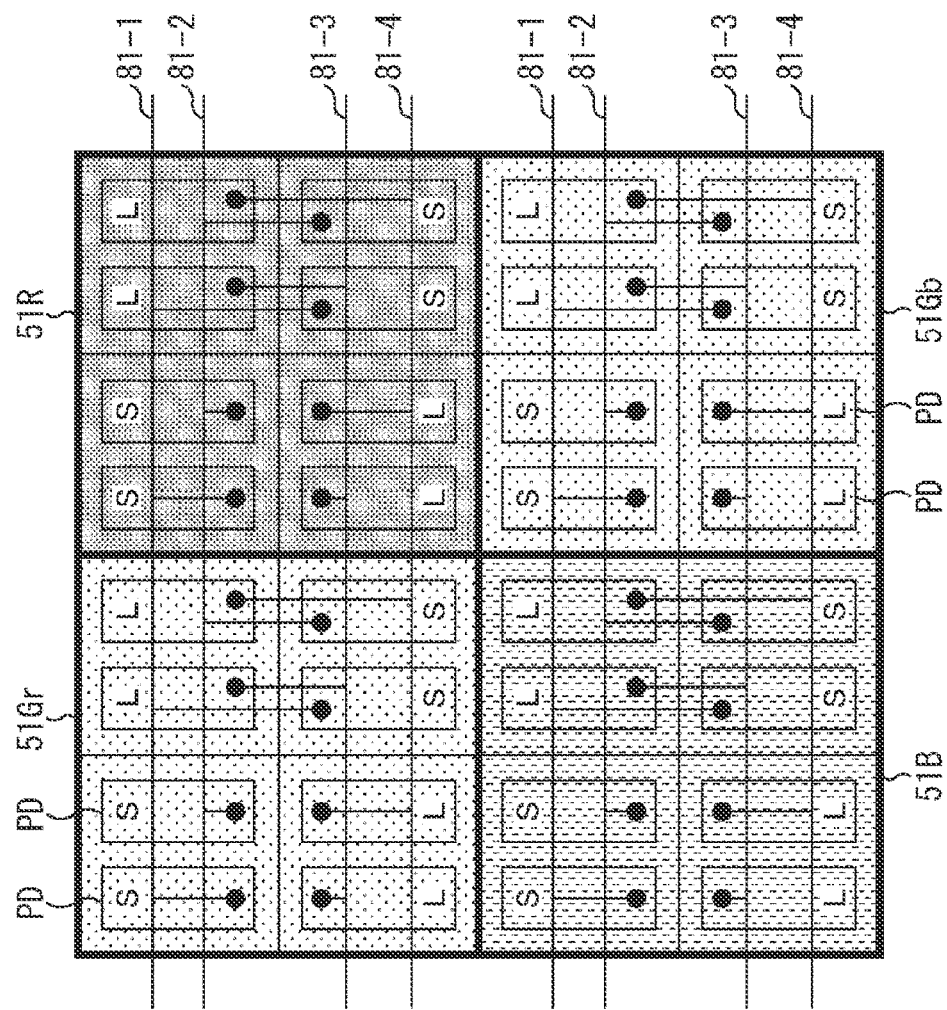
FIG. 13 is a diagram illustrating a wiring example of signal lines specialized for the first phase difference HDR mode.

For example, FIG. 13 illustrates a wiring example of signal lines in a case where operation in only the first phase difference HDR mode is enabled as an output mode that enables phase difference detection and HDR image generation.

In FIG. 13, by disposing four signal lines 81-1 to 81-4 for the pixel sets 51 arranged in the horizontal direction, operation in the first phase difference HDR mode becomes possible.

Specifically, the single signal line 81-1 is disposed to control pixel signals of the left photodiodes PD of the pixels 2 paired in the diagonal direction for which an exposure time of the second exposure time (S) is set, and the single signal line 81-2 is disposed to control pixel signals of the right photodiodes PD. Furthermore, the single signal line 81-3 is disposed to control pixel signals of the left photodiodes PD of the pixels 2 paired in the diagonal direction for which an exposure time of the first exposure time (L) is set, and the single signal line 81-4 is disposed to control pixel signals of the right photodiodes PD side.

Figure 14:
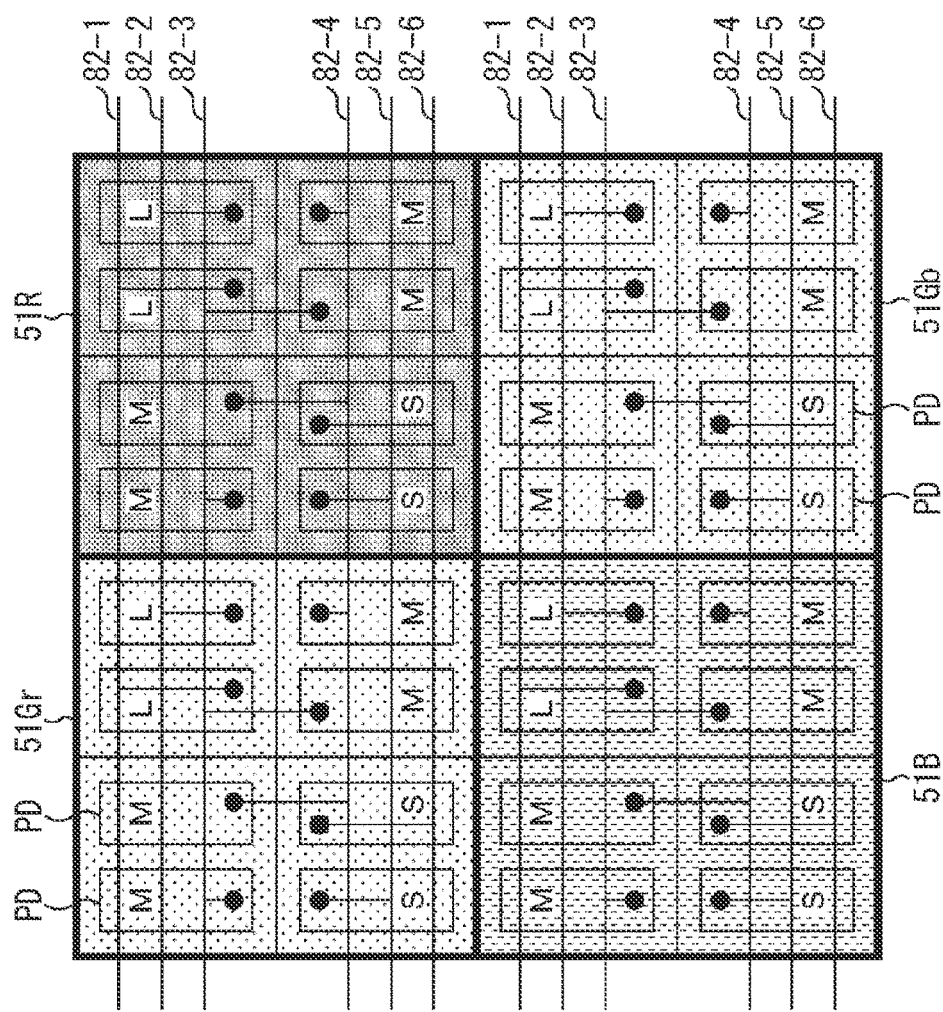
FIG. 14 is a diagram illustrating a wiring example of signal lines specialized for the second phase difference HDR mode.

FIG. 14 illustrates a wiring example of signal lines in a case where operation in only the second phase difference HDR mode is enabled as an output mode that enables phase difference detection and HDR image generation.

In FIG. 14, by disposing six signal lines 82-1 to 82-6 for the pixel sets 51 arranged in the horizontal direction, operation in the second phase difference HDR mode becomes possible.

Specifically, the single signal line 82-1 is disposed to control pixel signals of the left photodiodes PD of the pixels 2 for which an exposure time of the first exposure time (L) is set, and the single signal line 82-2 is disposed to control pixel signals of the right photodiodes PD. Furthermore, the single signal line 82-3 is disposed to control pixel signals of the left photodiodes PD of the pixels 2 paired in the diagonal direction for which an exposure time of the second exposure time (M) is set, and the single signal line 82-4 is disposed to control pixel signals of the right photodiodes PD. The single signal line 82-5 is disposed to control pixel signals of the left photodiodes PD of the pixels 2 for which an exposure time of the third exposure time (S) is set, and the single signal line 82-6 is disposed to control pixel signals of the right photodiodes PD.

As described above, the solid-state imaging device 1 can execute, as an output mode, the full-resolution mode in which pixel signals of the photodiodes PD of each pixel 2 are output individually, the four-pixel addition phase-difference detection mode in which pixel signals of the left photodiodes PD or the right photodiodes PD are added and output in units of four pixels, the four-pixel addition mode in which pixel signals of all the photodiodes PD in the pixel set 51 are added and output, and the first phase difference HDR mode and the second phase difference HDR mode that enable phase difference detection and HDR image generation.

The full-resolution mode enables phase difference detection in all the pixels and high-resolution output by re-mosaicing, and the four-pixel addition phase-difference detection mode enables phase difference detection in the entire surface and high S/N and high dynamic range signal output by four-pixel addition. Furthermore, the four-pixel addition mode enables high S/N and high dynamic range signal output by four-pixel addition, and the first phase difference HDR mode and the second phase difference HDR mode enable both HDR image generation and phase difference detection in the entire surface. Note that to achieve HDR, two or more exposure times may be set for pixels with a single sensitivity as described above, or a single exposure time may be set for a plurality of pixels with different sensitivities formed as a pixel set. An example of a plurality of pixels with different sensitivities includes a pixel including photodiodes with a large light receiving area as a pixel with a high sensitivity, and a pixel including photodiodes with a small light receiving area as a pixel with a low sensitivity.

Note that, of course, the solid-state imaging device 1 may further be able to execute output modes other than those described above.

<6. Modification of Color Array of Color Filters>

Figure 15:
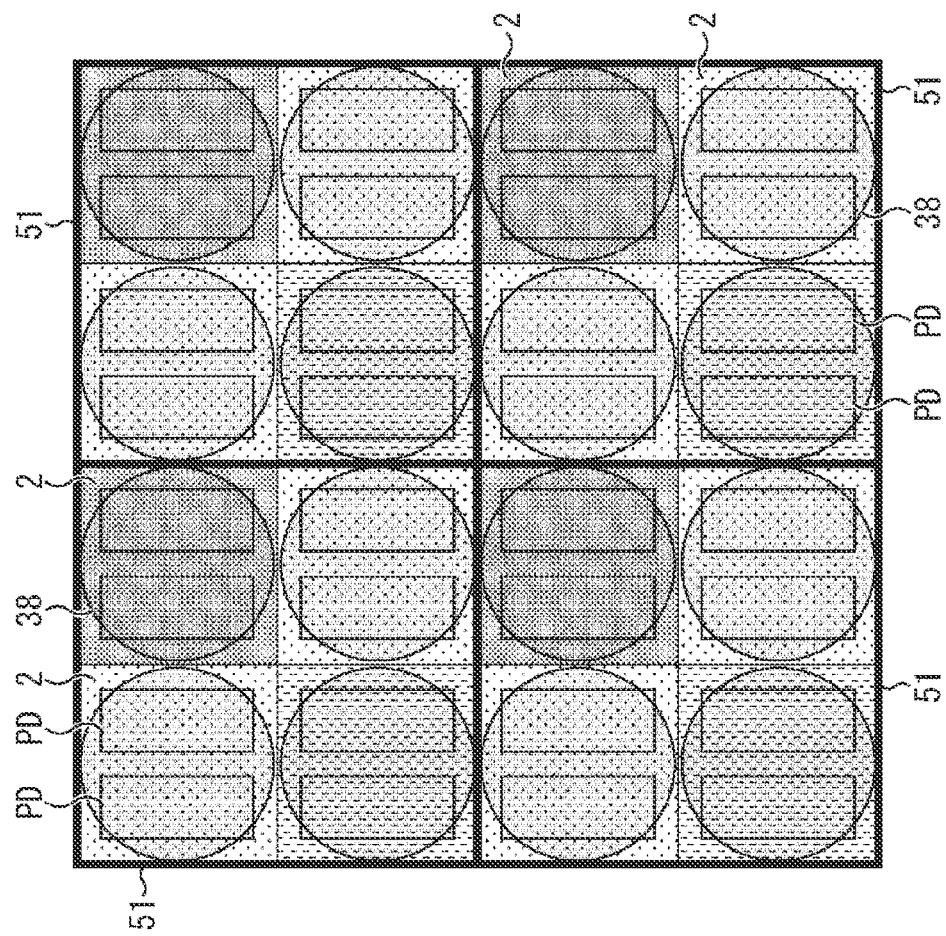
FIG. 15 is a diagram illustrating a modification of the color array of the color filters.

FIG. 15 illustrates a modification of the color array of the color filters.

In the above-described example, as illustrated in FIG. 3 and others, the R, G, and B color filters 37 are arranged in the Bayer array in units of the pixel sets 51.

In contrast, in FIG. 15, the R, G, and B color filters 37 are arranged in a Bayer array in units of the pixels 2.

Thus, the color filters 37 may be arranged in a Bayer array in units of pixels.

The sharing unit of pixel circuits sharing the reset transistor 53, the amplification transistor 54, and the selection transistor 55 may be four pixels in 2×2 (two vertical pixels× two horizontal pixels) as in FIG. 4, or may be four pixels in 4×1 (four vertical pixels×one horizontal pixel). The color array of the color filters 37 in the Bayer array in units of pixels as illustrated in FIG. 15 allows pixel signals of pixels of the same color to be added if four pixels in 4×1 are set as a sharing unit.

<7. Modification of Orientations of Photodiodes>

Figure 16:
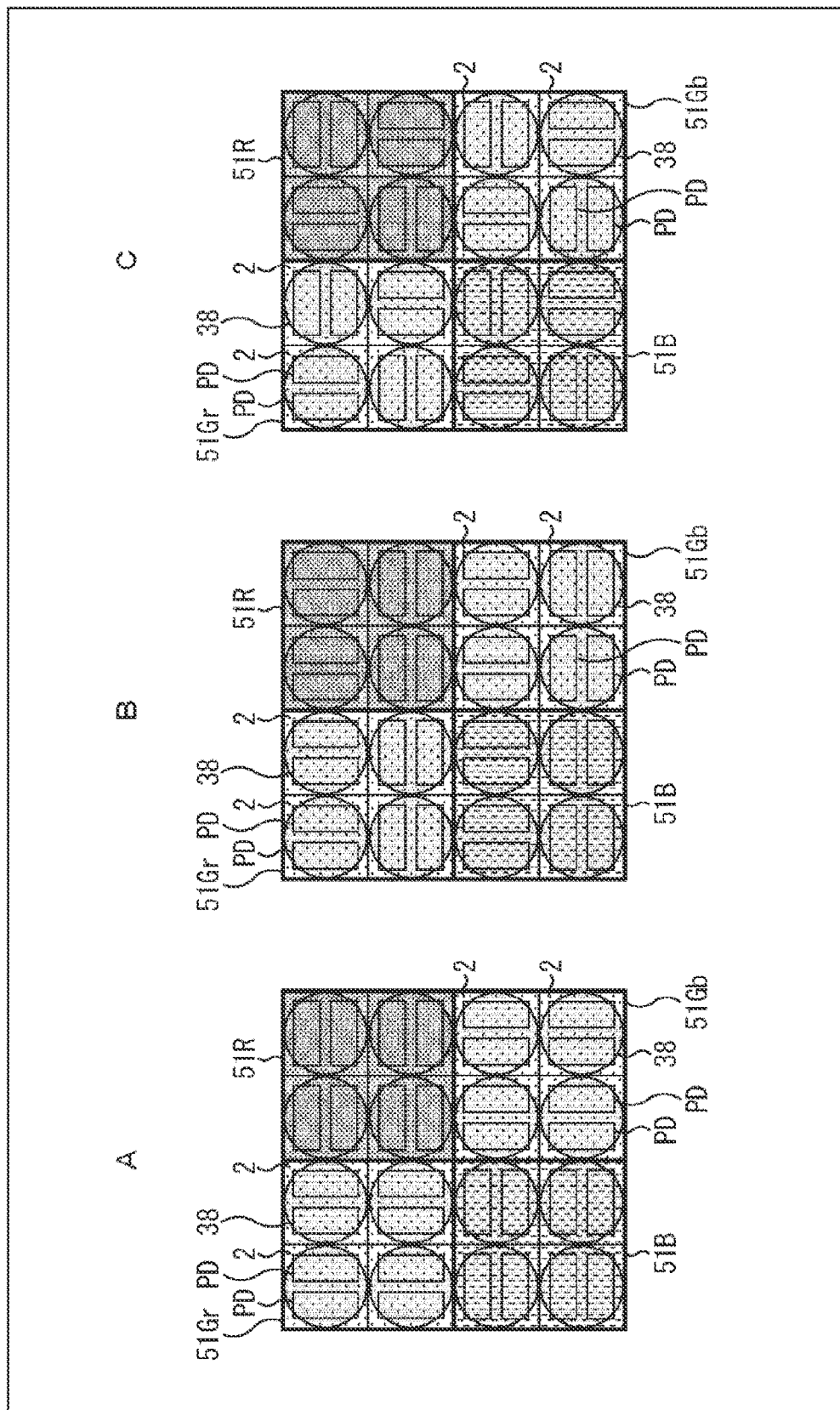
FIG. 16 is a diagram illustrating a modification of orientations of photodiodes PD.

FIG. 16 illustrates a modification of the orientations of the photodiodes PD.

In the above-described example, as illustrated in FIG. 3, the pairs of photodiodes PD in the pixels 2 are formed such that the orientations of their longitudinal shape are the same direction in each pixel set 51, and are also the same direction in all the pixel sets 51.

However, the orientations of the longitudinal shape of the pairs of photodiodes PD in the pixels may be different from pixel to pixel or from pixel set to pixel set.

A of FIG. 16 illustrates an example in which the pairs of photodiodes PD in the pixels 2 are formed such that the orientations of their longitudinal shape are the same direction in each pixel set 51, but are different from pixel set 51 to pixel set 51.

In A of FIG. 16, the orientations of the longitudinal shape of the pairs of photodiodes PD in the pixel set 51Gr and the pixel set 51Gb including the G color filters 37 are the left-right direction (horizontal direction), and the orientations of the longitudinal shape of the pairs of photodiodes PD in the pixel set 51R including the R color filters 37 and the pixel set 51B including the B color filters 37 are the up-and-down direction (vertical direction). In other words, the photodiodes PD are formed such that the orientations of the longitudinal shape of the pairs of photodiodes PD in the pixels are at right angles between the pixel set 51Gr and the pixel set 51Gb, and the pixel set 51R and the pixel set 51B.

The orientations of the longitudinal shape of the photodiodes PD in the pixel sets 51 including the color filters 37 of the same color are the same.

B of FIG. 16 illustrates an example in which in each pixel set 51 including the color filters 37 of the same color, pairs of photodiodes PD in two pixels arranged in the horizontal direction are formed such that the orientations of their longitudinal shape are the same direction, and pairs of photodiodes PD in two pixels arranged in the vertical direction are formed such that the orientations of their longitudinal shape are orthogonal directions.

In B of FIG. 16, in each pixel set 51, the photodiodes PD are formed such that the orientations of the longitudinal shape of the pairs of photodiodes PD in the two upper pixels are the left-right direction (horizontal direction), and the orientations of the longitudinal shape of the pairs of photodiodes PD in the two lower pixels are the up-and-down direction (vertical direction).

C of FIG. 16 illustrates an example in which in each pixel set 51 including the color filters 37 of the same color, pairs of photodiodes PD in two pixels PD arranged in the horizontal direction are formed such that the orientations of their longitudinal shape are orthogonal directions, and pairs of photodiodes PD in two pixels PD arranged in the vertical direction are formed such that the orientations of their longitudinal shape are also orthogonal directions.

In C of FIG. 16, in each pixel set 51, the photodiodes PD are formed such that the orientations of the longitudinal shape of the pairs of photodiodes PD in the two upper pixels are the left-right direction (horizontal direction) and the up-and-down direction (vertical direction), and the orientations of the longitudinal shape of the pairs of photodiodes PD in the two lower pixels are also the left-right direction (horizontal direction) and the up-and-down direction (vertical direction).

As above, the two photodiodes PD of the longitudinal shape formed in each pixel are arranged symmetrically in the vertical direction or the horizontal direction, and for their orientations in the pixels in the pixel set 51, either the same direction or orthogonal directions can be used.

<8. Modification of On-Chip Lens Arrangement>

Figure 17:
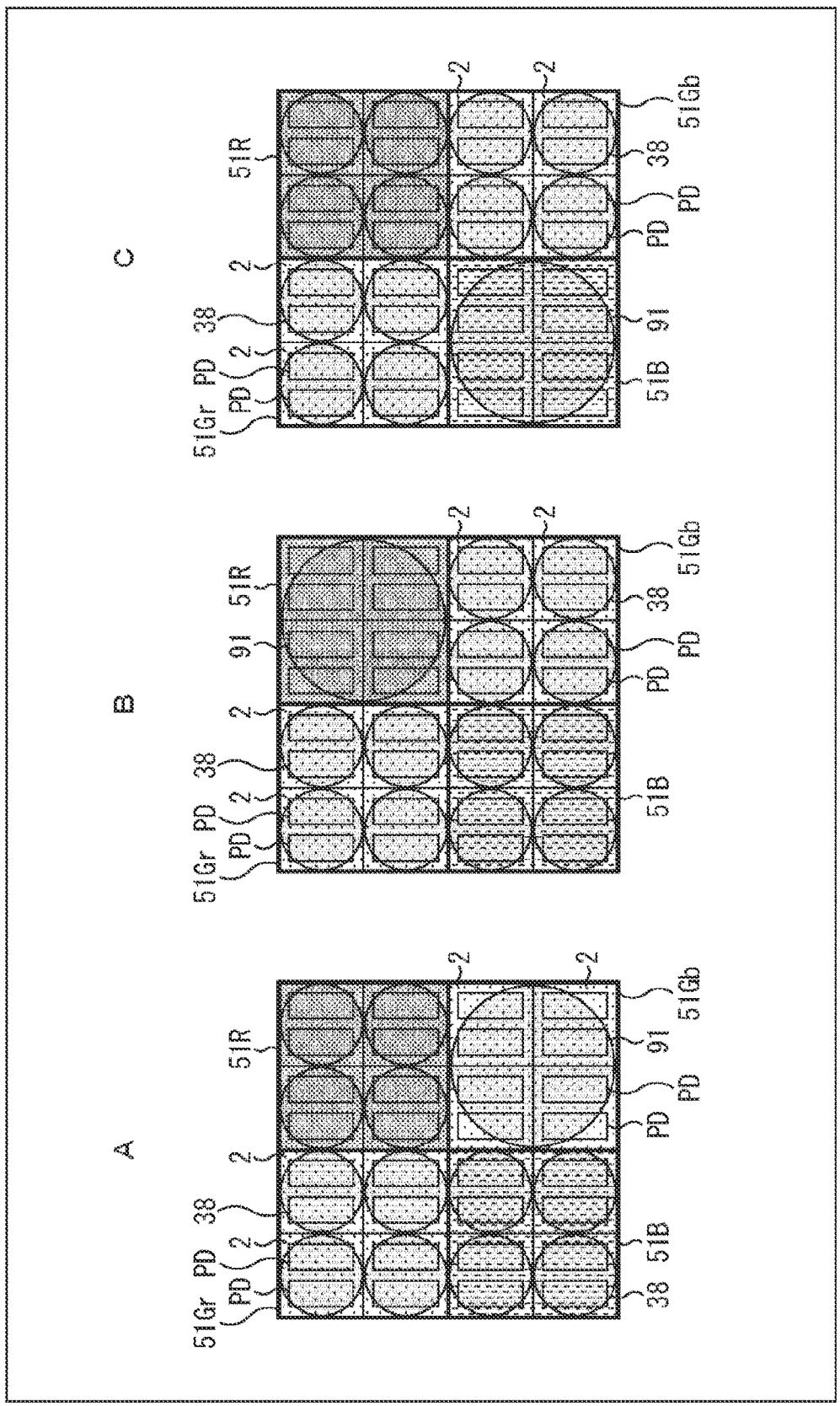
FIG. 17 is a diagram illustrating a modification of arrangement of on-chip lenses.

FIG. 17 illustrates a modification of the arrangement of the on-chip lenses 38.

In the above-described example, as illustrated in FIG. 3, the on-chip lenses 38 are formed for individual pixels.

However, as illustrated in FIG. 17, for some of the plurality of pixel sets 51 constituting the pixel array 3, one on-chip lens 91 may be disposed for one pixel set 51.

A of FIG. 17 illustrates an example in which one on-chip lens 91 is disposed for the pixel set 51Gb including the G color filters 37, and the on-chip lenses 38 for individual pixels are disposed for the other pixel sets 51Gr, 51R, and 51B.

B of FIG. 17 illustrates an example in which one on-chip lens 91 is disposed for the pixel set 51R including the R color filters 37, and the on-chip lenses 38 for individual pixels are disposed for the other pixel sets 51Gr, 51Gb, and 51B.

C of FIG. 17 illustrates an example in which one on-chip lens 91 is disposed for the pixel set 51B including the B color filters 37, and the on-chip lenses 38 for individual pixels are disposed for the other pixel sets 51Gr, 51R, and 51Gb.

In the pixel array 3 in which the pixel sets 51 are two-dimensionally arranged, the on-chip lenses 91 in A to C of FIG. 17 may be disposed at regular intervals or randomly.

The pixel set 51 with the on-chip lens 91 cannot acquire pixel signals for generating an HDR image, but can detect a phase difference with pixel signals in each pixel, and thus is effective for phase difference detection in low illumination.

<9. Second Cross-Sectional Configuration Example of Pixels>

Figure 18:
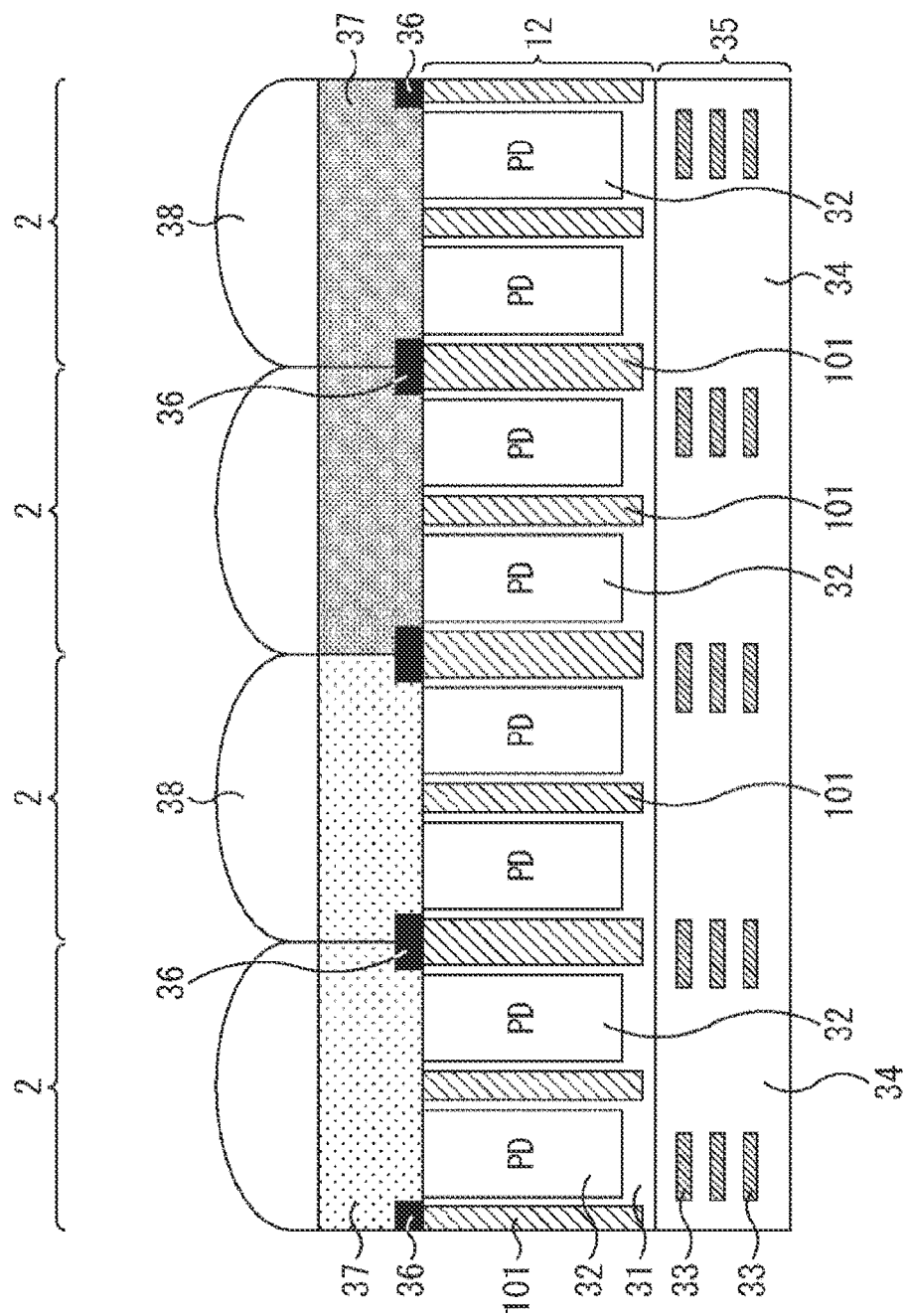
FIG. 18 is a diagram illustrating a second cross-sectional configuration example of the pixel array of the solid-state imaging device in FIG. 1.

FIG. 18 is a diagram illustrating a second cross-sectional configuration example of the pixel array 3 of the solid-state imaging device 1 in FIG. 1.

In FIG. 18, parts corresponding to those in the first cross-sectional configuration example illustrated in FIG. 2 are denoted by the same reference numerals, and description of the parts will be omitted as appropriate.

The second cross-sectional configuration example of FIG. 18 differs from the first cross-sectional configuration example illustrated in FIG. 2 in that an insulating layer 101 is formed in the semiconductor substrate 12.

Specifically, in the first cross-sectional configuration example illustrated in FIG. 2, only the P-type semiconductor region 31 and the N-type semiconductor regions 32 are formed in the semiconductor substrate 12. In the second cross-sectional configuration example in FIG. 18, the insulating layer 101 is further formed at pixel boundaries between adjacent pixels and between the two photodiodes PD in each pixel. The insulating layer 101 is formed, for example, by a deep trench isolation (DTI) in which an oxide film (e.g., a TEOS film) is formed on the inner peripheral surface of deep grooves (trenches) dug from the back side of the semiconductor substrate 12, and the inside thereof is filled with polysilicon. Note that the insulating layer 101 is not limited to the configuration using the oxide film and polysilicon, and may be of a configuration using a metal such as hafnium or a configuration using an impurity layer. Furthermore, the insulating layer 101 of different configurations may be applied in different pixels. For example, in an R pixel that transmits relatively long wavelengths, an impurity layer may be applied as the insulating layer 101, and in a B pixel and a G pixel, an oxide film, polysilicon, or a metal may be applied as the insulating layer 101. Furthermore, the insulating layer 101 may be a shallow trench isolation (STI) shallower than DTI, or may be a full trench isolation (FTI) that completely separates pixels from each other.

Figure 19:
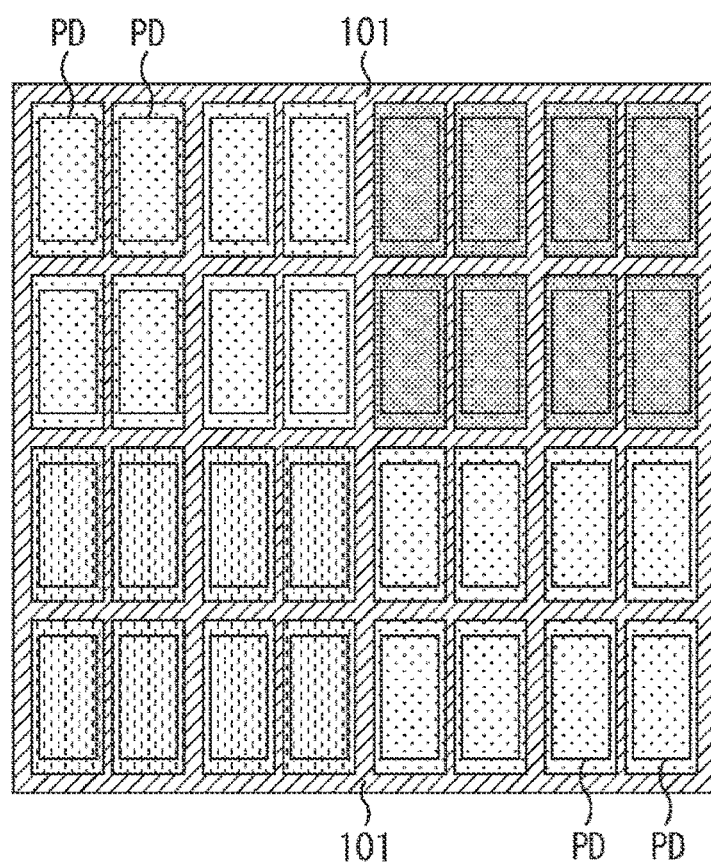
FIG. 19 is a plan view illustrating regions where an insulating layer in FIG. 18 is formed.

FIG. 19 is a plan view illustrating regions where the insulating layer 101 is formed in a range of 16 pixels in 4×4.

As can be seen from the plan view of FIG. 19, the insulating layer 101 is formed at the boundaries of the pixels 2 and between the two photodiodes PD in each pixel, and the two photodiodes PD are separated from each other by the insulating layer 101.

<10. Third Cross-Sectional Configuration Example of Pixels>

Figure 20:
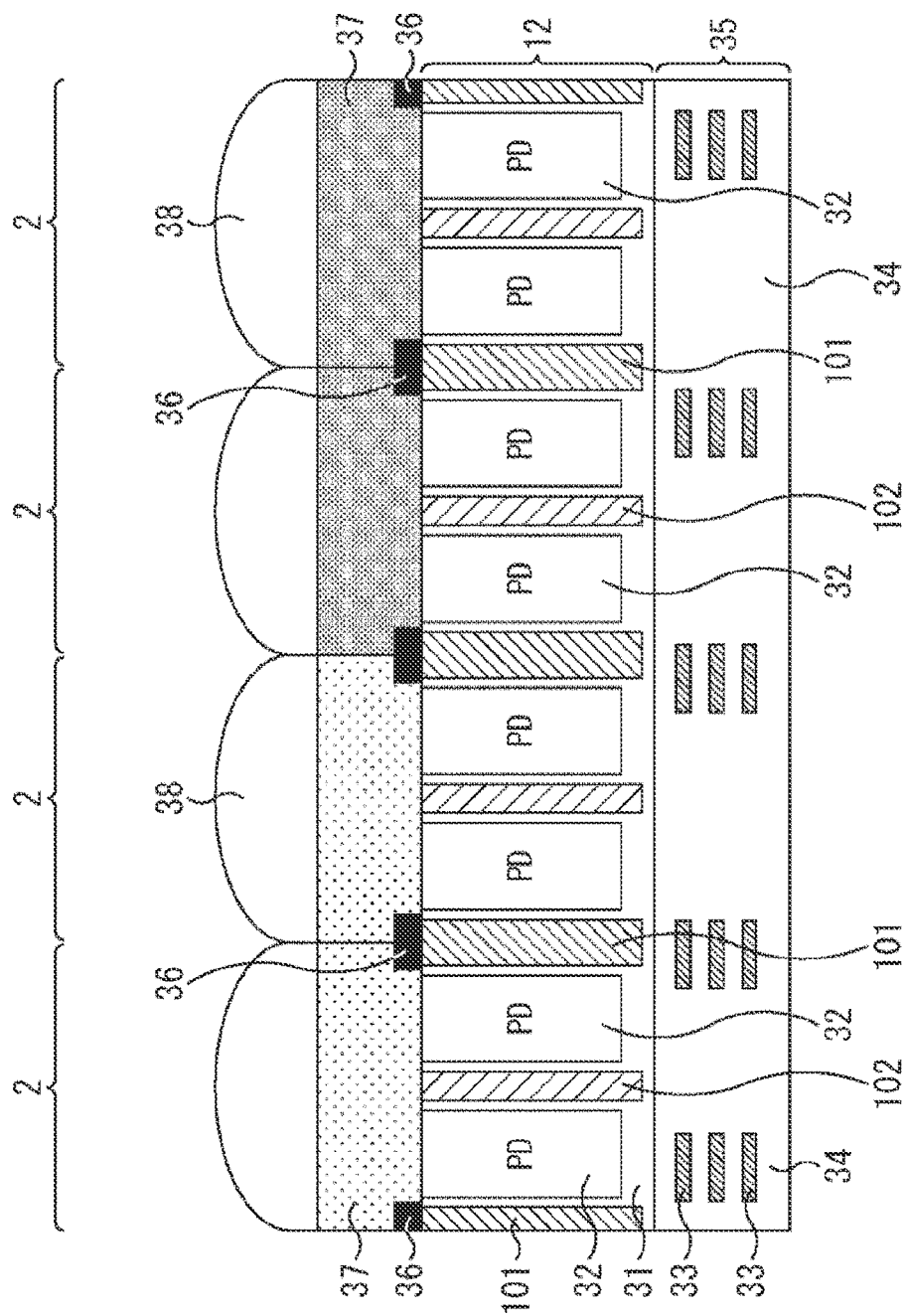
FIG. 20 is a diagram illustrating a third cross-sectional configuration example of the pixel array of the solid-state imaging device in FIG. 1.

FIG. 20 is a diagram illustrating a third cross-sectional configuration example of the pixel array 3 of the solid-state imaging device 1 in FIG. 1.

In FIG. 20, parts corresponding to those in the second cross-sectional configuration example illustrated in FIG. 18 are denoted by the same reference numerals, and description of the parts will be omitted as appropriate.

In the second cross-sectional configuration example of FIG. 18, the insulating layer 101 is formed at the boundaries of the pixels 2 and between the two photodiodes PD in each pixel.

In the third cross-sectional configuration example of FIG. 20, at the boundaries of the pixels 2, the insulating layer 101 is formed as in the second cross-sectional configuration example, but between the two photodiodes PD in each pixel, an impurity layer 102 of a conductivity type opposite to that of the N-type semiconductor regions 32, that is, P-type is formed. The impurity concentration of the P-type impurity layer 102 is higher than that of the semiconductor region 31. The impurity layer 102 can be formed, for example, by ion implantation from the back side of the semiconductor substrate 12.

Figure 21:
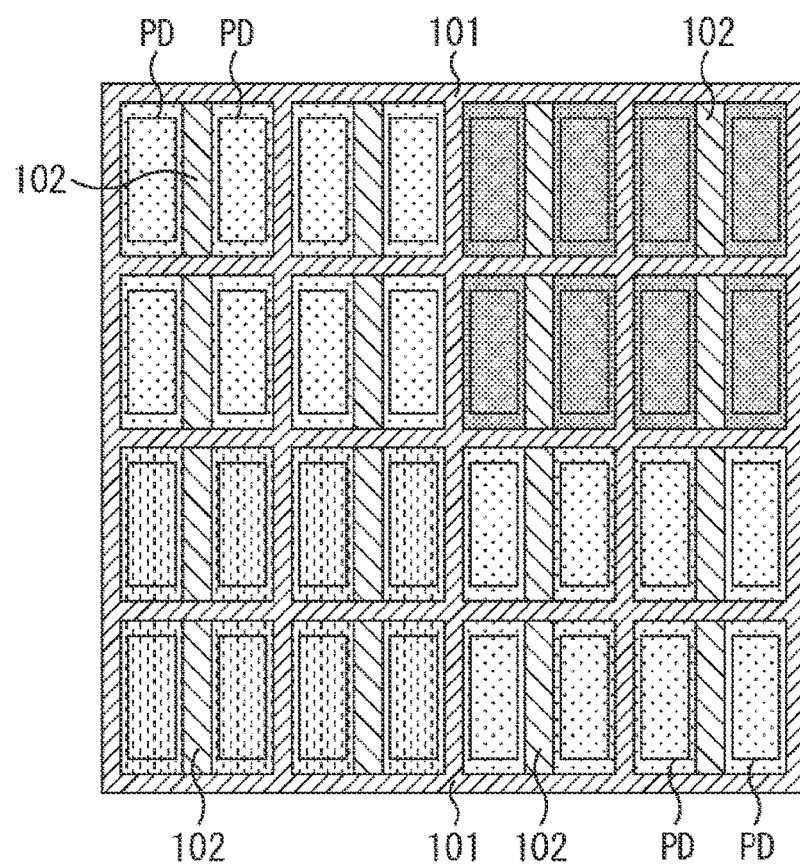
FIG. 21 is a plan view illustrating regions where an insulating layer and an impurity layer in FIG. 18 are formed.

FIG. 21 is a plan view illustrating regions where the insulating layer 101 and the impurity layer 102 are formed in a range of 16 pixels in 4×4.

As can be seen from the plan view of FIG. 21, the insulating layer 101 is formed at the boundaries of the pixels 2, and the impurity layer 102 separates the two photodiodes PD in each pixel from each other.

Figure 22:
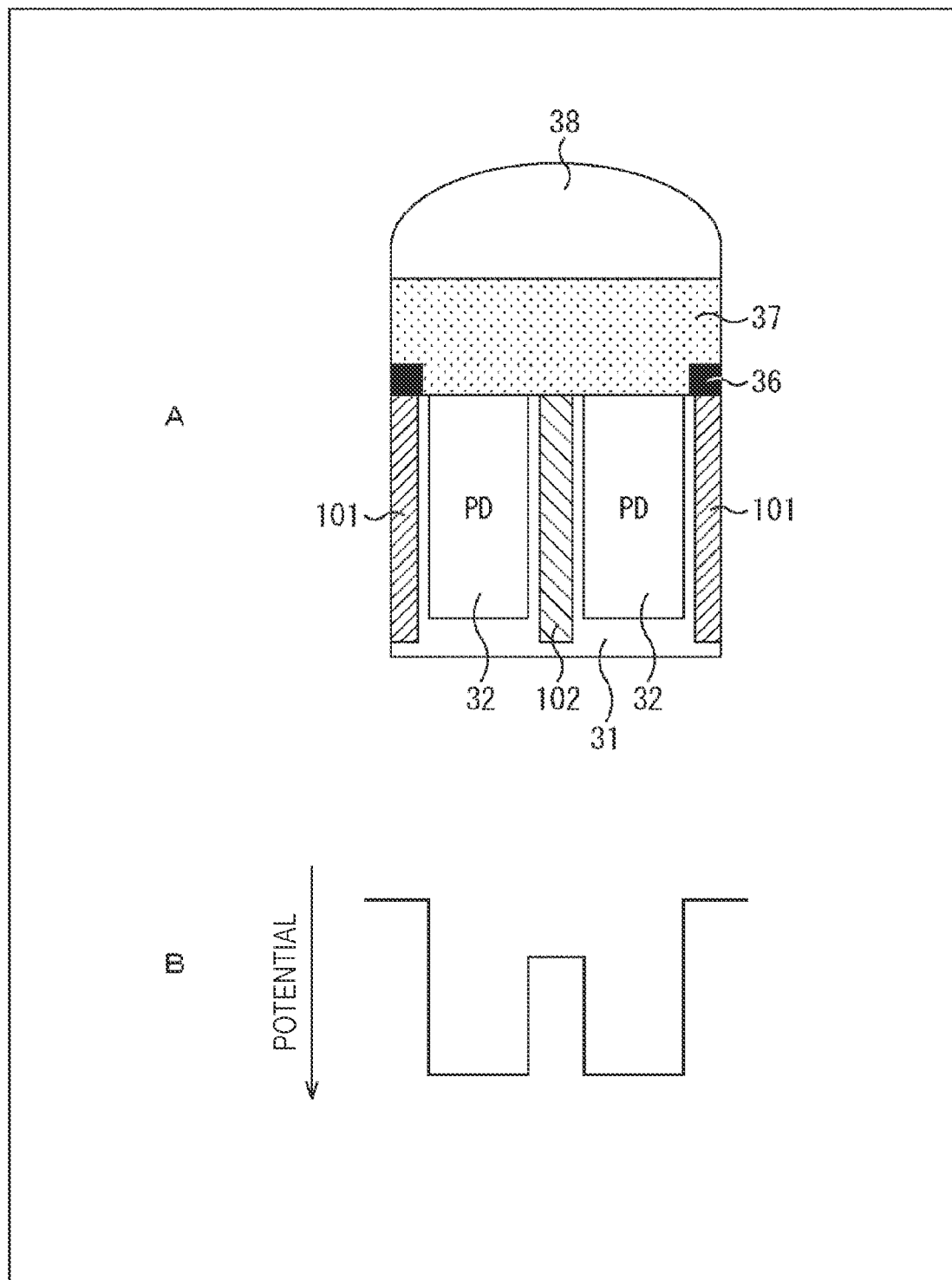
FIG. 22 is a diagram illustrating the potential of the impurity layer in FIG. 21.

The potential barrier between the two photodiodes PD in each pixel may be the same as the potential barrier at the pixel boundaries, or may be made lower than the potential barrier at the pixel boundaries as illustrated in B of FIG. 22.

A of FIG. 22 is a cross-sectional structural diagram of one pixel in the third cross-sectional configuration example, and B of FIG. 22 is a potential diagram corresponding to A of FIG. 22.

As illustrated in B of FIG. 22, by making the potential barrier between the two photodiodes PD lower than that at the pixel boundaries, when charges accumulated in one photodiode PD have reached a saturation level, they flow into the other photodiode PD before overflowing into the FD 52. Thus, the linearity of a pixel signal of one pixel obtained by combining the left and right photodiodes PD can be improved.

The height of the potential barrier between the photodiodes PD can be made lower than the potential barrier at the pixel boundaries by adjusting the impurity concentration in the impurity layer 102.

Figure 23:
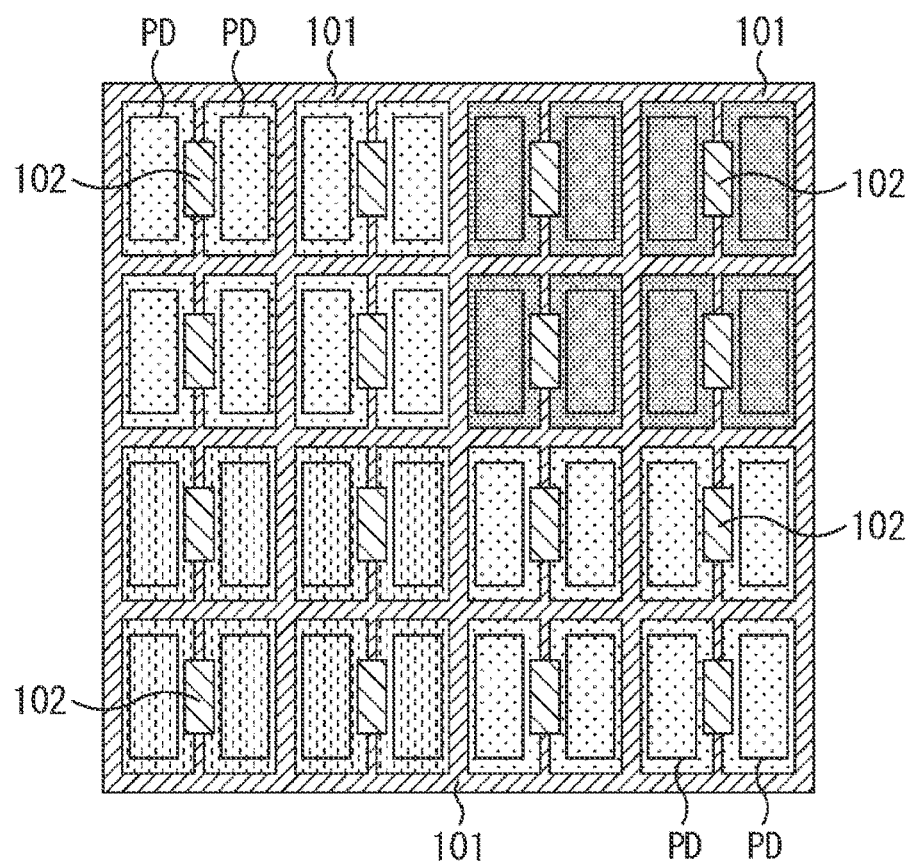
FIG. 23 is a diagram illustrating a modification of the third cross-sectional configuration example in FIG.

Note that the impurity layer 102 may be formed so as to completely isolate a region sandwiched between the two photodiodes PD as illustrated in FIG. 21, or may be formed so as to isolate only a part of the region sandwiched between the two photodiodes PD as illustrated in FIG. 23. In FIG. 23, the impurity layer 102 is formed only in a part in and around the pixel center of the region sandwiched between the two photodiodes PD.

A cross-sectional view of parts where the impurity layer 102 is formed in FIG. 23 is the same as that in FIG. 20, and a cross-sectional view of parts where the impurity layer 102 is not formed in FIG. 23 is the same as that in FIG. 18.

<11. Configuration Example in which Light-Shielding Film is Added>

In the above-described example, the inter-pixel light-shielding film 36 that prevent light from entering adjacent pixels are formed at pixel boundary portions, but no light-shielding film is formed on the photodiodes PD.

However, for some of the pixels 2 in the pixel array 3, a configuration in which a light-shielding film is disposed on two photodiodes PD in a pixel may be adopted.

Figure 24:
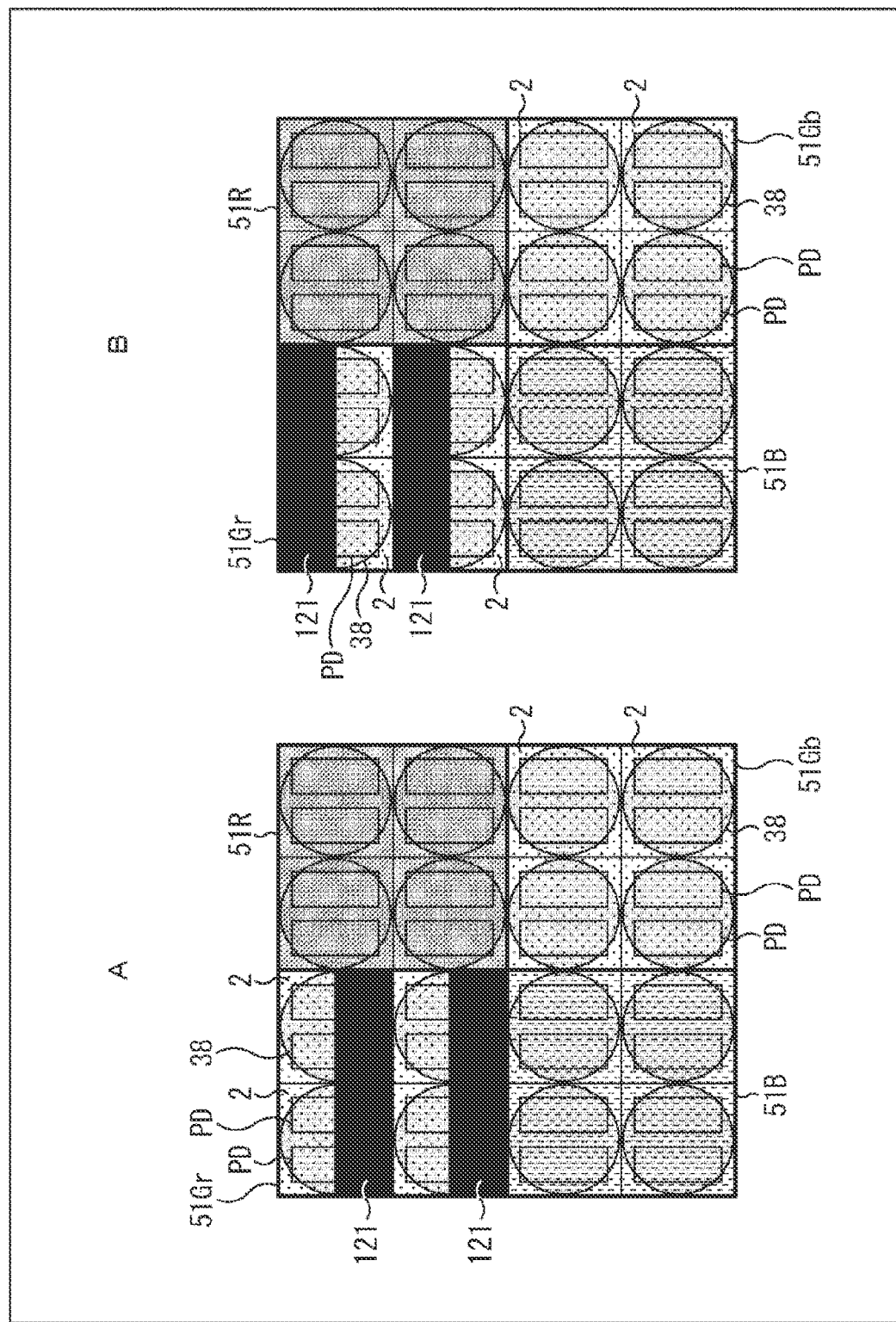
FIG. 24 is a plan view illustrating a first configuration in which a light-shielding film is disposed on photodiodes PD.

FIG. 24 is a plan view illustrating a first configuration in which a light-shielding film is disposed on photodiodes PD.

In A and B of FIG. 24, in each pixel 2 of the pixel set 51Gr, the upper halves or the lower halves of the two photodiodes PD in the pixel are shielded from the light by a light-shielding film 121.

A of FIG. 24 is an example in which the lower halves of the two photodiodes PD in the pixel are shielded from the light by the light-shielding film 121, and B of FIG. 24 is an example in which the upper halves of the two photodiodes PD in the pixel are shielded from the light by the light-shielding film 121.

The on-chip lenses 38 are formed for the individual pixels as in FIG. 3.

Using a pixel signal of the pixel set 51Gr in A of FIG. 24 in which pieces of the light-shielding film 121 are symmetrically disposed (an added pixel signal of the four pixels) and a pixel signal of the pixel set 51Gr in B of FIG. 24 (an added pixel signal of the four pixels), phase difference information is acquired.

Figure 25:
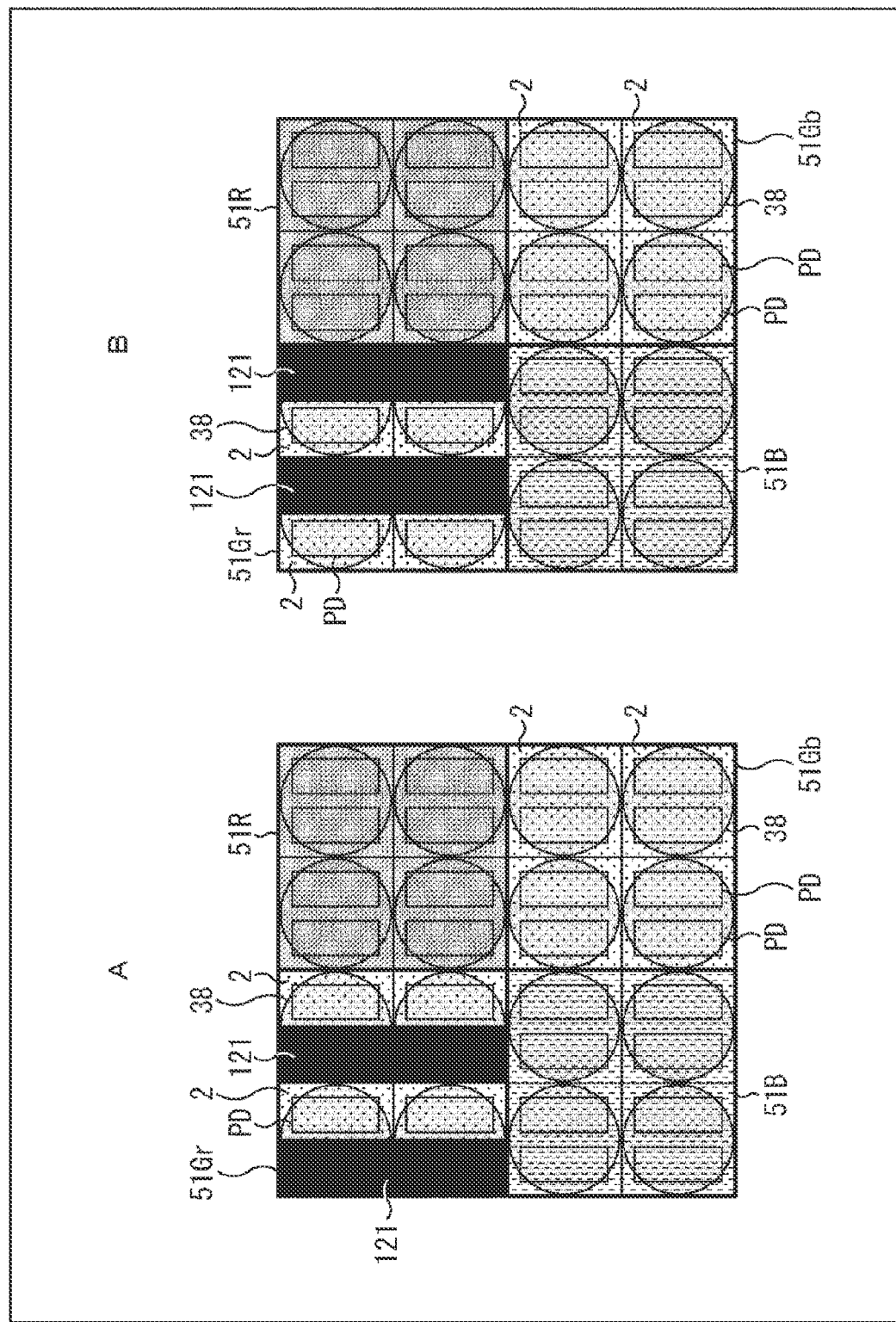
FIG. 25 is a plan view illustrating a second configuration in which the light-shielding film is disposed on photodiodes PD.

FIG. 25 is a plan view illustrating a second configuration in which a light-shielding film is disposed on photodiodes PD.

In A and B of FIG. 25, in each pixel 2 of the pixel set 51Gr, one of the two photodiodes PD in the pixel is shielded from the light by the light-shielding film 121.

A of FIG. 25 is an example in which the left photodiode PD of the two photodiodes PD of each pixel 2 in the pixel set 51Gr is shielded from the light by the light-shielding film 121, and B of FIG. 25 is an example in which the right photodiode PD of the two photodiodes PD of each pixel 2 in the pixel set 51Gr is shielded from the light by the light-shielding film 121.

The on-chip lenses 38 are formed for the individual pixels as in FIG. 3.

Using a pixel signal of the pixel set 51Gr in A of FIG. 25 in which pieces of the light-shielding film 121 are symmetrically disposed (an added pixel signal of the four pixels) and a pixel signal of the pixel set 51Gr in B of FIG. 25 (an added pixel signal of the four pixels), phase difference information is acquired.

Both of the first and second configurations in FIGS. 24 and 25 are a configuration in which the light-shielding film 121 partly light-shields all the pixels 2 in the pixel set 51Gr.

Figure 26:
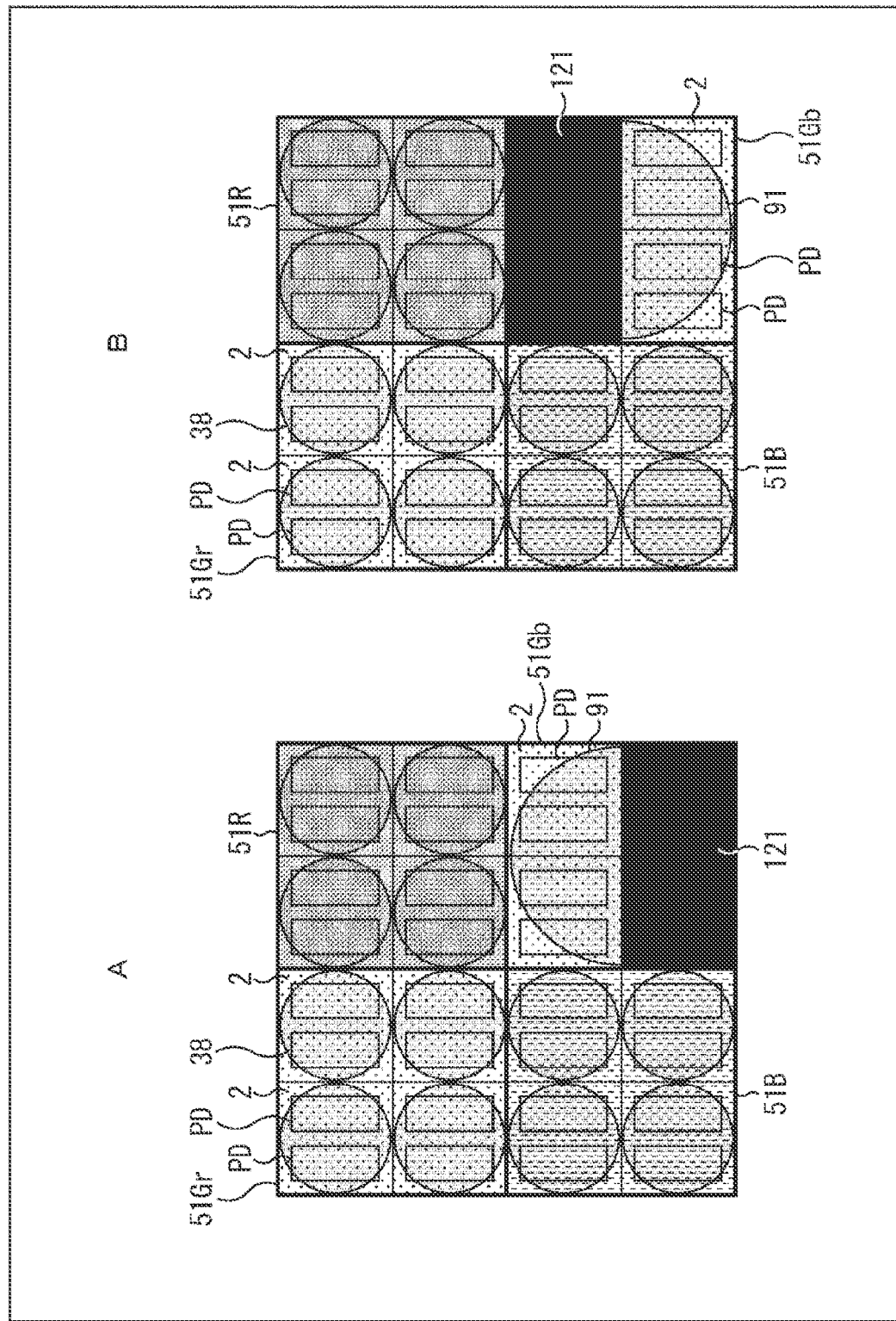
FIG. 26 is a plan view illustrating a third configuration in which the light-shielding film is disposed on photodiodes PD.

FIG. 26 is a plan view illustrating a third configuration in which a light-shielding film is disposed on photodiodes PD.

In A and B of FIG. 26, of the four pixels constituting the pixel set 51Gb, all the photodiodes PD of the two upper or lower pixels are shielded from the light by the light-shielding film 121.

A of FIG. 26 is an example in which all the photodiodes PD of the two lower pixels in the pixel set 51Gb are shielded from the light by the light-shielding film 121, and B of FIG. 26 is an example in which all the photodiodes PD of the two upper pixels in the pixel set 51Gb are shielded from the light by the light-shielding film 121.

In FIG. 26, one on-chip lens 91 is formed on the pixel set 51Gb at which the light-shielding film 121 is disposed, as in FIG. 17. On the pixel sets 51Gr, 51R, and 51B at which no light-shielding film 121 is disposed, the on-chip lenses 38 for the individual pixels are formed.

Using a pixel signal of the pixel set 51Gb in A of FIG. 26 at which pieces of the light-shielding film 121 are symmetrically disposed (an added pixel signal of the four pixels) and a pixel signal of the pixel set 51Gb in B of FIG. 26 (an added pixel signal of the four pixels), phase difference information is acquired.

Figure 27:
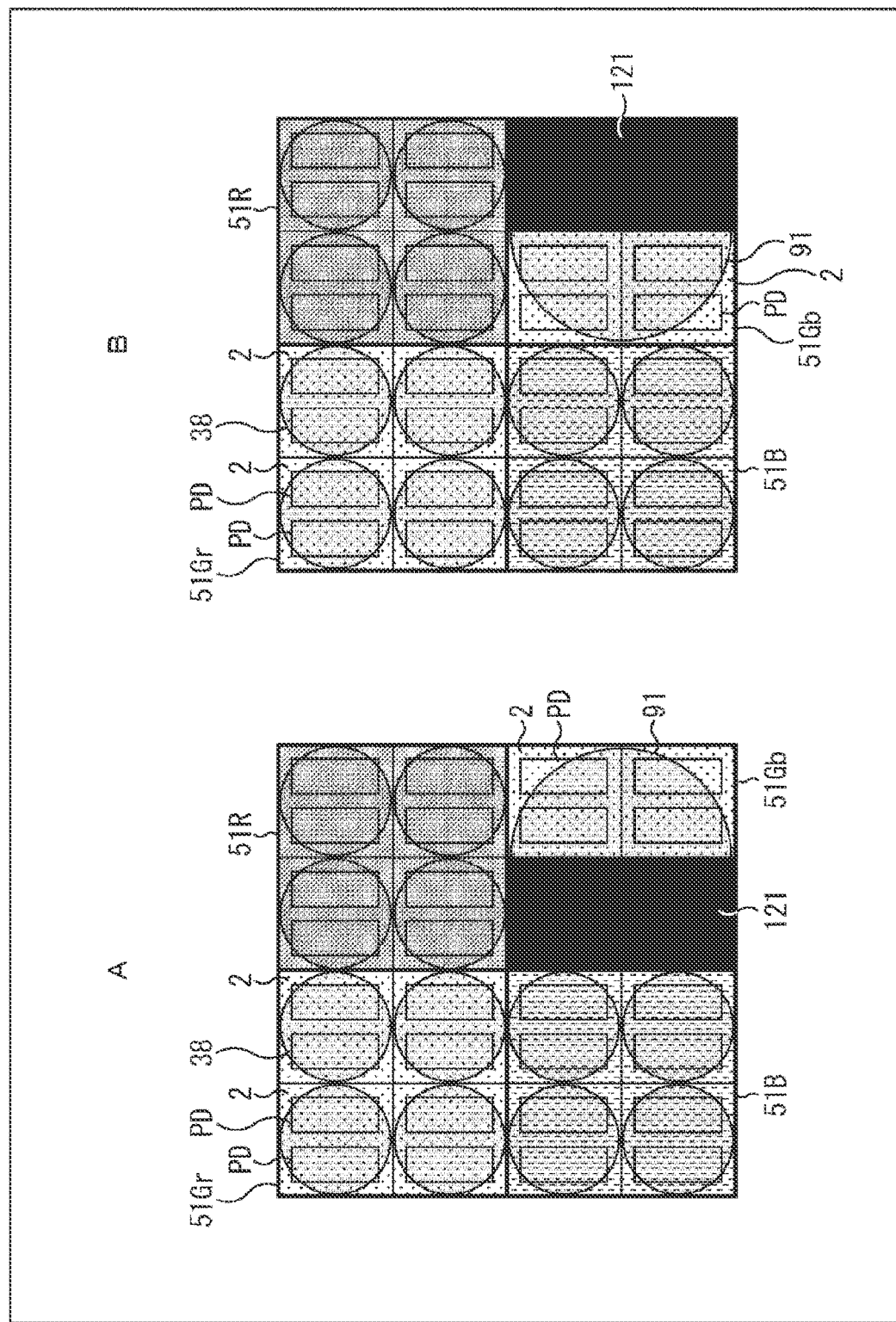
FIG. 27 is a plan view illustrating a fourth configuration in which the light-shielding film is disposed on photodiodes PD.

FIG. 27 is a plan view illustrating a fourth configuration in which a light-shielding film is disposed on photodiodes PD.

In A and B of FIG. 27, of the four pixels constituting the pixel set 51Gb, all the photodiodes PD of the two left or right pixels are shielded from the light by the light-shielding film 121.

A of FIG. 27 is an example in which all the photodiodes PD of the two left pixels in the pixel set 51Gb are shielded from the light by the light-shielding film 121, and B of FIG. 27 is an example in which all the photodiodes PD of the two right pixels in the pixel set 51Gb are shielded from the light by the light-shielding film 121.

In FIG. 27, one on-chip lens 91 is formed on the pixel set 51Gb at which the light-shielding film 121 is disposed, as in FIG. 17. On the pixel sets 51Gr, 51R, and 51B at which no light-shielding film 121 is disposed, the on-chip lenses 38 for the individual pixels are formed.

Using a pixel signal of the pixel set 51Gb in A of FIG. 27 at which pieces of the light-shielding film 121 are symmetrically disposed (an added pixel signal of the four pixels) and a pixel signal of the pixel set 51Gb in B of FIG. 27 (an added pixel signal of the four pixels), phase difference information is acquired.

Both of the third and fourth configurations in FIGS. 26 and 27 are a configuration in which the light-shielding film 121 entirely shields some of the pixels 2 in the pixel set 51Gr from the light.

In a case where the light intensity of incident light is high and phase difference information cannot be acquired in the pixel sets 51 at which no light-shielding film 121 is disposed, the first to fourth configurations of FIG. 24 to FIG. 27 in which the light-shielding film 121 is disposed allows the pixel sets 51 at which the light-shielding film 121 is disposed to acquire phase difference information. Thus, the first to fourth configurations in which the light-shielding film 121 is disposed are effective in acquiring phase difference information in a case where the light intensity of incident light is high.

The first to fourth configurations of FIGS. 24 to 27 in which the light-shielding film is disposed are an example in which the light-shielding film 121 is disposed at the pixel set 51Gb or the pixel set 51Gr. A similar light-shielding film 121 may be formed for the other pixel set 51R or 51B, or the light-shielding film 121 may be formed at all of the pixel sets 51Gb, 51R, and 51B.

<12. Other Modifications>

Figure 28:
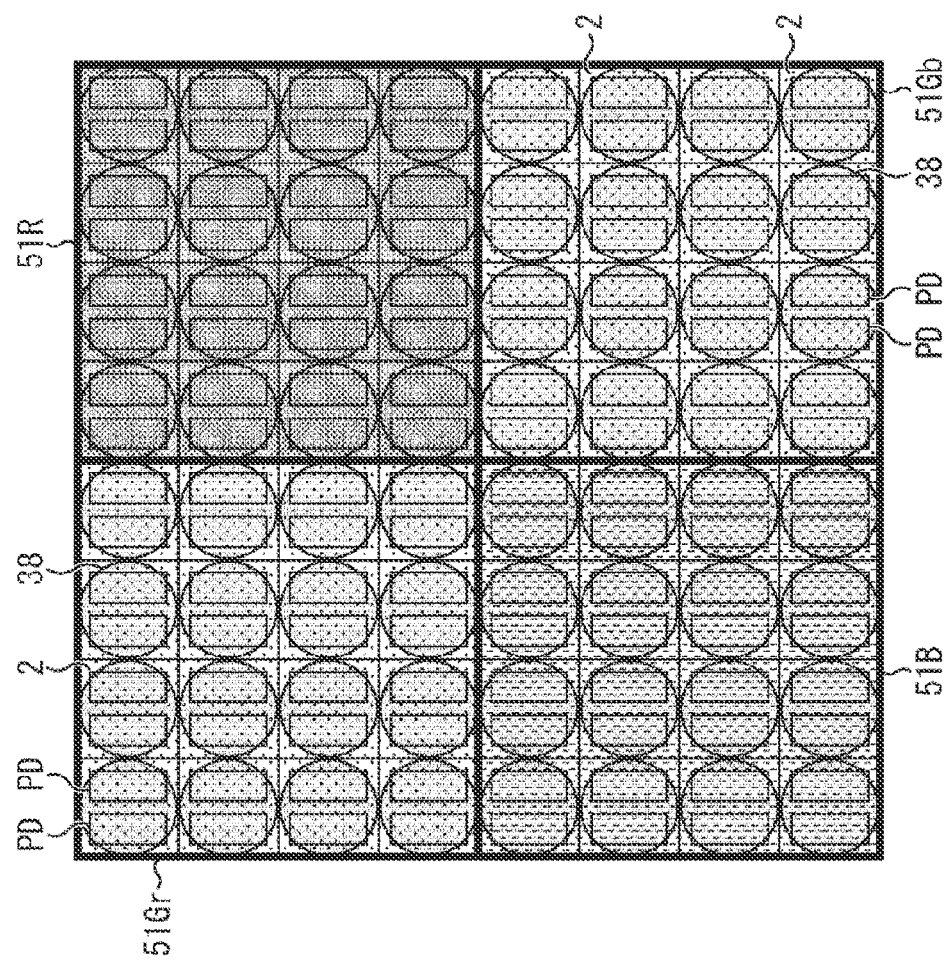
FIG. 28 is a diagram illustrating another modification of the solid-state imaging device in FIG. 1.

FIG. 28 illustrates another modification of the solid-state imaging device 1.

In the example described above, the constituent units of the pixel set 51 is four pixels in 2×2 (two vertical pixels×two horizontal pixels). However, the pixel set 51 is not limited to four pixels in 2×2, and is only required to include a plurality of pixels 2.

FIG. 28 illustrates an example in which the constituent units of the pixel set 51 is 16 pixels in 4×4 (four vertical pixels×four horizontal pixels). The example of FIG. 28 illustrates an example in which an on-chip lens 38 is formed for each pixel, which is not limiting. One on-chip lens may be disposed for four pixels in 2×2, or one on-chip lens may be disposed for 16 pixels in 4×4.

In addition, for example, nine pixels in 3×3 (three vertical pixels×three horizontal pixels) may be set as constituent units of the pixel set 51.

Figure 29:
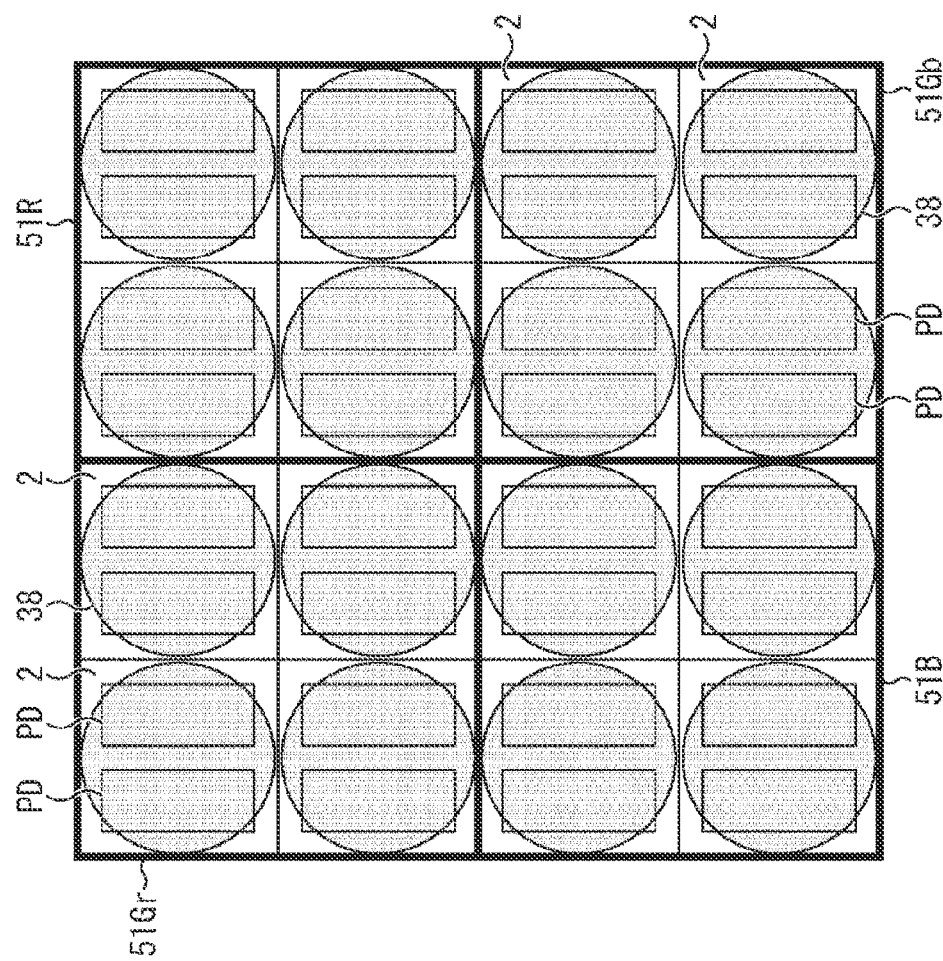
FIG. 29 is a diagram illustrating still another modification of the solid-state imaging device in FIG. 1.

FIG. 29 illustrates still another modification of the solid-state imaging device 1.

In the example described above, a color filter 37 that allows light of wavelengths of R, G, or B to pass through is formed at each pixel 2 of the solid-state imaging device 1.

However, as illustrated in FIG. 29, a configuration in which the color filters 37 are eliminated may be adopted. In this case, the pixels 2 of the solid-state imaging device 1 can receive light of all wavelengths of R, G, and B to generate and output pixel signals.

Alternatively, instead of the color filters 37, the solid-state imaging device 1 may be provided with infrared filters that transmit infrared light to receive only infrared light to generate and output pixel signals.

<13. Pixel Transistor Arrangement Example>

An example of arrangement of pixel transistors will be described with reference to FIG. 30.

Figure 30:
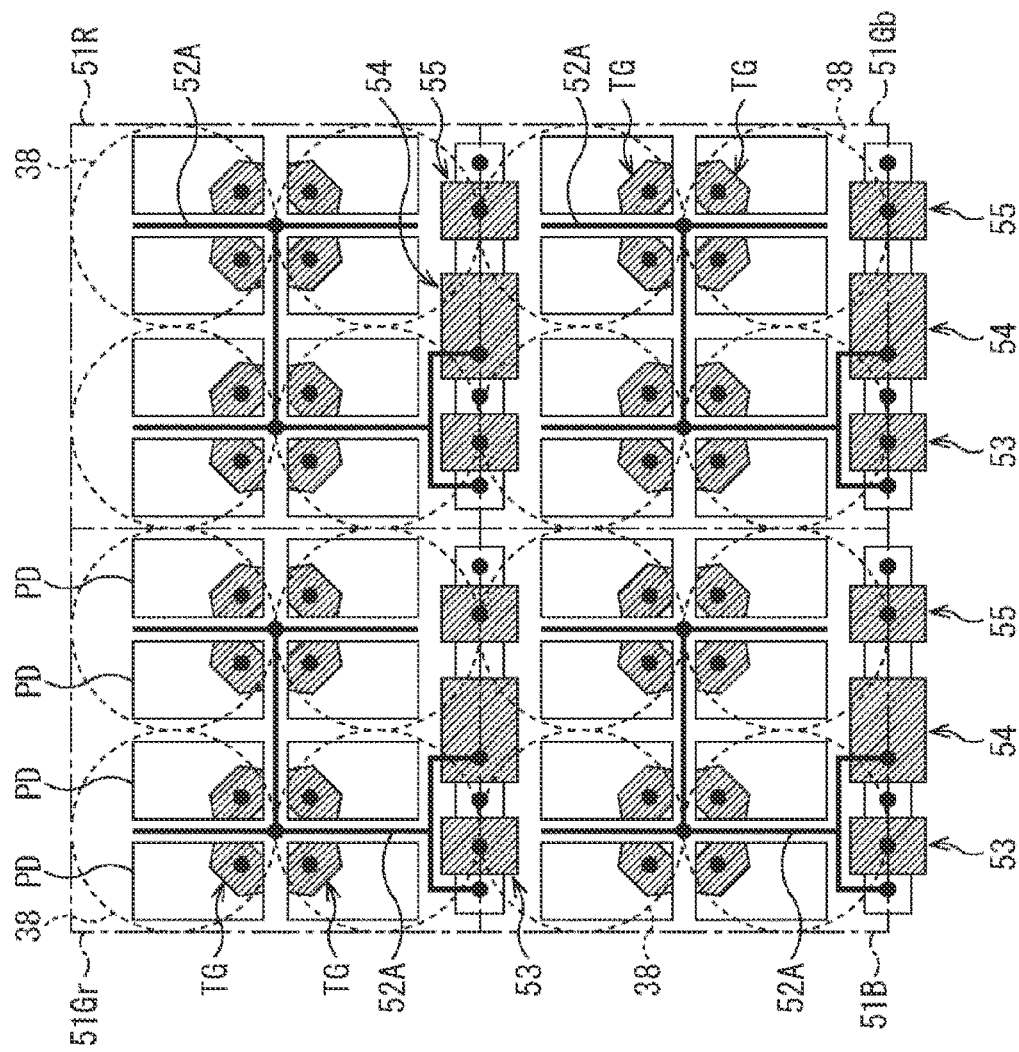
FIG. 30 is a plan view illustrating an example of arrangement of pixel transistors.

In the pixel array 3, for example, the arrangement of the photodiodes PD and the pixel transistors illustrated in FIG. 30 is repeated in the horizontal direction and the vertical direction.

FIG. 30 is a plan view illustrating an example of arrangement of the pixel transistors in a pixel region of a total of 16 pixels in which the pixel sets 51 whose constituent units are four pixels in 2×2 (two vertical pixels×two horizontal pixels) are arranged 2×2. In FIG. 30, a portion indicated by a black circle represents a power supply, a GND, or a contact portion of a signal line. Note that in FIG. 30, some reference numerals are omitted to prevent the figure from being complicated.

In FIG. 30, the photodiodes PD, the color filters 37 (not illustrated in FIG. 30), and the on-chip lenses 38 are formed as in the example illustrated in FIG. 3. Specifically, two photodiodes PD are disposed for one pixel horizontally symmetrically in a longitudinal shape. The on-chip lenses 38 are formed for the individual pixels. The color filters 37 are arranged in a Bayer array in units of the pixel sets 51. The upper left pixel set 51 is the pixel set 51Gr including the G color filters 37, the upper right pixel set 51 is the pixel set 51R including the R color filters 37, the lower left pixel set 51 is the pixel set 51B including the B color filters 37, and the lower right pixel set 51 is the pixel set 51Gb including the G color filters 37.

As described with reference to FIG. 4, one pixel set 51 including four pixels is provided with eight photodiodes PD and eight transfer transistors TG, and the FD 52, the reset transistor 53, the amplification transistor 54, and the selection transistor 55 shared by them.

As illustrated in FIG. 30, the eight photodiodes PD included in one pixel set 51 are arrayed in 2×4 (vertically two×horizontally four), and the reset transistor 53, the amplification transistor 54, and the selection transistor 55, which are shared by the eight photodiodes PD, are disposed vertically (longitudinally) adjacent to the eight photodiodes PD in 2×4. If the reset transistor 53, the amplification transistor 54, and the selection transistor 55, which are shared by the eight photodiodes PD, are collectively referred to as shared pixel transistors, the shared pixel transistors are disposed between the eight photodiodes PD and the eight photodiodes PD in 2×4 in the two vertically adjacent pixel sets 51.

With four photodiodes PD in 2×2 as a group, the transfer transistors TG provided one-to-one to the photodiodes PD are disposed near the center of the group. Four transfer transistors TG are collectively disposed near the center of four photodiodes PD in 2×2 in a right group in the pixel set 51, and four transfer transistors TG are collectively disposed near the center of four photodiodes PD in 2×2 in a left group in the pixel set 51.

The FD 52 includes at least metal wiring 52A as a part thereof. As illustrated in FIG. 30, the metal wiring 52A is routed to electrically connect a middle portion of the four photodiodes PD in 2×2 in the right group in the pixel set 51, a middle portion of the four photodiodes PD in 2×2 in the left group in the pixel set 51, the gate electrode of the amplification transistor 54, and the source electrode of the reset transistor 53. Charges accumulated in each photodiode PD in the pixel set 51 are transferred to the metal wiring 52A constituting a part of the FD 52 by the corresponding transfer transistor TG, transmitted through the metal wiring 52A, and provided to the gate electrode of the amplification transistor 54. Furthermore, when the reset transistor 53 is turned on, charges in the FD 52 are discharged from the source electrode to the drain electrode of the reset transistor 53.

Thus, for the shared pixel transistors (the reset transistor 53, the amplification transistor 54, and the selection transistor 55), a layout can be adopted in which they are disposed between the eight photodiodes PD of one pixel set 51 and the eight photodiodes PD of another pixel set 51 adjacent in the column direction. Note that although not illustrated, a layout in which the shared pixel transistors are disposed between the eight photodiodes PD and the eight photodiodes PD of the pixel sets 51 adjacent to each other in the row direction may be used.

<14. Example of Application to Electronic Apparatus>

The present technology is not limited to application to a solid-state imaging device. Specifically, the present technology is applicable to all electronic apparatuses using a solid-state imaging device for an image capturing unit (photoelectric conversion part), such as imaging apparatuses including digital still cameras and video cameras, portable terminal devices having an imaging function, and copying machines using a solid-state imaging device for an image reading unit. The solid-state imaging device may be formed as one chip, or may be in a modular form having an imaging function in which an imaging unit and a signal processing unit or an optical system are packaged together.

Figure 31:
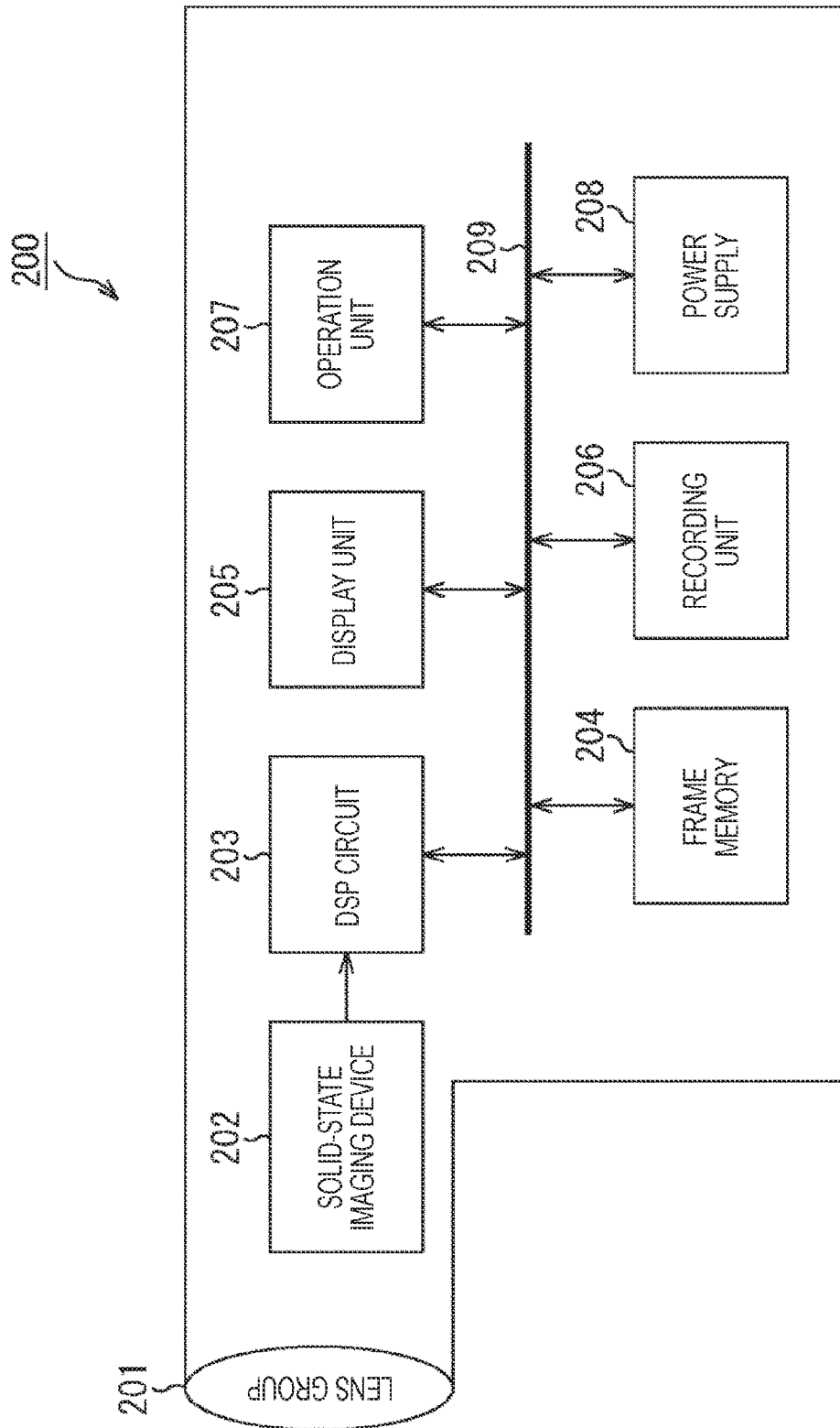
FIG. 31 is a block diagram illustrating a configuration example of an imaging apparatus as an electronic apparatus to which the present technology is applied.

FIG. 31 is a block diagram illustrating a configuration example of an imaging apparatus as an electronic apparatus to which the present technology is applied.

An imaging apparatus 200 in FIG. 31 includes an optical unit 201 including a lens group or the like, a solid-state imaging device (imaging device) 202 in which the configuration of the solid-state imaging device 1 in FIG. 1 is used, and a digital signal processor (DSP) circuit 203 that is a camera signal processing circuit. Furthermore, the imaging apparatus 200 also includes a frame memory 204, a display unit 205, a recording unit 206, an operation unit 207, and a power supply 208. The DSP circuit 203, the frame memory 204, the display unit 205, the recording unit 206, the operation unit 207, and the power supply 208 are mutually connected via a bus line 209.

The optical unit 201 captures incident light (image light) from a subject, forming an image on an imaging surface of the solid-state imaging device 202. The solid-state imaging device 202 converts the amount of incident light formed as the image on the imaging surface by the optical unit 201 into an electric signal pixel by pixel and outputs the electric signal as a pixel signal. As the solid-state imaging device 202, the solid-state imaging device 1 in FIG. 1, that is, a solid-state imaging device capable of simultaneously acquiring a signal for generating a high dynamic range image and a signal for detecting a phase difference can be used.

The display unit 205 includes, for example, a thin display such as a liquid crystal display (LCD) or an organic electroluminescence (EL) display, and displays a moving image or a still image captured by the solid-state imaging device 202. The recording unit 206 records a moving image or a still image captured by the solid-state imaging device 202 on a recording medium such as a hard disk or a semiconductor memory.

The operation unit 207 issues operation commands on various functions of the imaging apparatus 200 under user operation. The power supply 208 appropriately supplies various power supplies to be operation power supplies for the DSP circuit 203, the frame memory 204, the display unit 205, the recording unit 206, and the operation unit 207, to them to be supplied with.

As described above, by using the solid-state imaging device 1 to which the above-described embodiment is applied as the solid-state imaging device 202, it is possible to simultaneously acquire a signal for generating a high dynamic range image and a signal for detecting a phase difference. Therefore, the imaging apparatus 200 such as a video camera or a digital still camera, or further a camera module for a mobile device such as a portable phone can also improve the quality of captured images.

<Example of Use of Image Sensor>

Figure 32:
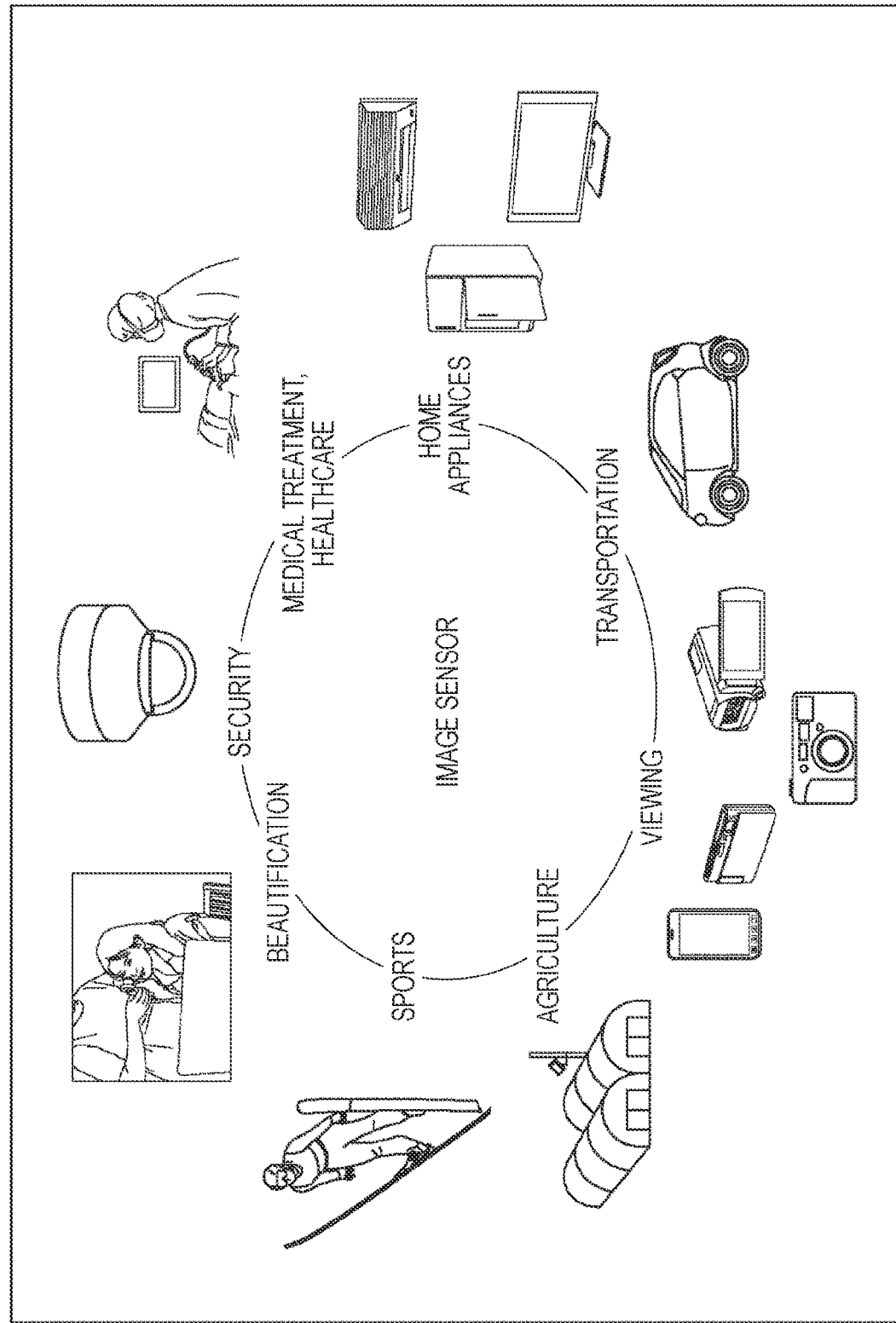
FIG. 32 is a diagram illustrating an example of use of an image sensor.

FIG. 32 is a diagram illustrating an example of use of an image sensor using the above-described solid-state imaging device 1.

The image sensor using the above-described solid-state imaging device 1 can be used in various cases where light such as visible light, infrared light, ultraviolet light, and X-ray are sensed, for example, as below.

Devices for capturing images for viewing, such as digital cameras and portable devices with a camera function Devices for transportation use, such as vehicle-mounted sensors for imaging the front, back, surroundings, interior, etc. of a vehicle, surveillance cameras for monitoring running vehicles and roads, and distance measurement sensors for measuring distance between vehicles or the like, for safe driving such as automatic stopping, recognition of drivers' conditions, and the like Devices used in household appliances such as TVs, refrigerators, and air conditioners, for imaging user gestures and performing apparatus operations in accordance with the gestures Devices for medical treatment and healthcare use, such as endoscopes and devices that perform blood vessel imaging through reception of infrared light Devices for security use, such as surveillance cameras for crime prevention applications and cameras for person authentication applications Devices for beautification use, such as skin measuring instruments for imaging skin and microscopes for imaging scalp Devices for sports use, such as action cameras and wearable cameras for sports applications and the like Devices for agriculture use, such as cameras for monitoring the conditions of fields and crops <15. Example of Application to Endoscopic Surgery System>

The technology according to the present disclosure (the present technology) can be applied to various products. For example, the technology according to the present disclosure may be applied to an endoscopic surgery system.

Figure 33:
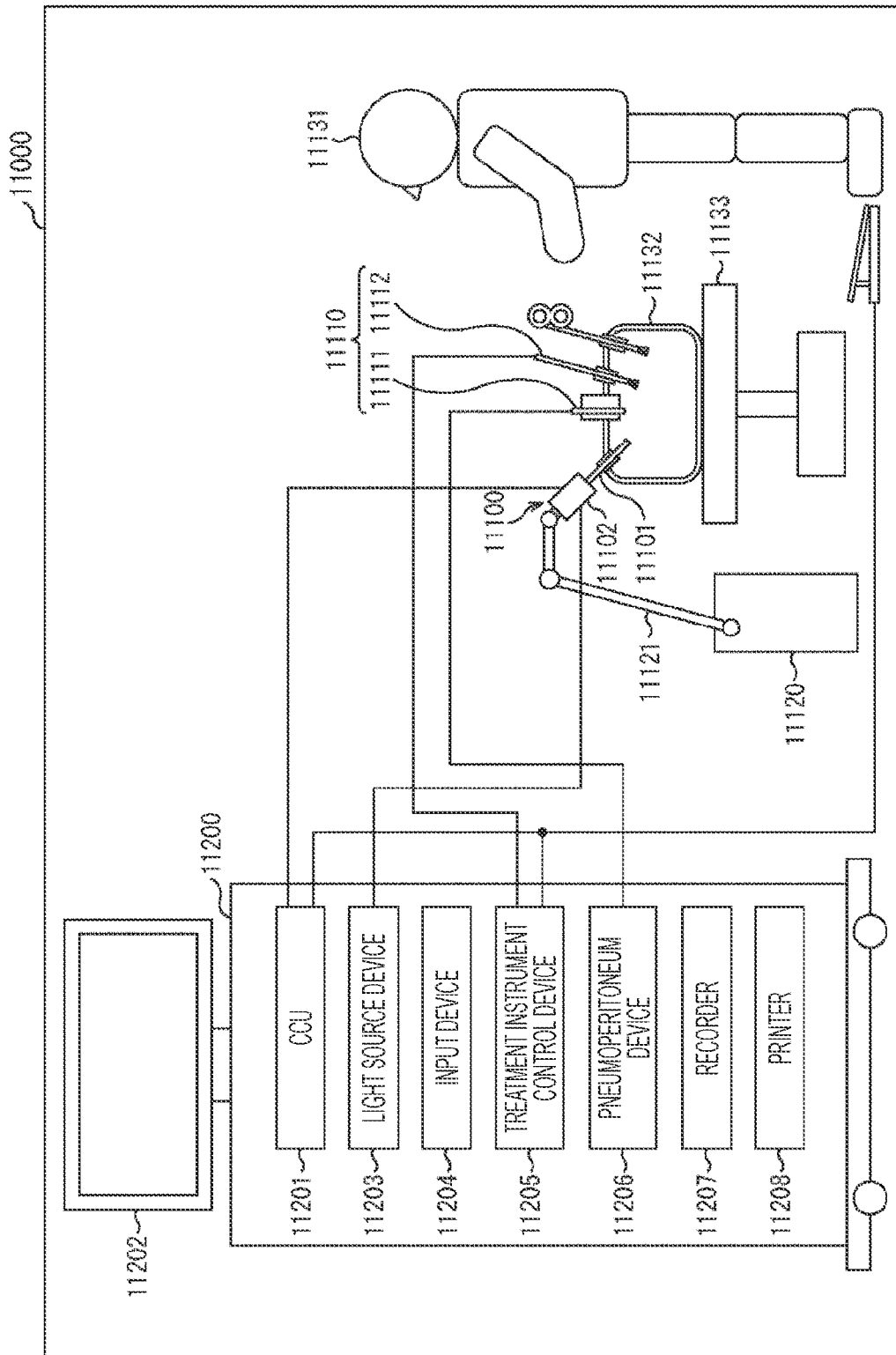
FIG. 33 is a diagram illustrating an example of a schematic configuration of an endoscopic surgery system.

FIG. 33 is a diagram illustrating an example of a schematic configuration of an endoscopic surgery system to which the technology according to the present disclosure (the present technology) can be applied.

FIG. 33 illustrates a state in which an operator (doctor) 11131 is performing an operation on a patient 11132 on a patient bed 11133, using an endoscopic surgery system 11000. As illustrated in the figure, the endoscopic surgery system 11000 includes an endoscope 11100, other surgical instruments 11110 including a pneumoperitoneum tube 11111 and an energy treatment instrument 11112, a support arm device 11120 that supports the endoscope 11100, and a cart 11200 on which various devices for endoscopic surgery are mounted.

The endoscope 11100 includes a lens tube 11101 with a region of a predetermined length from the distal end inserted into the body cavity of the patient 11132, and a camera head 11102 connected to the proximal end of the lens tube 11101. In the illustrated example, the endoscope 11100 formed as a so-called rigid scope having a rigid lens tube 11101 is illustrated, but the endoscope 11100 may be formed as a so-called flexible scope having a flexible lens tube.

An opening in which an objective lens is fitted is provided at the distal end of the lens tube 11101. A light source device 11203 is connected to the endoscope 11100. Light generated by the light source device 11203 is guided to the distal end of the lens tube 11101 through a light guide extended inside the lens tube 11101, and is emitted through the objective lens toward an object to be observed in the body cavity of the patient 11132. Note that the endoscope 11100 may be a forward-viewing endoscope, an oblique-viewing endoscope, or a side-viewing endoscope.

An optical system and an imaging device are provided inside the camera head 11102. Light reflected from the object being observed (observation light) is concentrated onto the imaging device by the optical system. The observation light is photoelectrically converted by the imaging device, and an electric signal corresponding to the observation light, that is, an image signal corresponding to an observation image is generated. The image signal is transmitted to a camera control unit (CCU) 11201 as RAW data.

The CCU 11201 includes a central processing unit (CPU), a graphics processing unit (GPU), or the like, and performs centralized control on the operations of the endoscope 11100 and a display device 11202. Moreover, the CCU 11201 receives an image signal from the camera head 11102, and performs various types of image processing such as development processing (demosaicing) on the image signal for displaying an image based on the image signal.

The display device 11202 displays an image based on an image signal subjected to image processing by the CCU 11201 under the control of the CCU 11201.

The light source device 11203 includes a light source such as a light emitting diode (LED), and supplies irradiation light when a surgical site or the like is imaged to the endoscope 11100.

An input device 11204 is an input interface for the endoscopic surgery system 11000. The user can input various types of information and input instructions to the endoscopic surgery system 11000 via the input device 11204. For example, the user inputs an instruction to change conditions of imaging by the endoscope 11100 (the type of irradiation light, magnification, focal length, etc.) and the like.

A treatment instrument control device 11205 controls the drive of the energy treatment instrument 11112 for tissue ablation, incision, blood vessel sealing, or the like. A pneumoperitoneum device 11206 feeds gas into the body cavity of the patient 11132 through the pneumoperitoneum tube 11111 to inflate the body cavity for the purpose of providing a field of view by the endoscope 11100 and providing the operator's workspace. A recorder 11207 is a device that can record various types of information associated with surgery. A printer 11208 is a device that can print various types of information associated with surgery in various forms including text, an image, and a graph.

Note that the light source device 11203 that supplies irradiation light when a surgical site is imaged to the endoscope 11100 may include a white light source including LEDs, laser light sources, or a combination of them, for example. In a case where a white light source includes a combination of RGB laser light sources, the output intensity and output timing of each color (each wavelength) can be controlled with high accuracy. Thus, the light source device 11203 can adjust the white balance of captured images. Furthermore, in this case, by irradiating an object to be observed with laser light from each of the RGB laser light sources in a time-division manner, and controlling the drive of the imaging device of the camera head 11102 in synchronization with the irradiation timing, images corresponding one-to-one to RGB can also be imaged in a time-division manner. According to this method, color images can be obtained without providing color filters at the imaging device.

Furthermore, the drive of the light source device 11203 may be controlled so as to change the intensity of output light every predetermined time. By controlling the drive of the imaging device of the camera head 11102 in synchronization with the timing of change of the intensity of light and acquiring images in a time-division manner, and combining the images, a high dynamic range image without so-called underexposure and overexposure can be generated.

Furthermore, the light source device 11203 may be configured to be able to supply light in a predetermined wavelength band suitable for special light observation. In special light observation, for example, so-called narrow band imaging is performed in which predetermined tissue such as a blood vessel in a superficial portion of a mucous membrane is imaged with high contrast by irradiating it with light in a narrower band than irradiation light at the time of normal observation (that is, white light), utilizing the wavelength dependence of light absorption in body tissue. Alternatively, in special light observation, fluorescence observation may be performed in which an image is obtained by fluorescence generated by irradiation with excitation light. Fluorescence observation allows observation of fluorescence from body tissue by irradiating the body tissue with excitation light (autofluorescence observation), acquisition of a fluorescence image by locally injecting a reagent such as indocyanine green (ICG) into body tissue and irradiating the body tissue with excitation light corresponding to the fluorescence wavelength of the reagent, and the like. The light source device 11203 can be configured to be able to supply narrowband light and/or excitation light suitable for such special light observation.

Figure 34:
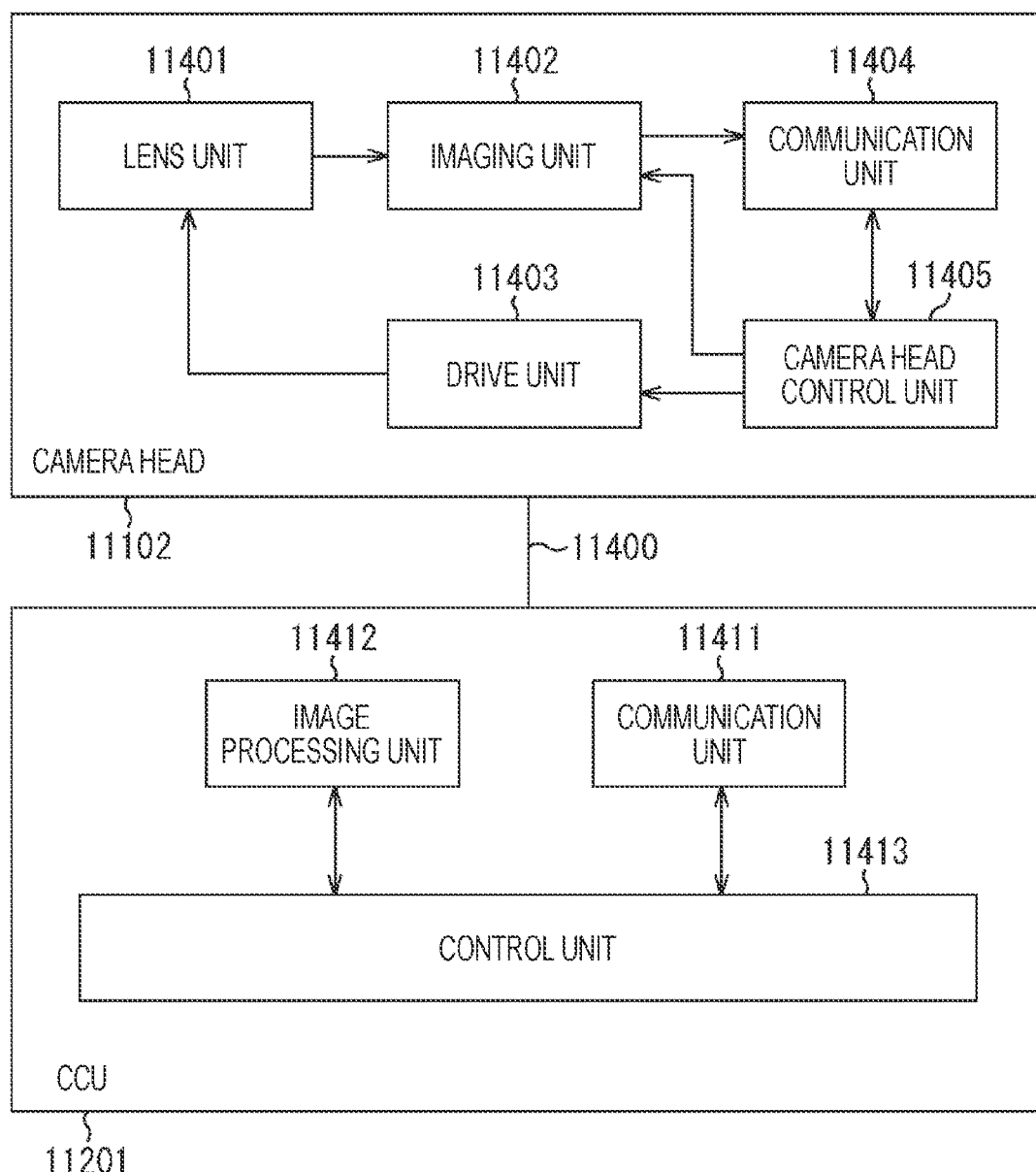
FIG. 34 is a block diagram illustrating an example of a functional configuration of a camera head and a CCU.

FIG. 34 is a block diagram illustrating an example of a functional configuration of the camera head 11102 and the CCU 11201 illustrated in FIG. 33.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a portion connected to the lens tube 11101. Observation light taken in from the distal end of the lens tube 11101 is guided to the camera head 11102 and enters the lens unit 11401. The lens unit 11401 includes a combination of a plurality of lenses including a zoom lens and a focus lens.

The imaging unit 11402 includes an imaging device. The imaging unit 11402 may include a single imaging device (be of a so-called single plate type), or may include a plurality of imaging devices (be of a so-called multi-plate type). In a case where the imaging unit 11402 is of the multi-plate type, for example, image signals corresponding one-to-one to RGB may be generated by imaging devices, and they may be combined to obtain a color image. Alternatively, the imaging unit 11402 may include a pair of imaging devices for acquiring right-eye and left-eye image signals corresponding to a 3D (dimensional) display, individually. By performing 3D display, the operator 11131 can more accurately grasp the depth of living tissue at a surgical site. Note that in a case where the imaging unit 11402 is of the multi-plate type, a plurality of lens units 11401 may be provided for the corresponding imaging devices.

Furthermore, the imaging unit 11402 may not necessarily be provided in the camera head 11102. For example, the imaging unit 11402 may be provided inside the lens tube 11101 directly behind the objective lens.

The drive unit 11403 includes an actuator, and moves the zoom lens and the focus lens of the lens unit 11401 by a predetermined distance along the optical axis under the control of the camera head control unit 11405. With this, the magnification and focus of an image captured by the imaging unit 11402 can be adjusted as appropriate.

The communication unit 11404 includes a communication device for transmitting and receiving various types of information to and from the CCU 11201. The communication unit 11404 transmits an image signal obtained from the imaging unit 11402 as RAW data to the CCU 11201 via the transmission cable 11400.

Furthermore, the communication unit 11404 receives a control signal for controlling the drive of the camera head 11102 from the CCU 11201, and provides the control signal to the camera head control unit 11405. The control signal includes, for example, information regarding imaging conditions such as information specifying the frame rate of captured images, information specifying the exposure value at the time of imaging, and/or information specifying the magnification and focus of captured images.

Note that the imaging conditions such as the frame rate, the exposure value, the magnification, and the focus described above may be appropriately specified by the user, or may be automatically set by the control unit 11413 of the CCU 11201 on the basis of an acquired image signal. In the latter case, so-called an auto exposure (AE) function, an auto focus (AF) function, and an auto white balance (AWB) function are mounted on the endoscope 11100.

The camera head control unit 11405 controls the drive of the camera head 11102 on the basis of a control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

Furthermore, the communication unit 11411 transmits a control signal for controlling the drive of the camera head 11102 to the camera head 11102. The image signal and the control signal can be transmitted by electrical communication, optical communication, or the like.

The image processing unit 11412 performs various types of image processing on an image signal that is RAW data transmitted from the camera head 11102.

The control unit 11413 performs various types of control for imaging of a surgical site or the like by the endoscope 11100 and display of a captured image obtained by imaging of a surgical site or the like. For example, the control unit 11413 generates a control signal for controlling the drive of the camera head 11102.

Furthermore, the control unit 11413 causes the display device 11202 to display a captured image showing a surgical site or the like, on the basis of an image signal subjected to image processing by the image processing unit 11412. At this time, the control unit 11413 may recognize various objects in the captured image using various image recognition techniques. For example, by detecting the shape of the edge, the color, or the like of an object included in a captured image, the control unit 11413 can recognize a surgical instrument such as forceps, a specific living body part, bleeding, mist when the energy treatment instrument 11112 is used, and so on. When causing the display device 11202 to display a captured image, the control unit 11413 may superimpose various types of surgery support information on an image of the surgical site for display, using the recognition results. By the surgery support information being superimposed and displayed, and presented to the operator 11131, the load of the operator 11131 can be reduced, and the operator 11131 can reliably proceed with the surgery.

The transmission cable 11400 that connects the camera head 11102 and the CCU 11201 is an electric signal cable for electric signal communication, an optical fiber for optical communication, or a composite cable for them.

Here, in the illustrated example, communication is performed by wire using the transmission cable 11400, but communication between the camera head 11102 and the CCU 11201 may be performed by radio.

An example of the endoscopic surgery system to which the technology according to the present disclosure can be applied has so far been described. The technology according to the present disclosure can be applied to the imaging unit 11402 in the configuration described above. Specifically, the solid-state imaging device 1 according to the above-described embodiment can be applied as the imaging unit 11402. By applying the technology according to the present disclosure to the imaging unit 11402, it is possible to simultaneously acquire a signal for generating a high dynamic range image and a signal for detecting a phase difference. Consequently, a high-quality captured image and distance information can be acquired, and the degree of safety of the driver and the vehicle can be increased.

Note that although the endoscopic surgery system has been described here as an example, the technology according to the present disclosure may be applied, for example, to a microsurgery system and the like.

<16. Example of Application to Mobile Object>

The technology according to the present disclosure (the present technology) can be applied to various products. For example, the technology according to the present disclosure may be implemented as a device mounted on any type of mobile object such as an automobile, an electric vehicle, a hybrid electric vehicle, a motorcycle, a bicycle, personal mobility, an airplane, a drone, a ship, and a robot.

Figure 35:
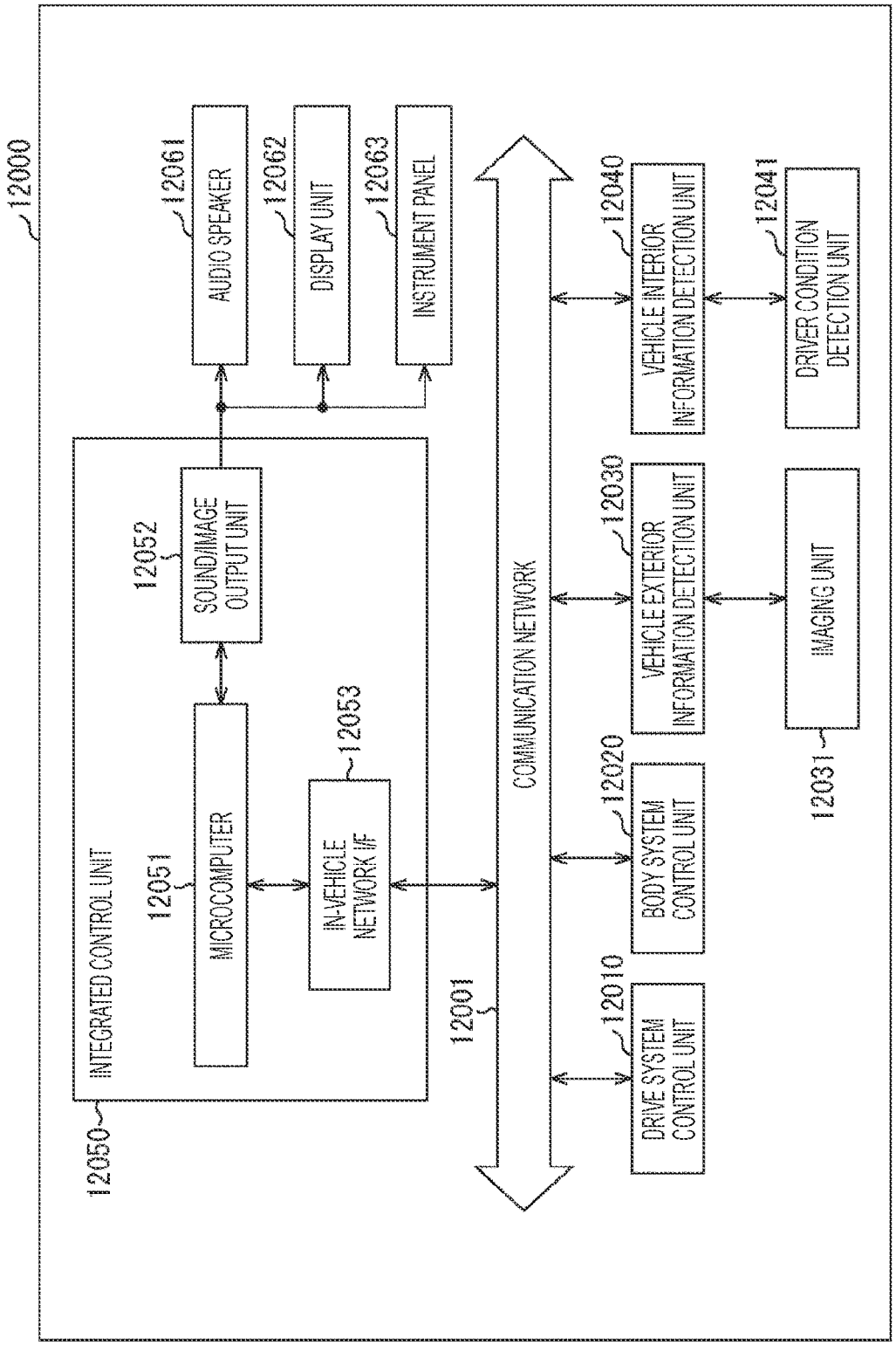
FIG. 35 is a block diagram illustrating an example of a schematic configuration of a vehicle control system.

FIG. 35 is a block diagram illustrating a schematic configuration example of a vehicle control system that is an example of a mobile object control system to which the technology according to the present disclosure can be applied.

A vehicle control system 12000 includes a plurality of electronic control units connected via a communication network 12001. In the example illustrated in FIG. 35, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, a sound/image output unit 12052, and an in-vehicle network interface (I/F) 12053 are illustrated.

The drive system control unit 12010 controls the operation of apparatuses related to the drive system of the vehicle, according to various programs. For example, the drive system control unit 12010 functions as a control device for a driving force generation apparatus for generating a driving force of the vehicle such as an internal combustion engine or a drive motor, a driving force transmission mechanism for transmitting the driving force to wheels, a steering mechanism for adjusting the steering angle of the vehicle, a braking device for generating a vehicle braking force, and others.

The body system control unit 12020 controls the operation of various apparatuses mounted on the vehicle body, according to various programs. For example, the body system control unit 12020 functions as a control device for a keyless entry system, a smart key system, power window devices, or various lamps including headlamps, back lamps, brake lamps, indicators, and fog lamps. In this case, the body system control unit 12020 can receive the input of radio waves transmitted from a portable device that substitutes for a key or signals from various switches. The body system control unit 12020 receives the input of these radio waves or signals, and controls door lock devices, the power window devices, the lamps, and others of the vehicle.

The vehicle exterior information detection unit 12030 detects information regarding the exterior of the vehicle equipped with the vehicle control system 12000. For example, an imaging unit 12031 is connected to the vehicle exterior information detection unit 12030. The vehicle exterior information detection unit 12030 causes the imaging unit 12031 to capture an image outside the vehicle and receives the captured image. The vehicle exterior information detection unit 12030 may perform object detection processing or distance detection processing on a person, a vehicle, an obstacle, a sign, characters on a road surface, or the like, on the basis of the received image.

The imaging unit 12031 is an optical sensor that receives light and outputs an electric signal corresponding to the amount of the received light. The imaging unit 12031 may output an electric signal as an image, or may output it as distance measurement information. Furthermore, light received by the imaging unit 12031 may be visible light, or may be invisible light such as infrared rays.

The vehicle interior information detection unit 12040 detects information of the vehicle interior. For example, a driver condition detection unit 12041 that detects a driver's conditions is connected to the vehicle interior information detection unit 12040. The driver condition detection unit 12041 includes, for example, a camera that images the driver. The vehicle interior information detection unit 12040 may calculate the degree of fatigue or the degree of concentration of the driver, or may determine whether the driver is dozing, on the basis of detected information input from the driver condition detection unit 12041.

The microcomputer 12051 can calculate a control target value for the driving force generation apparatus, the steering mechanism, or the braking device on the basis of vehicle interior or exterior information acquired by the vehicle exterior information detection unit 12030 or the vehicle interior information detection unit 12040, and output a control command to the drive system control unit 12010. For example, the microcomputer 12051 can perform cooperative control for the purpose of implementing the functions of an advanced driver assistance system (ADAS) including vehicle collision avoidance or impact mitigation, following driving based on inter-vehicle distance, vehicle speed-maintaining driving, vehicle collision warning, vehicle lane departure warning, and so on.

Furthermore, the microcomputer 12051 can perform cooperative control for the purpose of automatic driving for autonomous travelling without a driver's operation, by controlling the driving force generation apparatus, the steering mechanism, the braking device, or others, on the basis of information around the vehicle acquired by the vehicle exterior information detection unit 12030 or the vehicle interior information detection unit 12040.

Moreover, the microcomputer 12051 can output a control command to the body system control unit 12020 on the basis of vehicle exterior information acquired by the vehicle exterior information detection unit 12030. For example, the microcomputer 12051 can perform cooperative control for the purpose of preventing glare by controlling the headlamps according to the position of a preceding vehicle or an oncoming vehicle detected by the vehicle exterior information detection unit 12030, switching high beam to low beam, or the like.

The sound/image output unit 12052 transmits an output signal of at least one of a sound or an image to an output device that can visually or auditorily notify a vehicle occupant or the outside of the vehicle of information. In the example of FIG. 35, as the output device, an audio speaker 12061, a display unit 12062, and an instrument panel 12063 are illustrated. The display unit 12062 may include at least one of an on-board display or a head-up display, for example.

Figure 36:
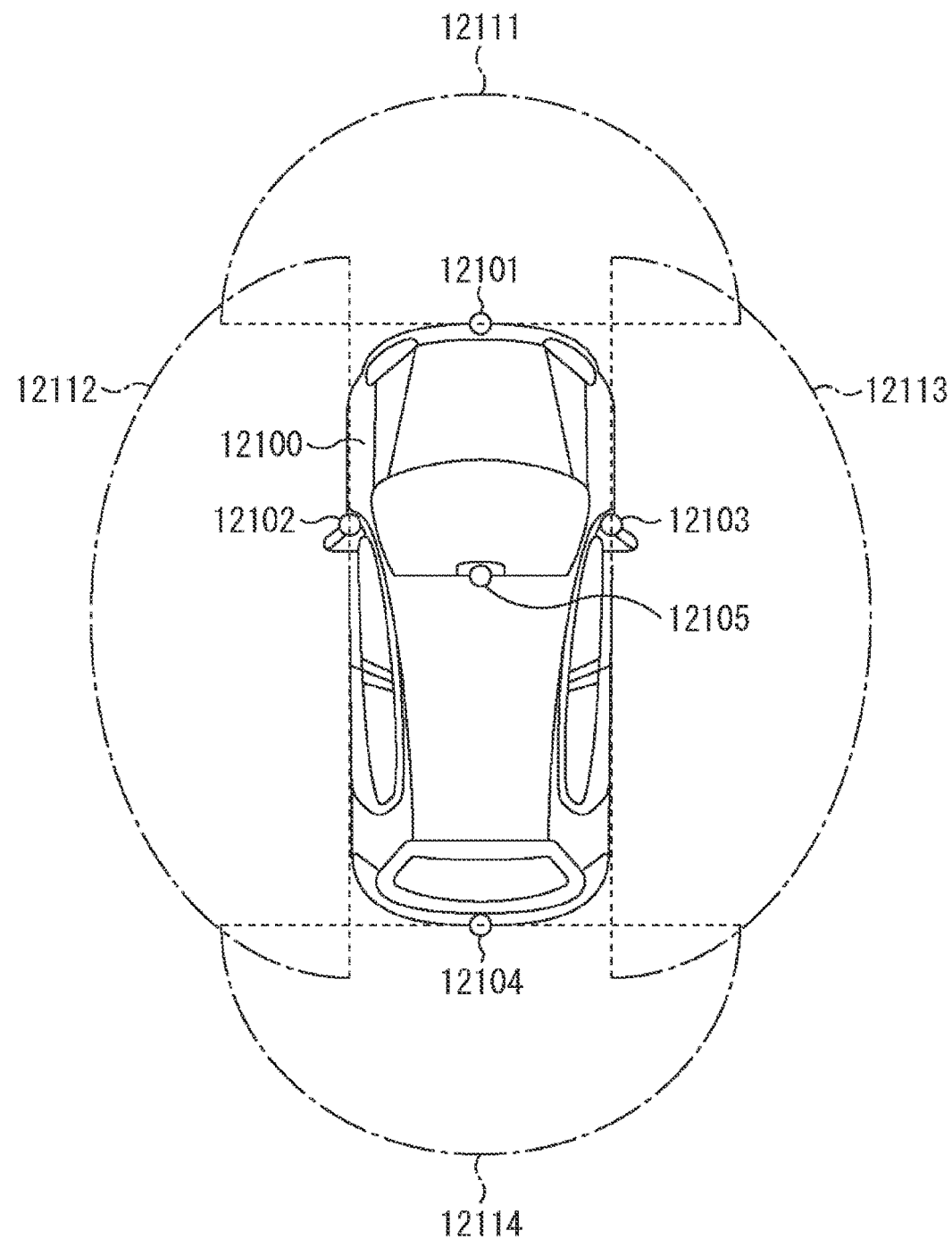
FIG. 36 is an explanatory diagram illustrating an example of installation positions of a vehicle exterior information detection unit and imaging units.

FIG. 36 is a diagram illustrating an example of the installation position of the imaging unit 12031.

In FIG. 36, a vehicle 12100 includes imaging units 12101, 12102, 12103, 12104, and 12105 as the imaging unit 12031.

The imaging units 12101, 12102, 12103, 12104, and 12105 are provided, for example, at positions such as the front nose, the side mirrors, the rear bumper or the back door, and an upper portion of the windshield in the vehicle compartment of the vehicle 12100. The imaging unit 12101 provided at the front nose and the imaging unit 12105 provided at the upper portion of the windshield in the vehicle compartment mainly acquire images of the front of the vehicle 12100. The imaging units 12102 and 12103 provided at the side mirrors mainly acquire images of the sides of the vehicle 12100. The imaging unit 12104 provided at the rear bumper or the back door mainly acquires images of the rear of the vehicle 12100. Front images acquired by the imaging units 12101 and 12105 are mainly used for detection of a preceding vehicle, or a pedestrian, an obstacle, a traffic light, or a traffic sign, or a lane, or the like.

Note that FIG. 36 illustrates an example of imaging ranges of the imaging units 12101 to 12104. An imaging range 12111 indicates the imaging range of the imaging unit 12101 provided at the front nose, imaging ranges 12112 and 12113 indicate the imaging ranges of the imaging units 12102 and 12103 provided at the side mirrors, respectively, and an imaging range 12114 indicates the imaging range of the imaging unit 12104 provided at the rear bumper or the back door. For example, by superimposing image data captured by the imaging units 12101 to 12104 on each other, an overhead image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging devices, or may be an imaging device including pixels for phase difference detection.

For example, the microcomputer 12051 can determine distances to three-dimensional objects in the imaging ranges 12111 to 12114, and temporal changes in the distances (relative speeds to the vehicle 12100), on the basis of distance information obtained from the imaging units 12101 to 12104, thereby extracting, as a preceding vehicle, especially the nearest three-dimensional object located on the traveling path of the vehicle 12100 which is a three-dimensional object traveling at a predetermined speed (e.g., 0 km/h or higher) in substantially the same direction as the vehicle 12100. Furthermore, the microcomputer 12051 can perform automatic brake control (including following stop control), automatic acceleration control (including following start control), and the like, setting an inter-vehicle distance to be provided in advance in front of a preceding vehicle. Thus, cooperative control for the purpose of autonomous driving for autonomous traveling without a driver's operation or the like can be performed.

For example, the microcomputer 12051 can extract three-dimensional object data regarding three-dimensional objects, classifying them into a two-wheel vehicle, an ordinary vehicle, a large vehicle, a pedestrian, and another three-dimensional object such as a power pole, on the basis of distance information obtained from the imaging units 12101 to 12104, for use in automatic avoidance of obstacles. For example, for obstacles around the vehicle 12100, the microcomputer 12051 distinguishes between obstacles that can be visually identified by the driver of the vehicle 12100 and obstacles that are difficult to visually identify. Then, the microcomputer 12051 determines a collision risk indicating the degree of danger of collision with each obstacle. In a situation where the collision risk is equal to or higher than a set value and there is a possibility of collision, the microcomputer 12051 can perform driving assistance for collision avoidance by outputting a warning to the driver via the audio speaker 12061 or the display unit 12062, or performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is present in captured images of the imaging units 12101 to 12104. The recognition of a pedestrian is performed, for example, by a procedure of extracting feature points in captured images of the imaging units 12101 to 12104 as infrared cameras, and a procedure of performing pattern matching on a series of feature points indicating the outline of an object to determine whether or not the object is a pedestrian. When the microcomputer 12051 determines that a pedestrian is present in captured images of the imaging units 12101 to 12104 and recognizes the pedestrian, the sound/image output unit 12052 controls the display unit 12062 to superimpose and display a rectangular outline for enhancement on the recognized pedestrian. Alternatively, the sound/image output unit 12052 may control the display unit 12062 so as to display an icon or the like indicating the pedestrian at a desired position.

An example of the vehicle control system to which the technology according to the present disclosure can be applied has so far been described. The technology according to the present disclosure can be applied to the imaging unit 12031 in the configuration described above. Specifically, the solid-state imaging device 1 according to the above-described embodiment can be applied as the imaging unit 12031. By applying the technology according to the present disclosure to the imaging unit 12031, a signal for generating a high dynamic range image and a signal for detecting a phase difference can be acquired simultaneously. Consequently, a high-quality captured image and distance information can be acquired, and the degree of safety of the driver and the vehicle can be increased.

In the above-described examples, the solid-state imaging device that uses electrons as signal charges with the first conductivity type as P-type and the second conductivity type as N-type has been described. The present technology is also applicable to a solid-state imaging device that uses holes as signal charges. That is, with the first conductivity type as N-type and the second conductivity type as P-type, each semiconductor region described above can be formed by a semiconductor region of the opposite conductivity type.

Embodiments of the present technology are not limited to the above-described embodiment, and various modifications can be made without departing from the gist of the present technology.

For example, a form combining all of or part of the embodiments described above can be used.

It should be noted that the effects described in the present description are merely examples and not limiting. Effects other than those described in the present description may be included.

Note that the present technology can also take the following configurations.

(1)
A solid-state imaging device including:
a plurality of pixel sets each including color filters of the same color, for a plurality of colors, each pixel set including a plurality of pixels, each pixel including a plurality of photoelectric conversion parts.

(2)
The solid-state imaging device according to (1) described above, in which
each pixel includes two photoelectric conversion parts disposed symmetrically in a vertical direction or a horizontal direction, and
orientations of the photoelectric conversion parts of the pixels are the same direction at least in each individual pixel set.

(3)
The solid-state imaging device according to (2) described above, in which
the orientations of the photoelectric conversion parts of the pixels are the same direction in all the pixel sets.

(4)
The solid-state imaging device according to (1) described above, in which
each pixel includes two photoelectric conversion parts disposed symmetrically in a vertical direction or a horizontal direction, and
orientations of the photoelectric conversion parts of two of the pixels arranged in the horizontal direction in each pixel set are the same direction.

(5)
The solid-state imaging device according to (1) described above, in which
each pixel includes two photoelectric conversion parts disposed symmetrically in a vertical direction or a horizontal direction, and
orientations of the photoelectric conversion parts of two of the pixels arranged in the horizontal direction in each pixel set are orthogonal directions.

(6)
The solid-state imaging device according to any one of (1) to (5) described above, in which
the plurality of photoelectric conversion parts of each pixel is isolated from each other by an insulating layer.

(7)
The solid-state imaging device according to any one of (1) to (5) described above, in which
the plurality of photoelectric conversion parts of each pixel is isolated from each other by an impurity layer of a conductivity type opposite to a conductivity type of the photoelectric conversion parts.

(8)
The solid-state imaging device according to (7) described above, in which
the impurity layer forms a potential barrier lower than a potential barrier at pixel boundaries.

(9)
The solid-state imaging device according to any one of (1) to (8) described above, in which
a light-shielding film is formed at some of the plurality of pixel sets, the light-shielding film partly shielding all the pixels in each pixel set from light.

(10)
The solid-state imaging device according to any one of (1) to (8) described above, in which
a light-shielding film is formed at some of the plurality of pixel sets, the light-shielding film entirely shielding some of the pixels in each pixel set from light.

(11)
The solid-state imaging device according to any one of (1) to (10) described above, further including:
a charge holding part that holds charges generated in the photoelectric conversion parts,
the charge holding part adding and outputting charges generated in the photoelectric conversion parts of the plurality of pixels.

(12)
The solid-state imaging device according to (11) described above, in which
the charge holding part adds and outputs charges generated in the photoelectric conversion parts of all the pixels in each pixel set.

(13)
The solid-state imaging device according to (11) described above, in which
the charge holding part adds and outputs charges in the photoelectric conversion parts whose positions in the pixels are the same position, of the photoelectric conversion parts of the plurality of pixels included in each pixel set.

(14)
The solid-state imaging device according to any one of (1) to (13) described above, in which
of the photoelectric conversion parts of the plurality of pixels included in each pixel set, a first photoelectric conversion part and a second photoelectric conversion part are exposed for different exposure times.

(15)
The solid-state imaging device according to (14) described above, further including:
a control unit that performs control to output charges of light received by each photoelectric conversion part as a pixel signal,
the control unit outputting a first pixel signal of the first photoelectric conversion part exposed for a first exposure time, and outputting a second pixel signal of the second photoelectric conversion part exposed for a second exposure time.

(16)

The solid-state imaging device according to any one of (1) to (15) described above, in which
pixel signals generated in the plurality of photoelectric conversion parts of at least some of the plurality of pixels included in each pixel set are output separately.

(17)

The solid-state imaging device according to any one of (1) to (16) described above, in which
of the plurality of pixels included in each pixel set, the photoelectric conversion parts of a first pixel are exposed for a first exposure time, the photoelectric conversion parts of a second pixel are exposed for a second exposure time shorter than the first exposure time, and pixel signals generated in the plurality of photoelectric conversion parts of the second pixel exposed for the second exposure time are output separately.

(18)

The solid-state imaging device according to any one of (1) to (16) described above, in which
of the plurality of pixels included in each pixel set, the photoelectric conversion parts of a first pixel are exposed for a first exposure time, the photoelectric conversion parts of a second pixel are exposed for a second exposure time shorter than the first exposure time, the photoelectric conversion parts of a third pixel are exposed for a third exposure time shorter than the second exposure time, and pixel signals generated in the plurality of photoelectric conversion parts of the second pixel exposed for the second exposure time are output separately.

(19)

The solid-state imaging device according to any one of (1) to (18) described above, in which
the color filters in the pixel sets are arranged in a Bayer array.

(20)

An electronic apparatus including:
a solid-state imaging device including
a plurality of pixel sets each including color filters of the same color, for a plurality of colors, each pixel set including a plurality of pixels, each pixel including a plurality of photoelectric conversion parts.

REFERENCE SIGNS LIST

1 Solid-state imaging device
2 Pixel
PD Photodiode
TG Transfer transistor
3 Pixel array
5 Column signal processing circuit
12 Semiconductor substrate
31, 32 Semiconductor region
36 Inter-pixel light-shielding film
37 Color filter
38 On-chip lens
51 (51Gr, 51Gb, 51R, 51B) Pixel set
91 On-chip lens
101 Insulating layer
102 Impurity layer
121 Light-shielding film
200 Imaging apparatus
202 Solid-state imaging device

The invention claimed is:

1. A light detecting device comprising:
a first pixel set including:
first through sixteenth pixels arranged in a first four-by-four matrix in a plan view, each of the first through sixteenth pixels including two photoelectric conversion parts, and
a first charge holding part coupled to the two photoelectric conversion parts of at least four pixels of the first through sixteenth pixels in the first pixel set;
a second pixel set including:
seventeenth through thirty-second pixels arranged in a second four-by-four matrix in the plan view, each of the seventeenth through thirty-second pixels including two photoelectric conversion parts, and
a second charge holding part coupled to the two photoelectric conversion parts of at least four pixels of the seventeenth through thirty-second pixels in the second pixel set;
a third pixel set including:
thirty-third through forty-eighth pixels arranged in a third four-by-four matrix in the plan view, each of the thirty-third through forty-eighth pixels including two photoelectric conversion parts, and
a third charge holding part coupled to the two photoelectric conversion parts of at least four pixels of the thirty-third through forty-eighth pixels in the third pixel set; and
a fourth pixel set including:
forty-ninth through sixty-fourth pixels arranged in a fourth four-by-four matrix in the plan view, each of the forty-ninth through sixty-fourth pixels including two photoelectric conversion parts, and
a fourth charge holding part coupled to the two photoelectric conversion parts of at least four pixels of the forty-ninth through sixty-fourth pixels in the fourth pixel set;
wherein
the first, second, third, and fourth pixel sets are arranged in a two-by-two array in the plan view,
the first and fourth pixel sets are configured to produce pixel signals corresponding to light in a first range of wavelengths,
the second pixel set is configured to produce pixel signals corresponding to light in a second range of wavelengths different than the first range of wavelengths, and
the third pixel set is configured to produce pixel signals corresponding to light in a third range of wavelengths different than the first and second range of wavelengths.

2. The light detecting device according to claim 1, wherein the first range of wavelengths corresponds to green light.

3. The light detecting device according to claim 1, wherein the second range of wavelengths corresponds to red light.

4. The light detecting device according to claim 1, wherein the third range of wavelengths corresponds to blue light.

5. The light detecting device according to claim 2, wherein the second range of wavelengths corresponds to red light.

6. The light detecting device according to claim 5, wherein the third range of wavelengths corresponds to blue light.

7. The light detecting device according to claim 1, further comprising sixty-four on chip lenses respectively corresponding to the first through sixty-fourth pixels.

8. The light detecting device according to claim 1, further comprising sixteen on chip lenses respectively corresponding to groups of four of the first through sixty-fourth pixels.

9. The light detecting device according to claim 1, further comprising four on chip lenses respectively corresponding to groups of sixteen of the first through sixty-fourth pixels.

10. An imaging device comprising:
a pixel array including a first pixel set, a second pixel set, a third pixel set, and a fourth pixel set, and
at least one control circuit configured to drive the pixel array;
the first pixel set including:
first through sixteenth pixels arranged in a first four-by-four matrix in a plan view, each of the first through sixteenth pixels including two photoelectric conversion parts, and
a first charge holding part coupled to the two photoelectric conversion parts of at least four pixels of the first through sixteenth pixels in the first pixel set;
the second pixel set including:
seventeenth through thirty-second pixels arranged in a second four-by-four matrix in the plan view, each of the seventeenth through thirty-second pixels including two photoelectric conversion parts, and
a second charge holding part coupled to the two photoelectric conversion parts of at least four pixels of the seventeenth through thirty-second pixels in the second pixel set;
the third pixel set including:
thirty-third through forty-eighth pixels arranged in a third four-by-four matrix in the plan view, each of the thirty-third through forty-eighth pixels including two photoelectric conversion parts, and
a third charge holding part coupled to the two photoelectric conversion parts of at least four pixels of the thirty-third through forty-eighth pixels in the third pixel set; and
the fourth pixel set including:
forty-ninth through sixty-fourth pixels arranged in a fourth four-by-four matrix in the plan view, each of the forty-ninth through sixty-fourth pixels including two photoelectric conversion parts, and
a fourth charge holding part coupled to the two photoelectric conversion parts of at least four pixels of the forty-ninth through sixty-fourth pixels in the fourth pixel set;
wherein
the first, second, third, and fourth pixel sets are arranged in a two-by-two array in the plan view,
the first and fourth pixel sets are configured to produce pixel signals corresponding to light in a first range of wavelengths,
the second pixel set is configured to produce pixel signals corresponding to light in a second range of wavelengths different than the first range of wavelengths, and
the third pixel set is configured to produce pixel signals corresponding to light in a third range of wavelengths different than the first and second range of wavelengths.

11. The imaging device according to claim 10, wherein the first range of wavelengths corresponds to green light.

12. The imaging device according to claim 10, wherein the second range of wavelengths corresponds to red light.

13. The imaging device according to claim 10, wherein the third range of wavelengths corresponds to blue light.

14. The imaging device according to claim 11, wherein the second range of wavelengths corresponds to red light.

15. The imaging device according to claim 14, wherein the third range of wavelengths corresponds to blue light.

16. The imaging device according to claim 10, further comprising sixty-four on chip lenses respectively corresponding to the first through sixty-fourth pixels.

17. The imaging device according to claim 10, further comprising sixteen on chip lenses respectively corresponding to groups of four of the first through sixty-fourth pixels.

18. The imaging device according to claim 10, further comprising four on chip lenses respectively corresponding to groups of sixteen of the first through sixty-fourth pixels.

* * * * *